United States Patent
Dacus et al.

[11] Patent Number: 6,081,161
[45] Date of Patent: Jun. 27, 2000

[54] AMPLIFIER WITH DYNAMICALLY ADAPTABLE SUPPLY VOLTAGE

[75] Inventors: Farron L. Dacus, Irving; Russell A. Morris, Keller, both of Tex.

[73] Assignee: Omnipoint Corporation, Bethesda, Md.

[21] Appl. No.: 09/080,811

[22] Filed: May 18, 1998

[51] Int. Cl.[7] .................................................. H03G 3/30
[52] U.S. Cl. .......................................... 330/297; 330/285
[58] Field of Search .................................. 330/127, 129, 330/279, 285, 296, 297

[56] References Cited

U.S. PATENT DOCUMENTS

| | | | |
|---|---|---|---|
| 4,320,350 | 3/1982 | Drapac | 330/285 X |
| 4,484,028 | 11/1984 | Kelley et al. | 179/2 |
| 4,489,283 | 12/1984 | Ishizaki | 330/268 |
| 4,885,798 | 12/1989 | Jinich et al. | 455/52 |
| 5,093,637 | 3/1992 | Isota et al. | 332/103 |
| 5,093,840 | 3/1992 | Schilling | 375/1 |
| 5,107,225 | 4/1992 | Wheatley, III et al. | 330/279 |
| 5,138,274 | 8/1992 | Nakanishi et al. | 330/285 X |
| 5,144,258 | 9/1992 | Nakanishi et al. | 330/129 |
| 5,175,871 | 12/1992 | Kunkel | 455/69 |
| 5,285,172 | 2/1994 | Okanobu et al. | 330/288 |
| 5,329,244 | 7/1994 | Fujita et al. | 330/149 |
| 5,359,295 | 10/1994 | Nishiura | 330/263 |
| 5,374,896 | 12/1994 | Sato et al. | 330/149 |
| 5,384,547 | 1/1995 | Lynk, Jr. et al. | 330/136 |
| 5,392,463 | 2/1995 | Yamada | 455/93 |
| 5,406,225 | 4/1995 | Iida et al. | 330/279 |
| 5,420,536 | 5/1995 | Faulkner et al. | 330/149 |
| 5,423,078 | 6/1995 | Epperson et al. | 455/89 |
| 5,477,188 | 12/1995 | Chawla et al. | 330/269 |
| 5,493,255 | 2/1996 | Murtojarvi | 330/296 |
| 5,548,616 | 8/1996 | Mucke et al. | 375/295 |
| 5,548,826 | 8/1996 | Sayers | 455/126 |
| 5,568,086 | 10/1996 | Schuss et al. | 330/124 |
| 5,574,993 | 11/1996 | Kobayashi et al. | 455/126 |
| 5,777,519 | 7/1998 | Simopoulos | 330/297 |
| 5,789,984 | 8/1998 | Davis et al. | 330/285 X |

*Primary Examiner*—Steven J. Mottola
*Attorney, Agent, or Firm*—Lyon & Lyon LLP

[57] ABSTRACT

An adaptable DC power consumption circuit is provided, wherein the voltage supplied to an RF amplifier is dynamically varied from a desired level. A feedback control loop is formed between the power terminal and a control terminal of a variable voltage supply. A controller influences the feedback control loop to properly set the supply voltage at the desired minimum level necessary to maintain linear operation of the RF amplifier. The output of the RF amplifier influences the feedback control loop to dynamically vary the supply voltage from the desired level. In this manner, linear operation of the RF amplifier can be maintained while maximizing the power efficiency of the RF amplifier.

32 Claims, 23 Drawing Sheets

AMPLIFIER WITH DYNAMICALLY ADAPTABLE SUPPLY VOLTAGE

FIELD OF THE INVENTION

The present invention pertains to power amplifiers, including more specifically, a power amplifier circuit for wireless communication systems.

BACKGROUND OF THE INVENTION

In wireless communication systems, mobile handsets communicate with other mobile handsets through base stations connected to the PSTN (public switched telephone network). Typically, in FDMA systems the base stations determine the frequencies at which the handsets are to communicate and send signals to the handsets to adjust the transmission power of the handsets.

The signals that are transmitted by the handsets are typically amplified prior to transmission to the base station. The amplification of the signal within the handset is generally performed by a radio frequency (RF) power amplifier 10, a representative embodiment of which is depicted in FIG. 1 (PRIOR ART). The RF power amplifier 10 includes a DC power terminal 12 and ground terminal 14. A DC power source 16 is typically connected between the power terminal 12 and the ground terminal 14, producing a supply voltage, $V_S$, at the power terminal 12 and a supply current, $I_S$, into the power terminal 12. Thus, the RF power amplifier is supplied with a DC power, $P_{DC}$, equal to $V_S*I_S$. An RF input signal, $RF_{in}$, generated by the transmitting handset, is fed into the RF power amplifier 10 via an RF input terminal 18. The RF power amplifier 10 amplifies the RF input signal, $RF_{in}$, to produce an RF output signal, $RF_{out}$, at an RF output terminal 20. The RF output signal, $RF_{out}$, after passing through signal processing circuits, is typically sent to the antenna for transmission. An RF input signal, $RF_{in}$, has an average input signal power, $P_{in}$, and an RF output signal, $RF_{out}$, has an average output signal power, $P_{out}$.

When transmitting a signal with a non-constant envelope from a handset it is desirable to operate the power amplifier 10 in a linear mode to minimize signal distortion and bandwidth required to transmit the signal. The linearity of the power amplifier, which is measured by the uniformity of the transfer characteristic ($P_{out}/P_{in}$), varies with $I_S$, $V_S$, and $RF_{out}$. Referring to FIG. 2 (PRIOR ART), the curves C1, C2, and C3 represent compression characteristics of an RF power amplifier 10 of FIG. 1, given three exemplary amplifier DC power, $P_{DC}$, levels. The line L represents linear operation of the amplifier 10. As curves C1, C2, and C3 illustrate, the linearity of the power amplifier depends on $P_{DC}$. That is, as $P_{DC}$ increases, the range of $P_{in}$ values for which the amplifier remains linear increases. In general, the output power, $P_{out}$, for which a power amplifier compresses increases with the DC power supplied to the power amplifier.

Although supplying a relatively high DC power to the RF power amplifier 10 will generally maintain linear operation of the RF power amplifier 10, such an arrangement becomes less advantageous in a system with varying transmission power requirements. A wireless communications system restricts the transmission power of the handset to minimize the signal from propagating to an excessively far point, so that the same frequency may be used at a far point, i.e., in other cells in order to permit servicing of as many subscribers as possible within the finite frequency resources allocated to the system. At the same time, the transmission power must be high enough to maintain the integrity of the transmitted signal over the distance that it travels to a base station. The magnitude of the handset transmission power required to maintain proper communication with a base station is dictated in part by the distance and the electrical communication environment between the handset and the base station. That is, if the handset is located far from a base station, the level of the RF output signal power, $P_{out}$, will be relatively high. If the handset is located close to the base station, the level of the RF output signal power, $P_{out}$, will be relatively low.

In a situation requiring a relatively low handset transmission power, an RF power amplifier that is supplied with a high DC power is inefficient. Referring to FIG. 1, the power the power amplifier 10 dissipates as heat is equal to the difference between the power supplied to the RF amplifier 10, $P_{DC}$ and $P_{in}$, and the RF output signal power, $P_{out}$, as characterized by the equation, $P_{HEAT}=P_{DC}+P_{in}-P_{out}$. Thus, given a constant DC supply power, $P_{DC}$, the lower the RF output signal power, $P_{out}$, is, the more power the amplifier wastes as heat. The wasted power in the power amplifier 10 can be quantified in the power efficiency equation, $P_{eff}=P_{out}/(P_{DC}+P_{in})$. Thus, the more DC power that is supplied to an RF power amplifier, the less efficient that RF power amplifier becomes for a constant $P_{in}$ and $P_{out}$.

Therefore, it can be understood that an RF power amplifier that is supplied with a relatively high constant DC power generally operates linearly over a full range of RF output signal power levels, but is power inefficient, thus leading to significantly increased battery and heat sinking requirements, heavier battery weight, and shorter battery life. On the other hand, a power amplifier that is supplied with a relatively low constant DC power is power efficient, but generally operates only linearly over a low range of RF output signal power levels, thus resulting in a distorted transmission signal with a larger bandwidth.

There thus remains a need to operate a power amplifier more efficiently and linearly over a full range of given RF signal output power levels.

SUMMARY OF THE INVENTION

The present inventions solve this problem. The adaptable DC power consumption amplifier circuit of the present inventions include a control circuit such that an RF amplifier operates more efficiently and linearly over a full range of given RF signal output power levels.

In a preferred embodiment of the present inventions, there is provided an adaptable supply voltage circuit that maintains the supply voltage across an RF amplifier at a desired level. A supply voltage tracking signal indicative of the present level of the supply voltage, and a control tracking signal indicative of the desired level of the supply voltage are generated. A biasing signal is generated based on the difference between the supply voltage tracking signal and the control tracking signal, and is applied to a variable power supply, which generates the supply voltage across the RF amplifier.

In another preferred embodiment of the present inventions, there is provided a dynamically adaptable supply voltage circuit that dynamically varies the supply voltage across an RF amplifier from a desired level. A supply voltage tracking signal indicative of the present level of the supply voltage, and a control and envelope tracking signal indicative of the desired level of the supply voltage and the present level of an RF modulated output signal are generated. A dynamic biasing signal is generated based upon the difference between the control and envelope tracking signal and the supply voltage tracking signal. The dynamic biasing signal is applied to a variable power supply, which creates the supply voltage across the RF amplifier.

To further enhance the linearity and efficiency of an RF amplifier, various features of the above-mentioned embodiments can be combined with features of other circuits disclosed in this specification, such as, e.g., an adaptable supply current circuit, a dynamically adaptable supply current circuit, or a bypassable circuit.

DETAILED DESCRIPTION OF THE PREFERRED EMBODIMENTS

Figure 4:
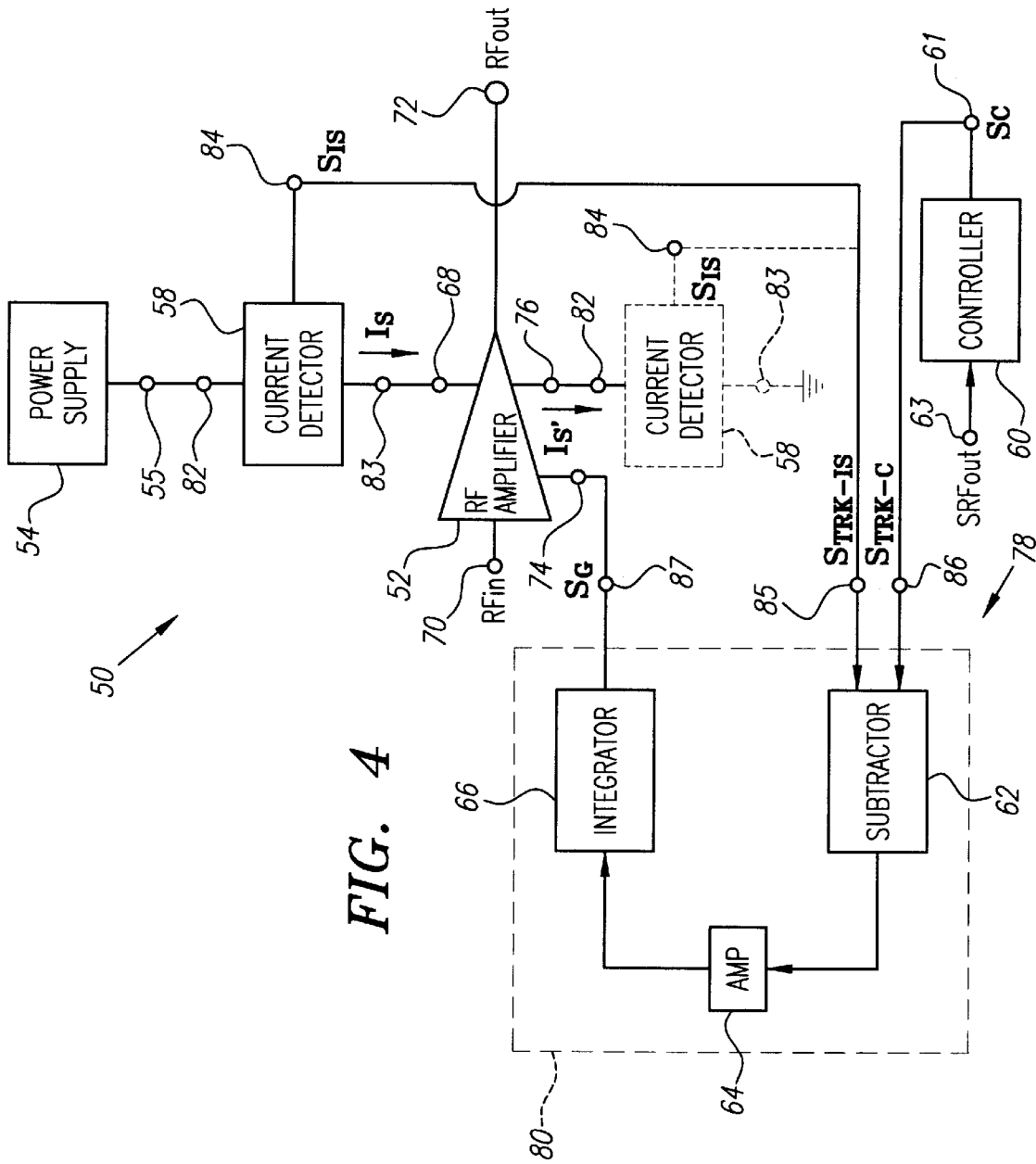
FIG. 4 is a block diagram of an adaptable supply current circuit in use with a single-stage RF amplifier.

FIG. 4 depicts an adaptable supply current circuit 50, which can be employed to operate an RF amplifier 52 contained in the adaptable supply current circuit 50 more efficiently and linearly by controlling a supply current, $I_S$, within the RF amplifier 52. The RF amplifier 52 is a single-stage amplifier, which can be used as one stage of a multi-stage amplifier. The adaptable supply current circuit 50 includes a power supply 54 having an output terminal 55. An RF input signal, $RF_{in}$, is fed into an RF input terminal 70 of the RF amplifier 52. An amplified RF output signal, $RF_{out}$, is output on an RF output terminal 72 of the RF amplifier 52.

The supply current, $I_S$, is controlled through a feedback control loop 78 comprising a current detector 58, a controller 60, and a signal processor 80. The power supply 54 supplies current, $I_S$, to the RF amplifier 52 through the current detector 58. The current detector 58 includes an input terminal 82 connected to the output terminal 55 of the power supply 54, and an output terminal 83 connected to the power terminal 68 of the RF amplifier 52. The current detector 58 further includes a coupling terminal 84 connected to a first input terminal 85 of the signal processor 80. The current detector 58 samples a current on the input terminal 82 of the current detector 58 and supplies the supply current, $I_S$, on the output terminal 83 of the current detector 58. The current detector 58 produces a sampled supply current signal, $S_{IS}$, on the coupling terminal 84 of the current detector 58, influencing a supply current tracking signal, $S_{TRK-IS}$, on the first input terminal 85 of the signal processor. The supply current tracking signal, $S_{TRK-IS}$, indicates the present level of the supply current, $I_S$. As shown in phantom, the current detector 58 can alternatively sample a supply current, $I_S'$, equal to the sum of the supply current, $I_S$, and the RF amplifier gate current (not shown), on a ground terminal 76 of the RF amplifier 52. An example of a device that can be used as the current detector 58 is a current mirror.

Figure 5:
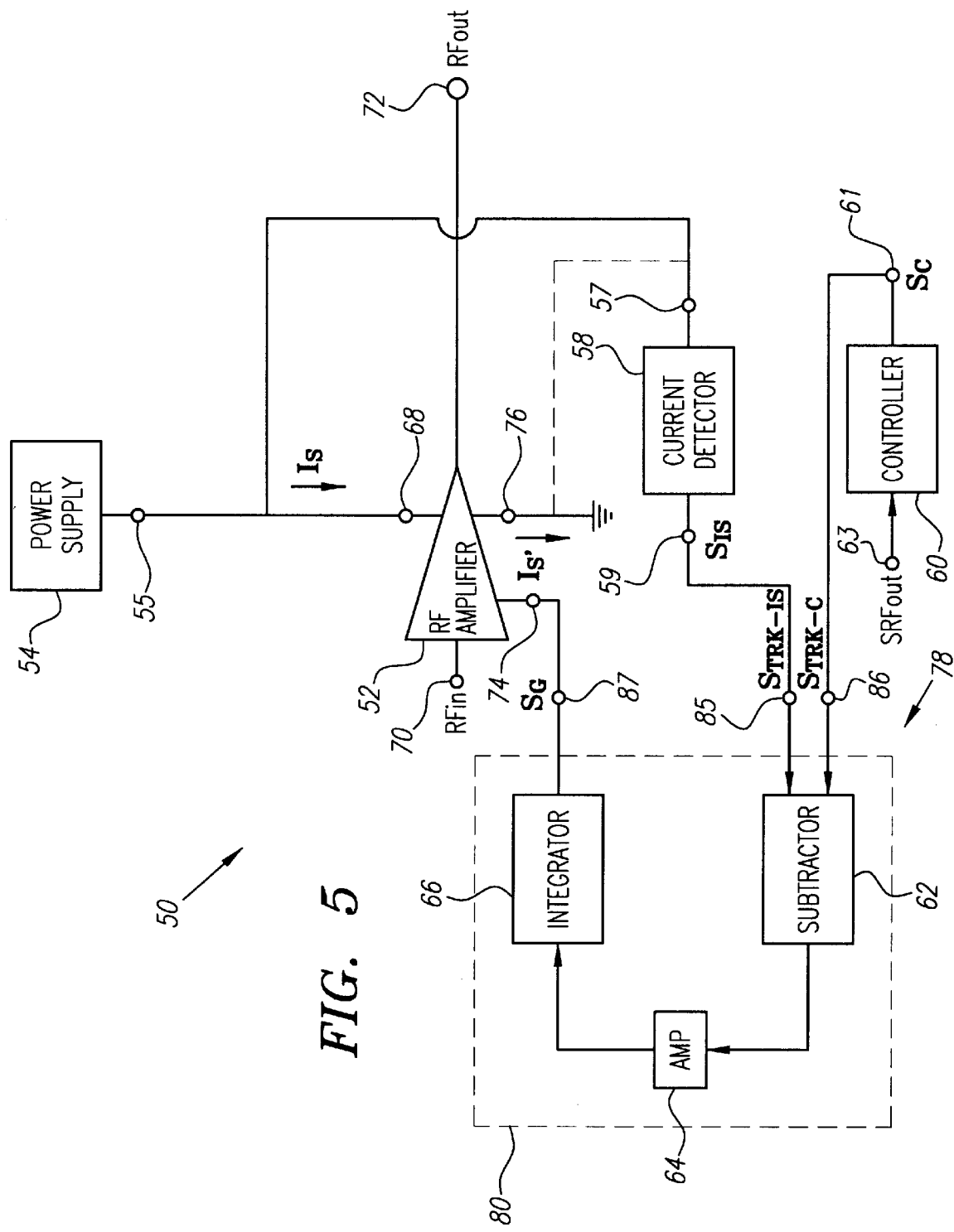
FIG. 5 is a block diagram of an alternative adaptable supply current circuit in use with a single-stage RF amplifier.

Alternatively, as shown in FIG. 5, the feedback control loop 78 includes a current detector 53 with an input terminal 57 connected to the power terminal 68 of the RF amplifier 52, and an output terminal 59 connected to the first input terminal 85 of the signal processor 80. The current detector 53 samples the supply current, $I_S$, on the power terminal 68 of the RF amplifier 52 and produces the sampled supply current signal, $S_{IS}$, on the output terminal 59 of the current detector 53, influencing the supply current tracking signal, $S_{TRK-IS}$, on the first input terminal 85 of the signal processor. As shown in phantom, the current detector 53 can alternatively sample the supply current, $I_S'$, on the ground terminal 76 of the RF amplifier 52. An example of a device that can be used as the current detector 53 is a resistor.

The controller 60 includes an input terminal 63 into which an RF power designating signal, $S_{RFOUT}$, designating a desired average RF output signal power, $P_{out}$, and thus, the desired supply current, $I_S$, is input. The controller 60 further includes an output terminal 61 that is connected to a second input terminal 86 of the signal processor 80. The controller 60 produces a control signal, $S_C$, on the output terminal 61 of the controller 60 in accordance with the RF power designating signal, $S_{RFOUT}$, influencing a control tracking signal, $S_{TRK-C}$, on the second input terminal 86 of the signal processor 80. The control tracking signal, $S_{TRK-C}$, indicates the desired average level of the supply current, $I_S$.

The signal processor 80 includes a subtractor 62, an amplifier 64, and an integrator 66. The subtractor 62 determines the difference between the control tracking signal, $S_{TRK-C}$, and the supply current tracking signal, $S_{TRK-IS}$. The amplifier 64 is preferably employed to scale the difference between the control tracking signal, $S_{TRK-C}$, and the supply current tracking signal, $S_{TRK-IS}$. The gain of the amplifier 64 can be greater or less than unity. The integrator 66 is preferably employed to integrate the difference between the control tracking signal, $S_{TRK-C}$, and the supply current tracking signal, $S_{TRK-IS}$. The signal processor 80 produces a gate biasing signal, $S_G$, on an output terminal 87 of the signal processor 80. The output terminal 87 of the signal processor 80 is connected to a control terminal 74 of the RF amplifier 52. The gate biasing signal, $S_G$, is fed into the control terminal 74 of the RF amplifier 52. The control terminal 74 of the RF amplifier 52 is coupled with the gate of the RF amplifier 52. The scaling and integration steps are not limited to the particular order described above, and can be performed in any order or simultaneously to obtain the gate biasing signal, $S_G$.

Figure 6:
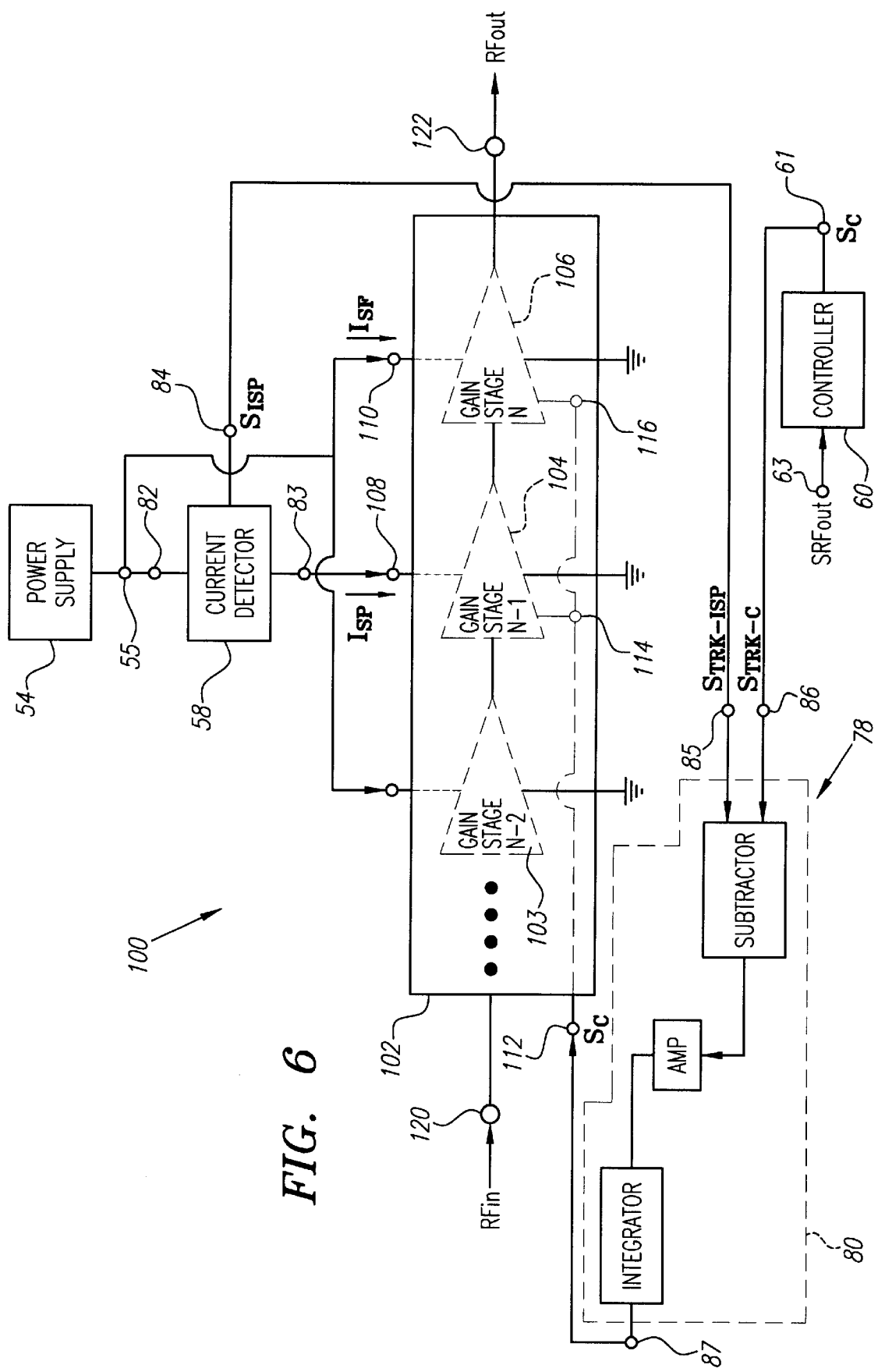
FIG. 6 is a block diagram of an adaptable supply current circuit in use with an N-stage RF amplifier.

FIG. 6 shows an adaptable supply current circuit 100 with an N-stage RF amplifier 102 having an N number of gain stages (shown in phantom) connected in series. The adaptable supply current circuit 100 is similar to the adaptable supply current circuit 50 shown in FIG. 3, and to the extent the components of each are the same, the same reference numerals have been used.

The Nth−1 gain stage and the Nth gain stage are respectively referred to hereinafter as a preceding gain stage 104 and a final gain stage 106. The RF input signal, $RF_{in}$, is fed into an RF input terminal 120 of the RF amplifier 102. An amplified RF output signal, $RF_{out}$, is output on an RF output terminal 122 of the RF amplifier 102.

The power supply 54 supplies a current, $I_{SP}$, to the preceding gain stage 104 through the current detector 58. The input terminal 82 of the current detector 58 is connected to the output terminal 55 of the power supply 54, and the output terminal 83 of the current detector 58 is connected to the power terminal 108 of the preceding gain stage 104. The current detector 58 samples a current on the input terminal 82 of the current detector 58 and supplies the supply current, $I_{SP}$, on the output terminal 83 of the current detector 58. The current detector 58 produces a sampled supply current signal, $S_{ISP}$, on the coupling terminal 84 of the current detector 58, influencing a supply current tracking signal, $S_{TRK-ISP}$, on the first input terminal 85 of the signal processor. The supply current tracking signal, $S_{TRK-ISP}$, indicates the present level of the supply current, $I_{SP}$. The output terminal 55 of the power supply 54 is connected to the remaining power terminals of the various gain stages within the RF amplifier 102 including the power terminal 108 of the final gain stage 106 providing supply currents to the gain stages including a supply current, $I_{SF}$, to the final gain stage 106.

The signal processor 80 determines, scales, and integrates the difference between the control tracking signal, $S_{TRK-C}$, and the supply current tracking signal, $S_{TRK-ISP}$, to obtain the gate biasing signal, $S_G$, on the output terminal 87 of the signal processor 80. The gate biasing signal, $S_G$, is fed into a control terminal 112 of the RF amplifier 102. The control terminal 112 of the RF amplifier 102 is coupled with the gate of the preceding gain stage 104 and gate of the final gain stage 106. In another embodiment, control terminal 112 of the RF amplifier is solely coupled with the gate of the preceding gain stage 104. Preferably, the RF amplifier 102 is characterized with a relatively constant gain over a usefully wide range of supply currents. In addition, it is desirable that mirroring between the preceding gain stage 104 and the final gain stage 106 remains constant.

In the adaptable supply current circuit 100, the power expended in the control loop 78 is minimized. The sampling occurs in the preceding gain stage 104, which typically operates on a power level and current much less than that of the final gain stage 106. In another embodiment, the supply current, $I_{SF}$, in the final gain stage 106 rather than the supply current, $I_{SP}$, in the preceding gain stage 104 is detected.

Figure 7:
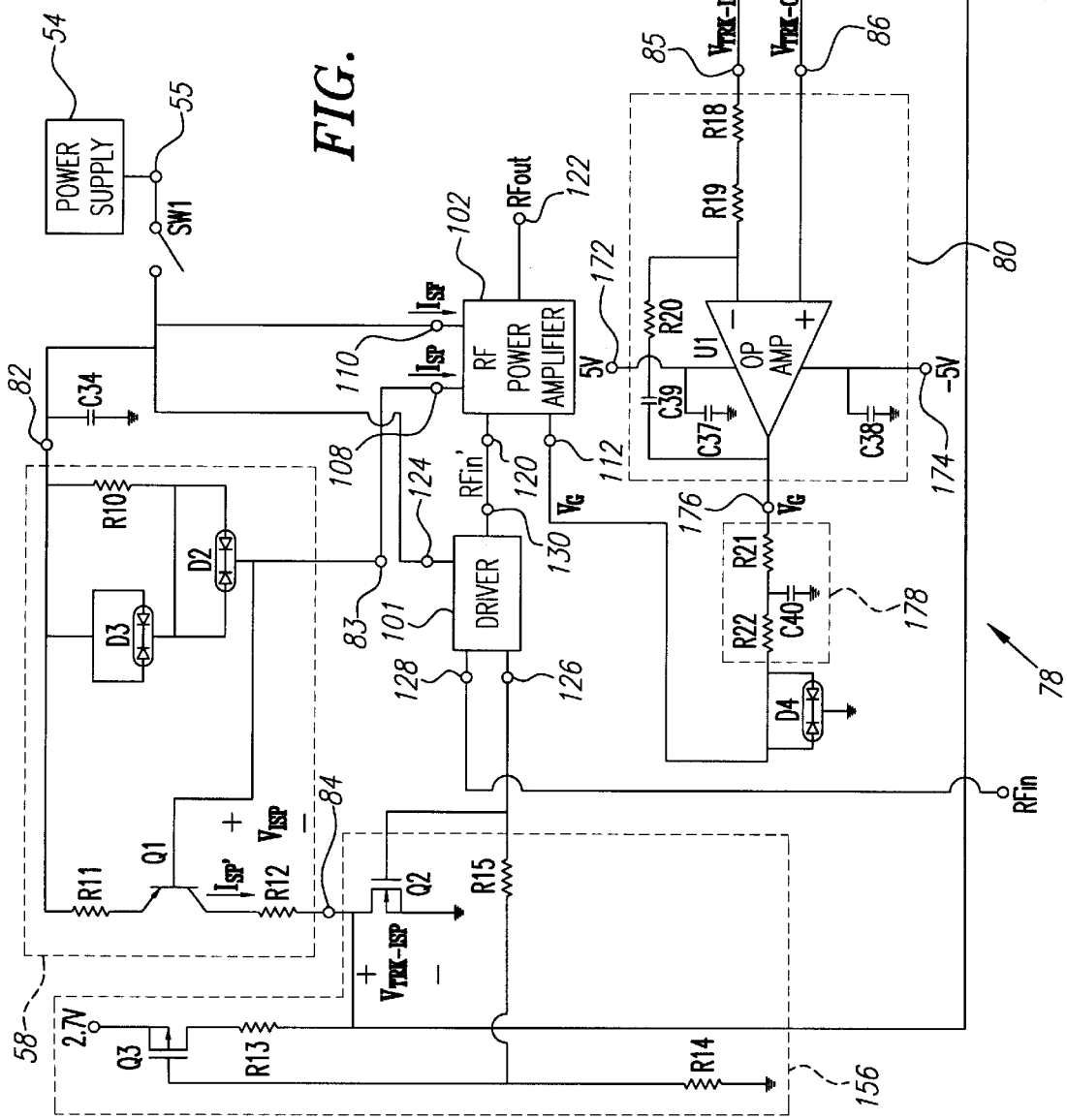
FIG. 7 is a circuit diagram of the adaptable supply current circuit of FIG. 6.
Figure 8:
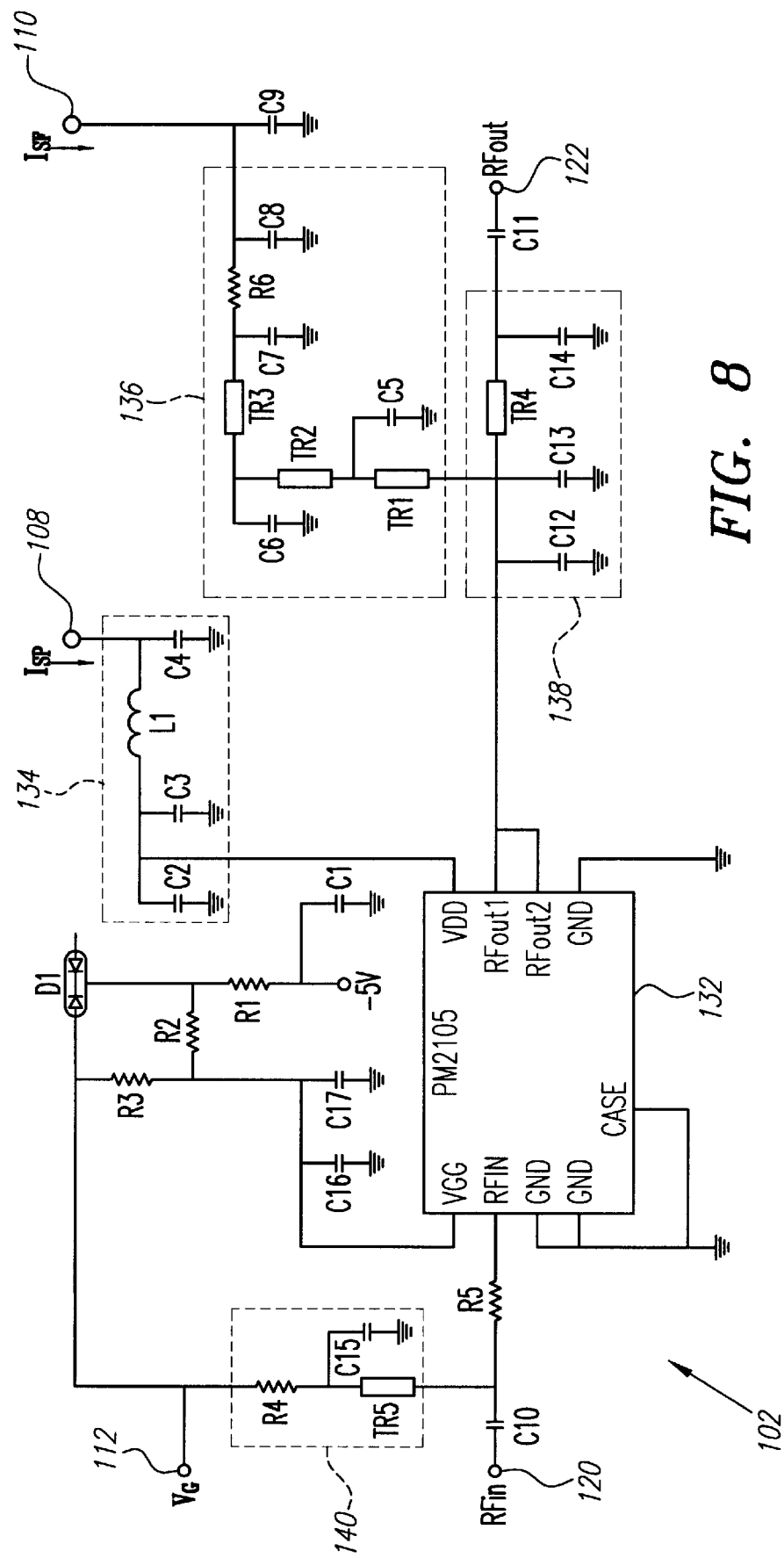
FIG. 8 is a circuit diagram of a two-stage RF power amplifier for use in the adaptable supply current circuit of FIG. 7.
Figure 9:
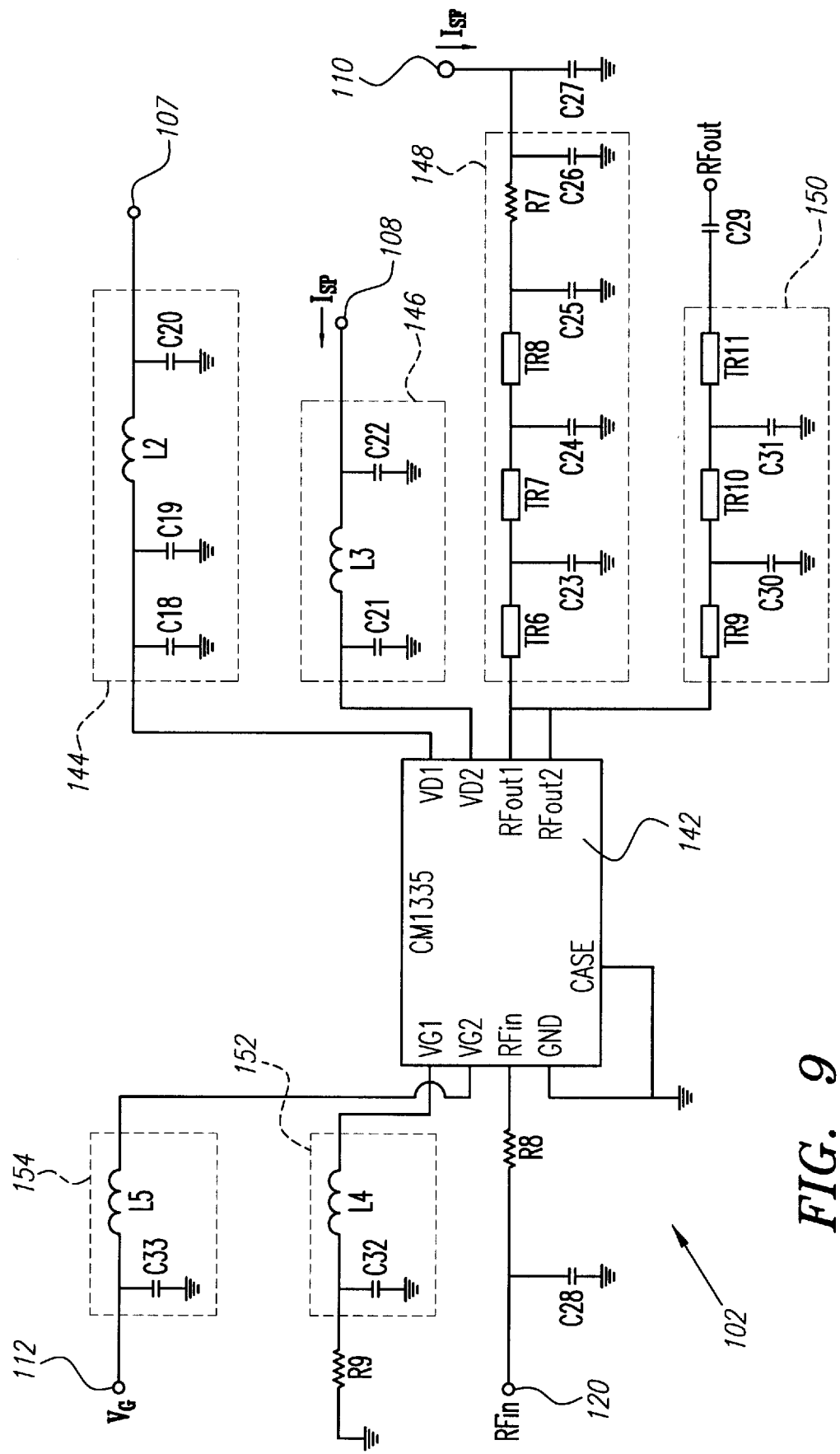
FIG. 9 is a circuit diagram of a three-stage RF power amplifier for use in the adaptable supply current circuit of FIG. 7.

Particular aspects of the adaptable supply current circuit 100 will now be described with reference to FIGS. 7, 8, and 9. The particular aspects of the adaptable supply current circuit 100 are arranged and designed to be used in a handset or Wireless Local Loop (WLL) terminal in a wireless communication system. The components shown in FIGS. 7, 8, and 9 are represented using standard electrical symbology. The typical values and models of the respective components disclosed herein are based on an amplifier operating frequency of 1880 MHZ. It should be noted that these value and model specifications only aid in the understanding of the invention and do not in any way limit the invention.

Referring to FIG. 7, the power supply 54 has an output voltage of 5 volts on the output terminal 55 and is employed within the adaptable supply current circuit 100 to bias various components with a DC voltage of either 5 volts or 2.7 volts. Those components that are biased with 5 volts are connected directly to the power supply 54, and those that are biased with 2.7 volts are connected to the power supply 54 through a voltage converter (not shown). A second power supply (not shown) having an output voltage of −5 volts is also connected within the adaptable supply current circuit 100 to bias various components with a DC voltage of −5 volts. The particular DC bias voltage values may vary from those disclosed herein and will depend on the particular application of this invention.

A driver 101 drives the RF amplifier 102. The driver 101 includes a power terminal 124 connected to the power supply 54 through a switch SW1 operated by the controller 60. The driver 101 is enabled through a control terminal 126 connected to the controller 60 (connection not shown). The driver 101 further includes an RF input terminal 128 that receives the RF input signal, $RF_{in}$, from processing circuitry (not shown) external to the adaptable supply current circuit 100. The driver 101 amplifies the RF input signal, $RF_{in}$, outputting an intermediate RF signal, $RF_{in}'$, on the RF output terminal 130 of the driver 101. The particular aspects of the driver 101 are in accordance with typical known drivers.

The output terminal 130 of the driver 101 is connected to input terminal 120 of the RF amplifier 102, and the intermediate RF signal, $RF_{in}'$, is applied to the RF input terminal 120 of the RF amplifier 102. The RF amplifier 102 amplifies the intermediate RF signal, $RF_{in}'$, outputting the RF output signal, $RF_{out}$, on the RF output terminal 122 of the RF amplifier 102. The power terminal 108 of the preceding gain stage 104 of the RF amplifier 102 is coupled to the power supply 54 through the current detector 58 and switch SW1. The power terminal 110 of the final gain stage 106 of the RF amplifier 102 is connected to the power supply 54 through the switch SW1. The RF amplifier 102 includes a control terminal 112 that is electrically coupled to the power terminal 108 of the preceding gain stage 104 through the feedback control loop 78.

A particular embodiment of the RF amplifier 102, which has two gain stages, i.e., the preceding gain stage 104 and the final gain stage 106, is shown in FIG. 8. The gain stages are preferably embodied in an integrated chip 132, which in this particular embodiment is a model PM2105 amplifier chip. The −5 volt DC bias is connected to the RFIN pin of the chip 132 through resistors R1, R2, R3, R4, and R5, and the VGG pin of the chip 132 through resistors R1 and R2, providing a scaling factor for the biasing of the respective gates 114 and 116 of the preceding gain stage 104 and final gain stage 106.

A decoupling capacitor C1 is connected between the −5 volt DC bias and ground to prevent high frequency signals from entering the second power supply (not shown). A diode D1 is connected across resistors R2 and R3 to scale the current going into the respective power terminals 108 and 110 of the preceding gain stage 104 and final gain stage 106. The values of resistors R1, R2, R3, R4, and R5 are selected so that the desired absolute and relative amount of DC bias voltage is applied to the respective gates 104 and 106 of the preceding gain stage 114 and final gain stage 116.

The power terminal 108 is connected to the VDD pin of the chip 132, producing the supply current, $I_{SP}$, in the preceding gain stage 104. A low pass filter 134 is connected between the power terminal 108 and the VDD pin of the chip 132. The low pass filter 134 preferably includes a parallel bank of grounded capacitors C2, C3, and C4 and an inductor L1 connected between the capacitors C3 and C4.

The power terminal 110 is connected to the RFOUT1 pin of the chip 132 through a low pass filter 136, producing the supply current, $I_{SF}$, in the final gain stage 106. The low pass filter 136 preferably includes a parallel bank of grounded capacitors C5, C6, C7, and C8 with transmission line sections TR1, TR2, TR3, and a resistor R6 connected respectively between the RFOUT1 pin and C5, C5 and C6, C6 and C7, and C7 and C8. A decoupling capacitor C9 is connected between the power supply 54 and ground.

The RF input terminal 120 of the RF amplifier 102 is connected to the RFIN terminal of the chip 132 through a coupling capacitor C10 and the resistor R5. The RF output terminal 122 of the RF amplifier 102 is connected to the RFOUT1 pin of the chip 132 through a matching circuit 138 and a DC blocking capacitor C11. The matching circuit 138 includes a parallel bank of grounded capacitors C12, C13, and C14 with a transmission line section TR4 connected between capacitors C13 and C14.

The control terminal 112 of the RF amplifier 102 is connected to the RFIN pin of the chip 132 through a low pass filter 140 and the resistor R5. The control terminal 112 of the RF amplifier 102 is also connected to the VGG pin of the chip 132 through the resistor R3. The respective gates 114 and 116 of the preceding gain stage 104 and final gain stage 106 are dynamically biased with voltages that are proportional to the gate biasing voltage, $V_G$, applied to the control terminal 112 via the control loop 78. The low pass filter 140 rejects the RF input signal, $RF_{in}$, and includes a transmission line section TR5, the resistor R4, and a capacitor C15. A pair of decoupling capacitors C16 and C17 are connected in parallel between the VGG pin of the chip 132 and ground. The values of the resistors R1, R2, R3, R4, and R5 are selected to provide the desired absolute and relative amount of variable voltage that the respective gates 114 and 116 of the preceding gains stage 104 and final gain stage 106 are biased with.

The diode D1 in this particular embodiment is a model BAV70 diode. Typical resistance values that may be used for the respective resistors R1–R5 are e.g., 300Ω, 47Ω, 47Ω, 47Ω, and 3.3Ω. A typical resistance value that can be used for resistor R6 is, e.g., 0.1Ω. The following typical capacitance values can be used, e.g.,: 0.1 µF for capacitors C1 and C9; 33 pF for capacitors C2–C7; 1.5 pF for capacitors C12–C14; 18 pF for capacitors C15–C17; 1000 pF for capacitor C8; and 27 pF for capacitor C10; and 6.8 pF for capacitor C11. A typical inductance value of, e.g., 39 nH can be used for the inductor L1. The following typical transmission line dimensions in mils, assuming 14 mil Getek material, can be used, e.g.,: 15W and 345L for TR1; 15W and 49L for TR2; 15W and 49L for TR3; 27W and 288L for TR4; and 27W and 202L for TR5.

An alternate embodiment of the RF amplifier 102, which has three gain stages, i.e., a first gain stage 103, the preceding gain stage 114, and the final gain stage 116, is shown in FIG. 9. All three of the gain stages are embodied in a chip 142, which in this particular embodiment is a model CM1335 amplifier chip.

The RF amplifier 102 has an additional power terminal 107 that is connected to the power supply 54 through the switch SW1. The power terminal 107 is in turn connected to the VD1 pin of the chip 142 through a low pass filter 144, producing a supply current in the first gain stage 103. The low pass filter 144 includes a parallel bank of grounded capacitors C18, C19, and C20 with an inductor L2 connected between the capacitors C19 and C20.

The power terminal 108 is connected to the VD2 pin of the chip 142 through a low pass filter 146, producing the biasing current, $I_{SP}$, in the preceding gain stage 104. The low pass filter 146 prevents high frequency signals from entering the first power supply 54 and comprises a parallel bank of grounded capacitors C21 and C22 with an inductor L3 connected between the capacitors C21 and C22.

The power terminal 110 is connected to the RFOUT1 pin of the chip 142 through a low pass filter 148, producing the biasing current, $I_{SF}$, in the final gain stage 106. The low pass filter 148 includes a parallel bank of grounded capacitors C23, C24, C25, and C26 with transmission line sections TR6, TR7, TR8, and a resistor R7 connected respectively between the RFOUT pin and C23, C23 and C24, C24 and C25, and C25 and C26. A decoupling capacitor C27 is connected between the power supply 54 and ground.

The RF input terminal 120 of the RF amplifier 102 is connected to the RFIN pin of the chip 142 through a resistor R8. A capacitor C28 is grounded between the resistor R8 and the RF input terminal 120. The RF output terminal 122 of the RF amplifier 102 is connected to the RFOUT1 pin of the chip 142 through a matching circuit 150 and a DC blocking capacitor C29. The matching circuit 150 comprises a parallel bank of grounded capacitors C30 and C31 with transmission line sections TR9, TR10, TR11 connected respectively between the RFOUT pin and C30, C30 and C31, and C31 and the blocking capacitor C29.

The control terminal 112 of the RF amplifier 102 is connected to the VG1 and VG2 pins of the chip 142 through respective low pass filters 152 and 154. The respective gates 114 and 116 of the preceding gain stage 104 and final gain stage 106 are dynamically biased with voltages that are proportional to the gate biasing voltage, $V_G$, applied to the control terminal 112 via the control loop 78. The low pass filter 152 prevents high frequency signals from entering the control loop 78 and comprises an inductor L4 and a grounded capacitor C32. The low pass filter 154 prevents high frequency signals from entering the control loop 78 and comprises an inductor L5 and a grounded capacitor C33. A resistor R9 is connected between the control terminal 112 and ground. The value of the resistor R9 is selected to provide the desired amount of dynamic voltage that the respective gates 114 and 116 of the preceding and final gain stages 104 and 106 are biased with.

Typical resistance values that may be used for the respective resistors R7–R9 are, e.g., 0.1Ω, 2.2Ω, and 10 kΩ. The following typical capacitance values can be used, e.g.,: 33 pF for capacitors C18, C20, and C22; 4700 pF for capacitor C19; 100 pF for capacitor C21; 27 pF for capacitors C23–C25 and C29; 1000 pF for capacitor C26; 0.1 $\mu$F for capacitor C27; 2.2 pF for capacitor C28; 3.9 pF for capacitor C30; 0.5 pF for capacitor C31; and 18 pF for capacitors C32 and C33. A typical inductance value of, e.g., 47 nH can be used for inductors L2 and L3, and an inductance value of, e.g., 39 nH can be used for inductors L4 and L5. The following typical transmission line dimensions in mils, assuming 14 mil Getek material, can be used, e.g.,: 15W and 720L for TR6; 15W and 99L for TR7; 15W and 99L for TR8; 36W and 47L for TR9; 17W and 157L for TR10; and 17W and 147L for TR11.

As shown in FIG. 7, the current detector 58 is a current mirror, which employs a PNP bipolar transistor Q1 and a diode D2 to sample the supply current, $I_{SP}$, entering the preceding gain stage 104 of the RF amplifier 102. The cathode of the diode D2 is connected to the base of the transistor Q1. The anode of the diode D2 is connected to the input terminal 82 of the current detector 58 through a resistor R10. The cathode of the diode D2 is connected to the output terminal 83 of the current detector. The emitter of the transistor Q1 is connected to the input terminal 82 of the current detector 58 through a resistor R11. The collector of the transistor Q1 is connected to the coupling terminal 84 of the current detector 58 through a resistor R12.

The input terminal 82 of the current detector 58 is connected to the output terminal 55 of the power supply 54 through the switch SW1, and the output terminal 83 of the current detector 58 is connected to the power terminal 108 of the RF amplifier 102 to provide the supply current, $I_{SP}$, to the preceding gain stage 104 of the RF amplifier 102. A diode D3 is connected in parallel with the resistor R10 to limit the supply current, $I_{SP}$. The value of resistor R10 is selected to provide the desired maximum amount of supply current, $I_{SP}$.

A sampled supply current, $I_{SP}'$, substantially proportional to the supply current, $I_{SP}$, is produced in the resistor R12. A sampled supply current voltage, $V_{ISP}$, is produced across the resistor R12. The values of resistors R11 and R12 are selected so that the desired amount of the supply current, $I_{SP}$, is sampled. A decoupling capacitor C34 is connected between the input terminal 82 of the current detector 58 and ground.

The diodes D2 and D3 in FIG. 7 are model BAV70 diodes. The bipolar transistor Q1 in this particular embodiment is a model MMBT3640 transistor. Typical resistance values of the respective resistors R10–R12 are, e.g., 47Ω, 47Ω, and 120Ω. A typical capacitance value for the capacitor C34 is, e.g., 0.1 $\mu$F. The current detector 58 is not limited to the current mirror depicted in FIG. 7, and may include other types of current mirrors.

The current detector 58 is connected to a startup circuit 156. The coupling terminal 84 is connected to the drain of a JFET transistor Q2. The source of the JFET transistor Q2 is connected to ground. The drain of a JFET transistor Q3 is connected to the drain of the JFET transistor Q2 through a resistor R13. The source of the JFET transistor Q3 is connected to the 2.7 volt DC bias. The gate of the JFET transistor Q3 is grounded through a resistor R14. The gate of the JFET transistor Q2 is connected to the control terminal 126 of the driver 101, and the gate of the JFET transistor Q3 is connected to the control terminal 126 of the driver 101 through a resistor R15. Prior to the enablement of the startup circuit 156, a relatively large voltage appears between the drain and the source of the JFET transistor Q2. Subsequent to the enablement of the startup circuit 156 and during the operation of the feedback control loop 78, a supply current tracking voltage, $V_{TRK-ISP}$, is produced between the drain and the source of the JFET transistor Q2.

The values of the resistor R13, R14, and R15 are selected to provide the desired amount of biasing for of the JFET transistors Q2 and Q3 of the startup circuit 156. The JFET transistors Q2 and Q3 in this particular embodiment are respective model BSS123 and BSS84 transistors. A typical resistance value for the resistors R13–R16 is, e.g., 10 kΩ.

The controller 60 includes a control processing unit 164 and a digital-to-analog converter 168. The control processing unit 164 is electrically coupled to the digital-to-analog converter 168 through four digital lines 166 to allow selection of an analog control voltage, $V_C$, which is produced on the output terminal 61 of the controller 60. The N number of digital lines 166 allows the controller 60 to select from $2^n$ discrete voltage levels, and in this particular embodiment, sixteen discrete voltage levels.

The output terminal 61 of the controller 60 is connected to a voltage buffer 170. The voltage buffer 170 comprises a resistor R16, a resistor R17, and a capacitor C35 connected in series between the output terminal 61 of the controller 60 and ground. A decoupling capacitor C36 is connected between the output terminal 61 of the controller 60 and ground. Alternatively, a 2.7 volt or 5 volt DC bias can be applied to the voltage buffer 170. Connection of the output terminal 61 of the controller 60 to the resistor RIG produces a control tracking voltage, $V_{TRK-C}$, across the resistor R17 and capacitor C35.

The values of the resistors R16 and R17 are selected to produce the desired scaling factor for the control tracking voltage, $V_{TRK-C}$. Typical resistance values of the respective resistors R16 and R17 are, e.g., 15 kΩ and 100Ω. The typical capacitance values of the respective capacitors C35 and C36 are, e.g., 12 pF and 0.1 $\mu$F.

The signal processor 80 is an integrating amplifier that embodies the subtractor 62, amplifier 64, and integrator 66. The signal processor 80 includes as its platform a differential operational amplifier U1. The inverting input terminal of the differential operational amplifier U1 is connected to an output terminal 176 of the differential operational amplifier U1 through resistor R20 and a capacitor C39, providing negative feedback to the differential operational amplifier U1.

The first input terminal 85 of the signal processor 80 is connected to the inverting input terminal of the differential operational amplifier U1 through resistors R18 and R19. The second input terminal 86 of the signal processor 80 is connected to the noninverting input terminal of the differential operational amplifier U1. The output terminal of the operational amplifier U1 is connected to the output terminal 176 of the signal processor 80.

The signal processor 80 further includes positive and negative power terminals 172 and 174 that are respectively connected to the positive and negative power terminals of the differential operational amplifier U1. The positive power terminal 172 of the signal processor 80 is connected to the 5 volt DC bias. Alternatively, the positive power terminal 172 of the signal processor 158 can be connected to the 2.7 volt DC bias. The negative power terminal 174 of the signal processor 158 is connected to the −5 volt DC bias. Decoupling capacitors C37 and C38 are respectively connected between the 5 volt DC bias and ground, and the −5 volt DC bias and ground.

The coupling terminal 84 of the current detector 80 is connected to the first input terminal 85 of the signal processor 80 outputting the supply current tracking voltage, $V_{TRK-ISP}$, on the first input terminal 85 of the signal processor 80. The voltage buffer 170 is connected to the second input terminal 86 of the signal processor 80 outputting the control tracking voltage, $V_{TRK-C}$, on the second input terminal 86 of the signal processor 80. The second input terminal 86 of the signal processor 80 is connected between the resistors R16 and R17 of the voltage buffer 170. The signal processor 80 produces a gate biasing voltage, $V_G$, on the output terminal 176 of the signal processor 80 equal to the integrated and scaled difference between the control tracking voltage, $V_{TRK-C}$, and the supply current tracking voltage, $V_{TRK-ISP}$. The value of the capacitor C35 is selected to vary the compensation and response time of the feedback control loop 78.

The differential operational amplifier U1 in this particular embodiment is a model LM7121 operational amplifier. The values of the resistors R18–R20 and capacitor C39 are selected to provide the desired gain and integration for the signal processor 80. Typical resistance values for the respective resistors R18–R20 are, e.g., 100Ω, 3 kΩ, and 100Ω. Typical capacitance values for the respective capacitors C37–C39 are, e.g., 0.1 μF, 0.1 μF, and 32 pF.

The output terminal 176 of the signal processor 80 is connected to the control terminal 112 of the RF amplifier 102 through a low pass filter 178. The low pass filter 178 includes a pair of series connected resistors R21 and R22 with a grounded capacitor C40 connected between the resistors R21 and R22. A diode D4 is connected in parallel with the output terminal 176 to prevent the respective gates 114 and 116 of the preceding gain stage 104 and the final gain stage 106 from becoming more positively biased than the voltage drop across the diode D4. The gate biasing voltage, $V_G$, is outputted to the control terminal 112 of the RF amplifier 102 through the low pass filter 178.

The diode D4 in this particular embodiment is a model MA4C5103C diode. A typical resistance value of the resistors R21 and R22 is, e.g., 10Ω. A typical resistance value of the capacitor C40 is, e.g., 18 pF.

The following is a description of the operation of the adaptable supply current circuit 100. The handset or WLL terminal receives the RF power designating signal, $S_{RFOUT}$, designating the power level of the RF output signal, $RF_{out}$. Prior to closure of the switch SW1, no current is flowing through the startup circuit 156, and thus, a relatively high voltage appears between the drain and source of the JFET transistor Q2, which is applied to the first input terminal 85 of the signal processor 80. A relatively low voltage appears across the output of the voltage buffer 170, which is applied to the second input terminal 86 of the signal processor 80. As such, a high negative voltage appears on the output terminal 176 of the signal processor 80, maintaining the RF amplifier 102 in an off position.

When the handset is ready to transmit to the base station, the controller 60 enables the switch SW1, providing power to the driver 101 through the power terminal 124 and to the preceding gain stage 104 and final gain stage 106 of the RF amplifier 102 through the respective power terminals 108 and 110. The controller 60 also enables the driver 101 through the control terminal 126. Since the startup circuit 156 is connected to the control terminal 126, the gates of the JFET transistors Q2 and Q3 are biased, allowing current to flow through the startup circuit 156. The control terminal 126 of the driver 101 is preferably enabled approximately 200 ns after the switch SW1 is closed.

The voltage between the drain and the source of the JFET transistor Q2 is reduced. The voltage on the first input terminal 85 of the signal processor 80 decreases, creating a relatively low negative voltage on the output terminal 176 of the signal processor 80. The RF amplifier 102 is turned on to produce the supply currents, $I_{SP}$ and $I_{SP}'$, in the respective preceding and final gain stages 104 and 106.

The supply current, $I_{SP}$, flows through the diode D2 of the current detector 58. The sampled supply current, $I_{SP}'$, flows through the bipolar transistor Q1, producing the sampled supply current voltage, $V_{ISP}$, across the resistor R12. The bias current, $I_{SP}$, influences the supply current tracking voltage, $V_{TRK-ISP}$, between the drain and source of the JFET transistor Q2. The supply current tracking voltage, $V_{TRK-ISP}$, inversely varies with the supply current, $I_{SP}$. That is, as the supply current, $I_{SP}$, increases, the sampled supply current, $I_{SP}'$, increases, increasing the sampled supply current voltage, $V_{ISP}$, across the resistor R12. An increase in the sampled supply current voltage, $V_{ISP}$, correspondingly decreases the supply current tracking voltage, $V_{TRK-ISP}$, between the drain and source of the JFET transistor Q2. Likewise, a decrease in the supply current, $I_{SP}$, correspondingly decreases the supply current tracking voltage, $V_{TRK-ISP}$. The supply current tracking voltage, $V_{TRK-ISP}$, indicates the present level of the supply current, $I_{SP}$.

The control processing unit 164 of the controller 60 receives the RF power designating signal, $S_{RFOUT}$, from the input terminal 63 of the controller 60, and accordingly sends a digital signal through the control lines 166 to the digital-to-analog converter 168 selecting the control voltage, $V_C$. The digital-to-analog converter 168 produces the control voltage, $V_C$, on the output terminal 61 of the controller 60. The control voltage, $V_C$, is applied to the voltage buffer 170 to influence the control tracking voltage, $V_{TRK-C}$, across the resistor R17 and capacitor C35. The control tracking voltage, $V_{TRK-C}$, varies with the control voltage, $V_C$. That is, as the control voltage, $V_C$, increases, the control tracking voltage, $V_{TRK-C}$, increases. Likewise, as the control voltage, $V_C$, decreases, the control tracking voltage, $V_{TRK-C}$, decreases. The control tracking voltage, $V_{TRK-C}$, indicates the desired level of the supply current, $I_{SF}$.

The supply current tracking voltage, $V_{TRK-ISP}$, is applied to the first input terminal 85 of the signal processor 80. The control tracking voltage, $V_{TRK-C}$, is applied to the second input terminal 86 of the signal processor 80. The signal processor 80 determines, scales, and integrates the difference between the control tracking voltage, $V_{TRK-C}$, and the supply current tracking voltage, $V_{TRK-ISP}$, to produce the gate biasing voltage, $V_G$, on the output terminal 176 of the signal processor 80.

The gate biasing voltage, $V_G$, is then fed through the low pass filter 178 into the control terminal 112 of the RF amplifier 102, which varies the supply current, $I_{SP}$, and thus the supply current, $I_{SF}$, according to the control voltage, $V_C$, selected by the controller 60.

The RF input signal, $RF_{in}$, is fed into the RF input terminal 128 of the driver 101, which amplifies the RF input signal, $RF_{in}$, to produce the intermediate RF signal, $RF_{in}'$, on the output terminal 130 of the driver 101. The intermediate RF signal, $RF_{in}'$, is fed into the RF input terminal 120 of the RF amplifier 102, which amplifies the intermediate RF signal, $RF_{in}'$, to produce the RF output signal, $RF_{out}$, on the RF output terminal 122 of the RF amplifier 102. The RF input signal, $RF_{in}$, is preferably applied to the RF input terminal 128 of the driver 101 preferably approximately 400 ns after the closure of the switch SW1.

Figure 10:
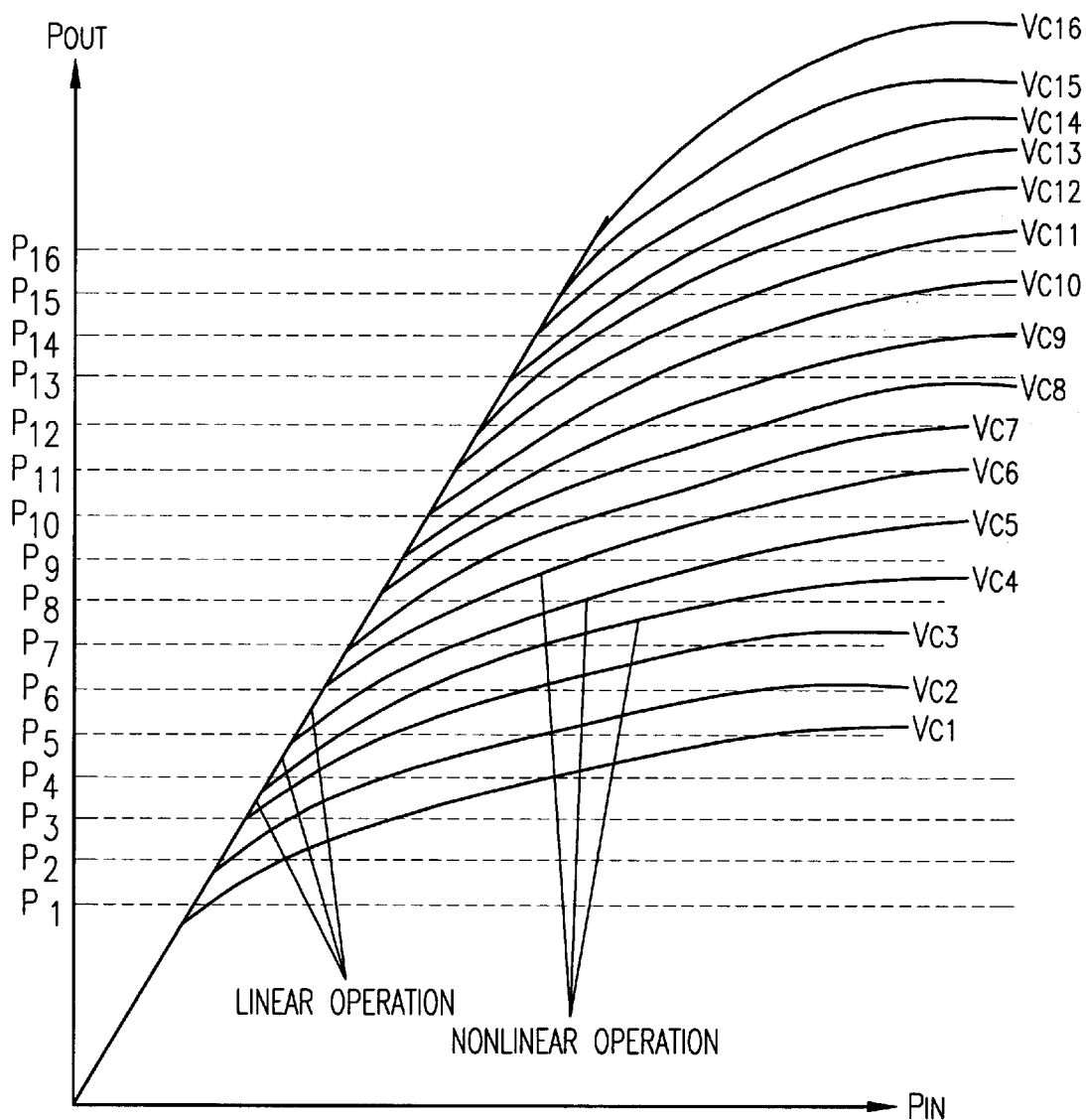
FIG. 10 is a graph showing exemplary compression characteristics of the RF amplifier employed in the adaptable supply current circuit of FIG. 7.

The levels of the supply currents, $I_{SP}$ and $I_{SF}$, are chosen such that it has the minimum value necessary to maintain the RF amplifier 102 in a linear operating range across the full range of average RF output signal power, $P_{out}$. As depicted in FIG. 10, the controller 60 is programmed with a matrix of average RF output signal power, $P_{out}$, levels $P_1$–$P_{16}$ and corresponding control voltage, $V_C$, levels $V_{C1}$–$V_{C16}$. As can be seen from FIG. 10, each voltage, $V_C$, levels is chosen such it is the minimum necessary to maintain linear operation of the RF output amplifier 102 on that particular average RF output signal power, $P_{out}$, level. It should be noted that because the controller 60 can select from sixteen discrete control voltage, $V_C$, levels, the range of average RF output signal power, $P_{out}$, levels is divided into sixteen corresponding levels. The level of the control voltage, $V_C$, corresponding to the particular level of the average RF output signal, $P_{out}$, should be chosen, such that the levels of the supply currents, $I_{SP}$ and $I_{SF}$, are the minimum necessary to maintain linear operation of the RF amplifier on that particular level of average RF output signal power, $P_{out}$.

When the controller 60 receives the RF power designating signal, $S_{RFOUT}$, designating the desired level of average RF output signal power, $P_{out}$, the controller 60 will select the corresponding level of control voltage, $V_C$, from the matrix and set the values of the supply currents, $I_{SP}$ and $I_{SF}$, to the minimum level necessary to maintain linear operation of the RF amplifier 102. For instance, if the level of the average RF output signal power, $P_{out}$, is $P_5$, the controller 60 will receive the RF power designating signal, $S_{RFOUT}$, designating the level $P_5$ as the desired average RF output signal power, $P_{out}$. The controller 60 will accordingly select $V_{C5}$ as the level of the control voltage, $V_C$, which is the minimum level of the control voltage, $V_C$, necessary to maintain linear operation of the RF amplifier 102 on an average RF output signal power, $P_{out}$, level of $P_5$. If the controller 60 receives the RF power designating signal, $S_{RFOUT}$, sent from the base station designating an increase in the average RF output signal power, $P_{out}$, from the level $P_5$ to the level $P_6$, the controller 60 will accordingly select $V_{C6}$ as the level of the control voltage, $V_C$, which is the minimum level of the control voltage, $V_C$, necessary to maintain linear operation of the RF amplifier 102 on an average RF output signal power, $P_{out}$, level of $P_5$. Likewise, if the controller 60 receives the RF power designating signal, $S_{RFOUT}$, designating a decrease in the average RF output signal power, $P_{out}$, from the level $P_5$ to the level $P_4$, the controller 60 will accordingly select $V_{C4}$ as the level of the control voltage, $V_C$, which is the minimum level of the control voltage, $V_C$, necessary to maintain linear operation of the RF amplifier 102 on an average RF output signal power, $P_{out}$, level of $P_4$.

Figure 11:
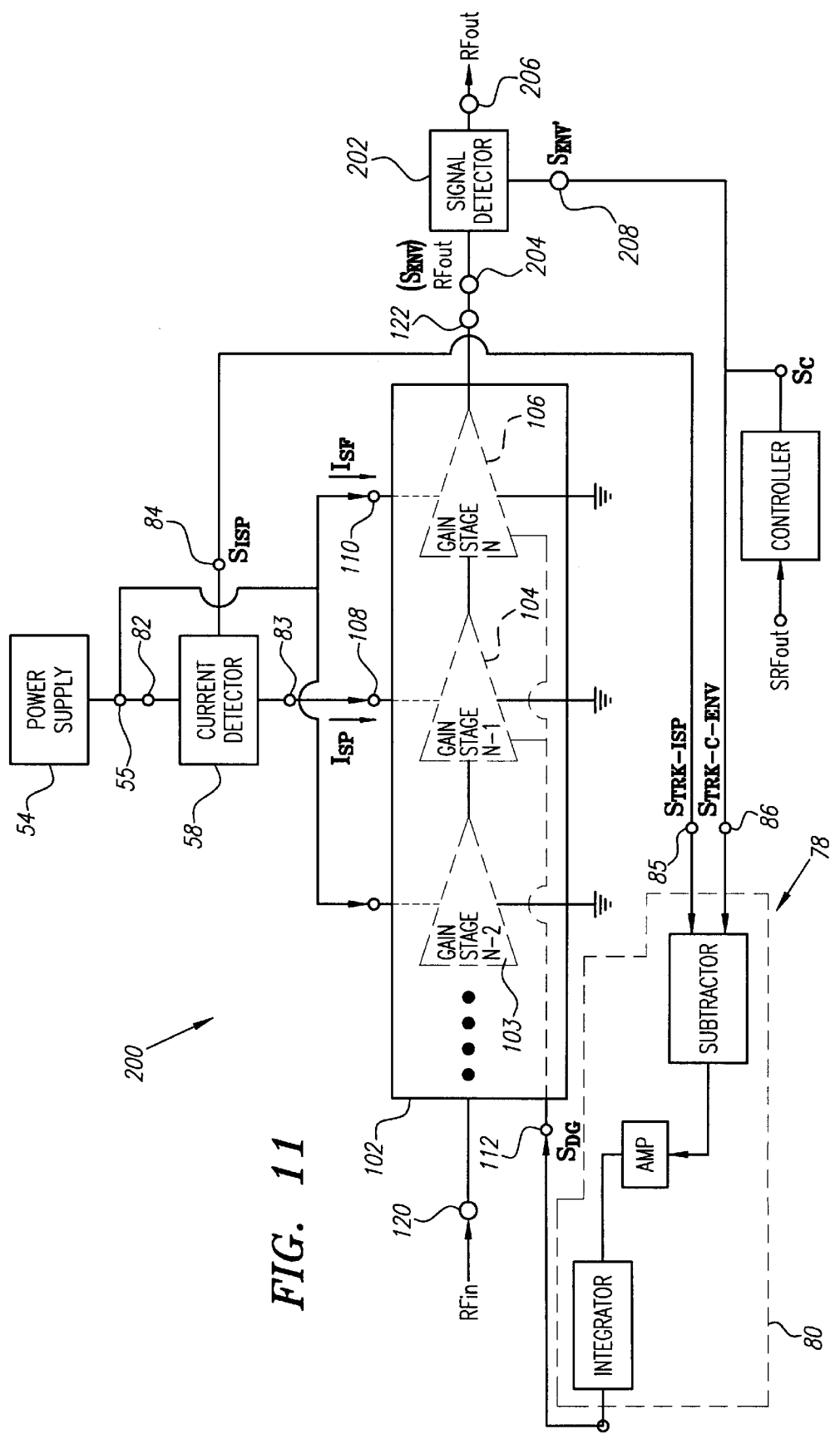
FIG. 11 is a block diagram of a dynamically adaptable supply current circuit.

FIG. 11 shows a dynamically adaptable supply current circuit 200. The dynamically adaptable supply current circuit 200 is similar to the adaptable supply current circuit 100 shown in FIG. 6, and to the extent the components of each are the same, the same reference numerals have been used. The dynamically adaptable supply current circuit 200 differs from the adaptable supply current circuit 100 in that the bias current, $I_{SF}$, varies with the envelope of a modulated RF output signal, $RF_{out}$, from the level set by the controller 60, increasing the efficiency of the RF amplifier 102.

Figure 1:
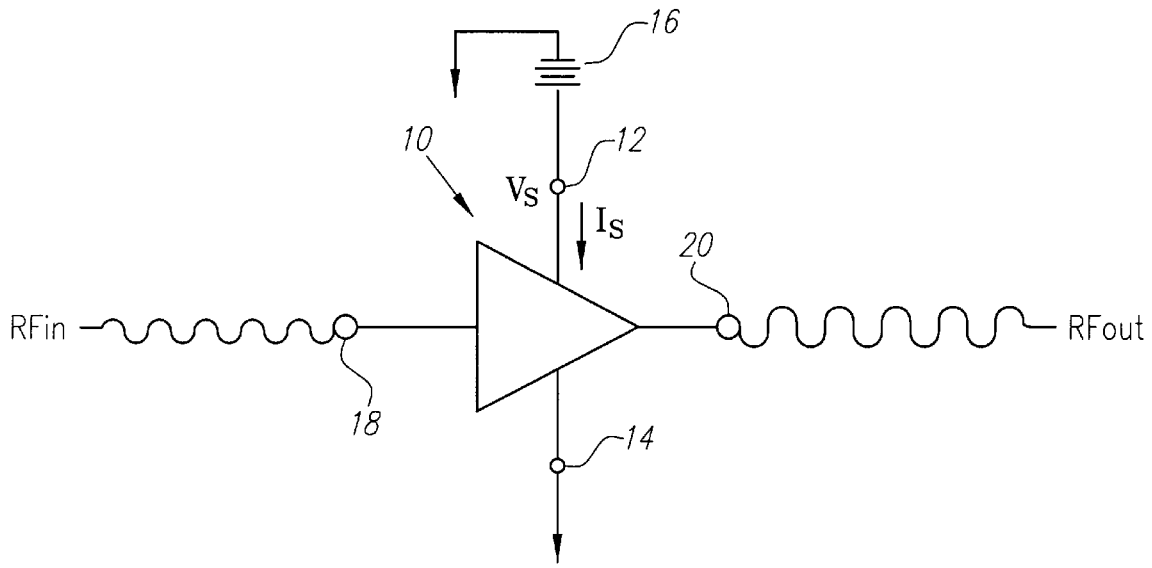
FIG. 1 is a prior art circuit diagram of a conventional RF amplifier.
Figure 2:
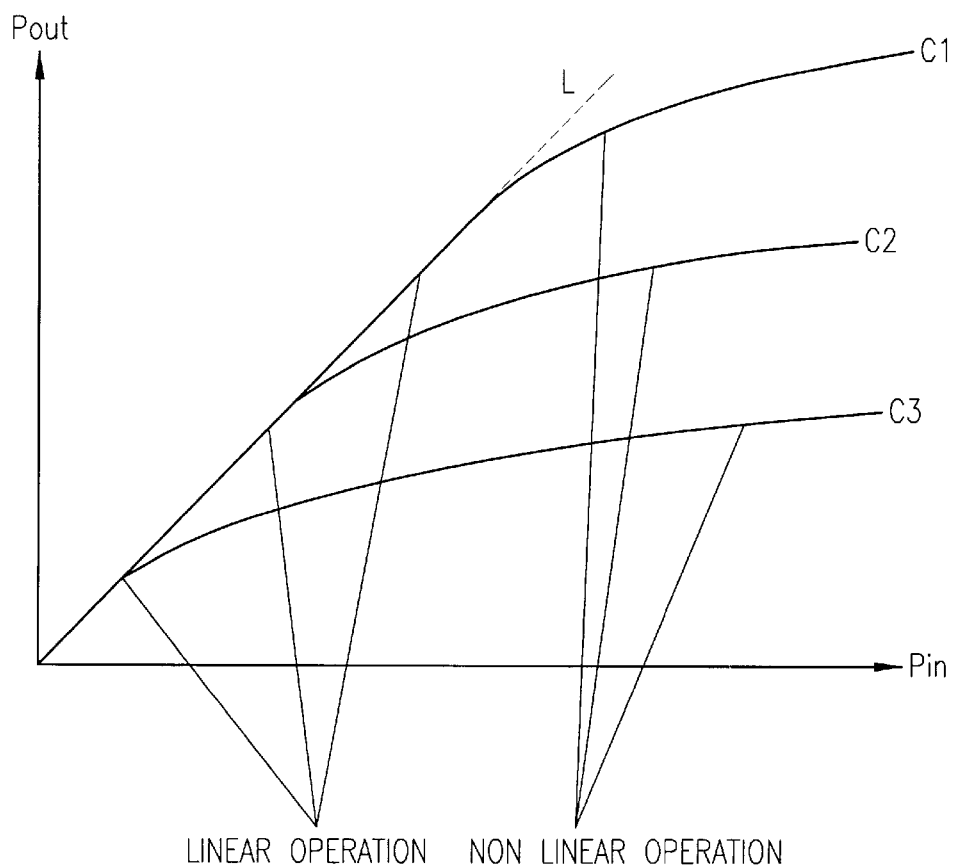
FIG. 2 is a graph showing exemplary compression characteristics of the prior art conventional RF amplifier of FIG. 1.
Figure 3:
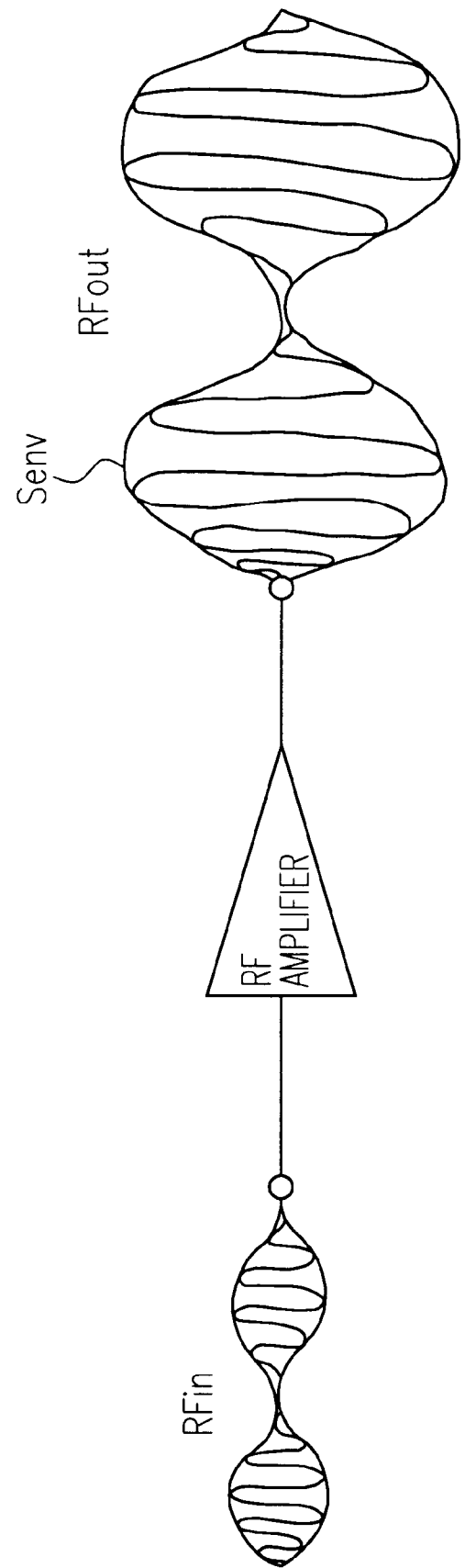
FIG. 3 is a block diagram of a prior art conventional RF amplifier depicting a modulated RF input signal amplified to create a modulated RF output signal.

The RF amplifier 102 as depicted in FIG. 11 has N gain stages. A single-stage RF amplifier, however, can be employed in this arrangement without straying from the principles taught by this invention. The RF input signal, $RF_{in}$, fed into the RF input terminal 120 of the RF amplifier 102 is amplified to produce an intermediate RF output signal, $RF_{out}'$, on the RF output terminal 122 of the RF amplifier 102, which is a modulated signal having an output envelope signal, $S_{env}$, as depicted in FIG. 3.

The control feedback loop 78 of the dynamically adaptable supply current circuit 200 includes a signal detector 202 to sample the output envelope signal, $S_{env}$. The signal detector 202 includes an input terminal 204 connected to the RF output terminal 122 of the RF amplifier 102. The signal detector 202 samples the output envelope signal, $S_{env}$, from the intermediate RF output signal, $RF_{out}'$ on the output terminal 122 of the RF amplifier 122 and produces the RF output signal, $RF_{out}$, on an output terminal 206 of the signal detector 202. The signal detector 202 includes a coupling terminal 208 connected to the second input terminal 86 of the signal processor 80. The signal detector 202 produces a sampled output envelope signal, $S_{env}'$ on the coupling terminal 208 of the signal detector 202, influencing a control and envelope tracking signal, $S_{TRK-C-env}$, on the second input terminal 86 of the signal processor 80. The control and envelope tracking signal, $S_{TRK-C-env}$, indicates the present level of the output envelope signal, $S_{env}$, as well as the desired average level of the supply current, $I_{SF}$. An example of a device that can be used as the signal detector 202 is a directional coupler and peak detector.

Figure 12:
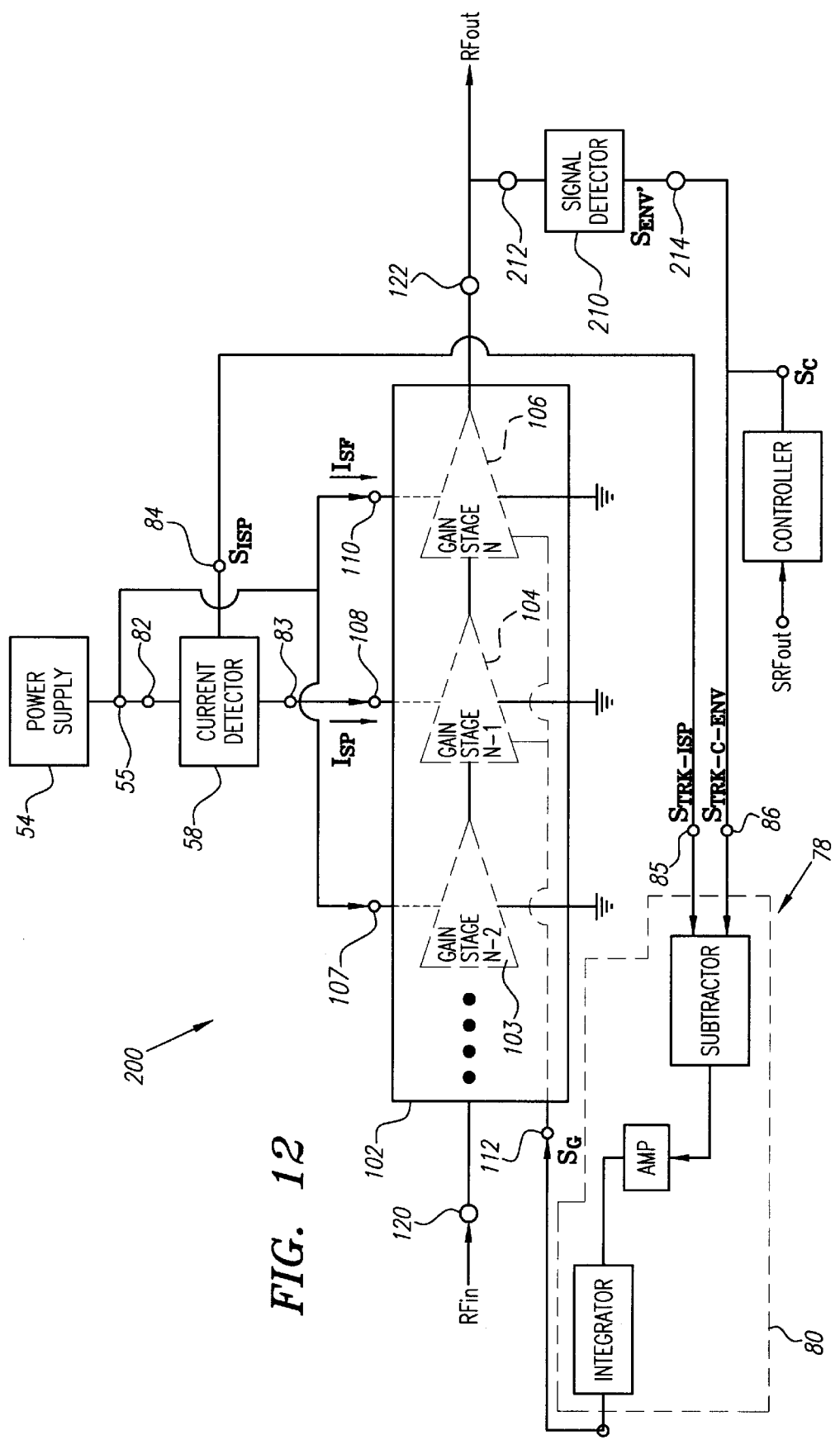
FIG. 12 is a block diagram of an alternative embodiment of a dynamically adaptable supply current circuit.

Alternatively, as shown in FIG. 12, the feedback control loop 78 includes a signal detector 210 with an input terminal 212 that is connected to the RF output terminal 122 of RF amplifier 102, and an output terminal 59 that is connected to the second input terminal 86 of the signal processor 80. The RF output signal, $RF_{out}$, having an output envelope signal, $S_{env}$, is produced on the RF output terminal 122 of the RF amplifier 102. The signal detector 210 samples the output envelope signal, $S_{env}$, on the input terminal 212 of the signal detector 210 and produces the sampled output envelope signal, $S_{env}$, on the output terminal 214 of the signal detector 210, influencing the control and envelope tracking signal, $S_{TRK-C-env}$, on the second input terminal 86 of the signal processor 80. An example of a device that can be used as the signal detector 210 is a peak detector.

The signal processor 80 determines, scales, and integrates the difference between the control and envelope tracking signal, $S_{TRK-C-env}$, and the supply current tracking signal, $S_{TRK-ISP}$, to obtain a dynamic gate biasing signal, $S_{DG}$, on the output terminal 112 of the signal processor 80. The dynamic gate biasing signal, $S_{DG}$, is fed into a control terminal 112 of the RF amplifier 102.

The control loop 78 allows the average supply current, $I_{SF}$, to be set by the controller 60, while allowing the supply current, $I_{SF}$, to also vary with the level of the output envelope signal, $S_{env}$.

In alternative embodiments, a dynamically adaptable supply current circuit is created by foregoing the employment of the controller 60. In this embodiment, the signal detector 202 is employed to produce an envelope tracking signal, $S_{TRK-env}$, which indicates the present level of the output envelope signal, $S_{env}$, on the second input terminal 86 of the signal processor 80. A dynamic gate biasing signal, $S_{DG}$, is produced on the output terminal 112 of the signal processor 80, and applied to the control terminal 112 of the RF amplifier 102, allowing the average supply current, $I_{SF}$, to vary with the output envelope signal, $S_{env}$.

Figure 13:
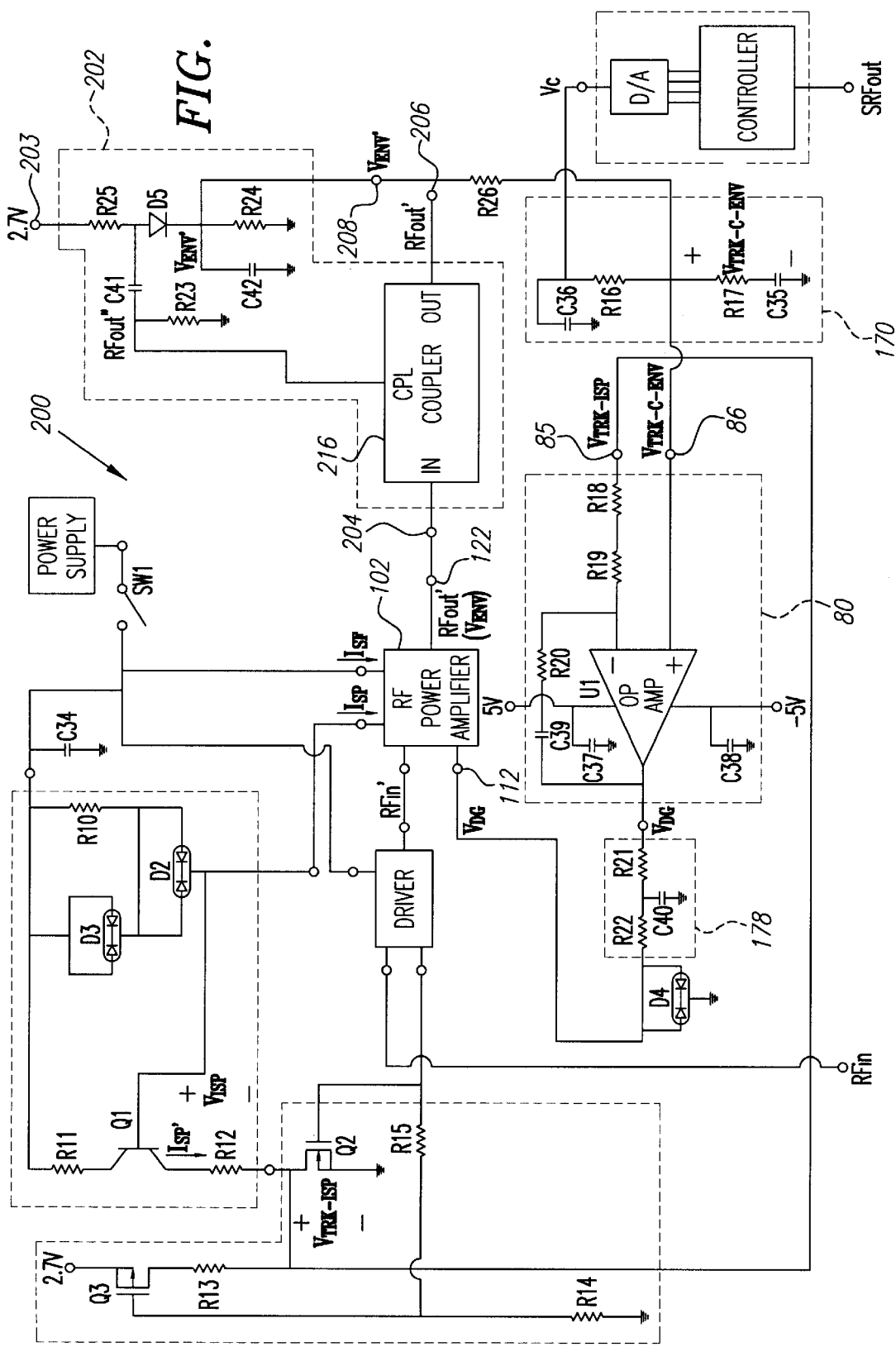
FIG. 13 is a circuit diagram of the dynamically adaptable supply current circuit of FIG. 11.

Particular aspects of the dynamically adaptable supply current circuit 200 will now be described with reference to FIG. 13. To the extent the particular aspects of the dynamically adaptable supply current circuit 200 are the same to those of the adaptable supply current circuit 100, the same reference numerals have been used.

The particular signal detector 202 in this embodiment is a peak or envelope detector. The envelope detector 202 includes a directional coupler 216. The input port and output port of the directional coupler 216 are respectively connected to the input terminal 204 and the output terminal 206 of the envelope detector 202. The RF output signal, $RF_{out}'$, on the output terminal 122 of the RF amplifier 102 has an output envelope voltage, $V_{env}$. The coupling port of the directional coupler 216 is connected to ground through a load resistor R23, producing a sampled signal, $RF_{out}''$, at the resistor R23.

The anode of a DC biased diode D5 is connected to ground through the load resistor R23 and a DC blocking capacitor C41, and the cathode of the diode D5 is connected to ground through an RC circuit comprising a resistor R24 connected in parallel with a capacitor C42. The 2.7 volt DC bias is applied to a power terminal 203 of the envelope detector 202. The power terminal 203 of the envelope detector 202 is connected to the anode of the diode D5 through a resistor R25. A sampled output envelope voltage, $V_{env}'$, proportional to the output envelope voltage, $V_{env}$, is produced across the RC circuit, R24 and C42. The values of the resistor R24 and C42 are selected to vary the time constant of the RC circuit.

The cathode of the diode D5 is connected to the coupling terminal 208 of the envelope detector 202. The coupling terminal 208 of the envelope detector 202 is connected to ground through a resistor R26 and the resistor R17 and capacitor C35 of the voltage buffer 170. A control and envelope tracking voltage, $V_{TRK-C-env}$, is produced across the resistor R17 and capacitor C35 of the voltage buffer 170, and thus the second input terminal 86 of the signal processor 80. This signal is a summation of $V_C$ and $V_{env}'$.

The directional coupler 216 in this particular embodiment is a model 550PBM directional coupler. The diode D5 in this particular embodiment is a model MA4E1245KA diode. Typical resistance values that may be used for the respective resistors R23–R26 are, e.g., 220Ω, 10 kΩ, 270 kQ, and 10 kΩ. A typical capacitance value that may be used for the respective capacitors C41 and C42 are, e.g., 27 pF and 2 pF.

Figure 14:
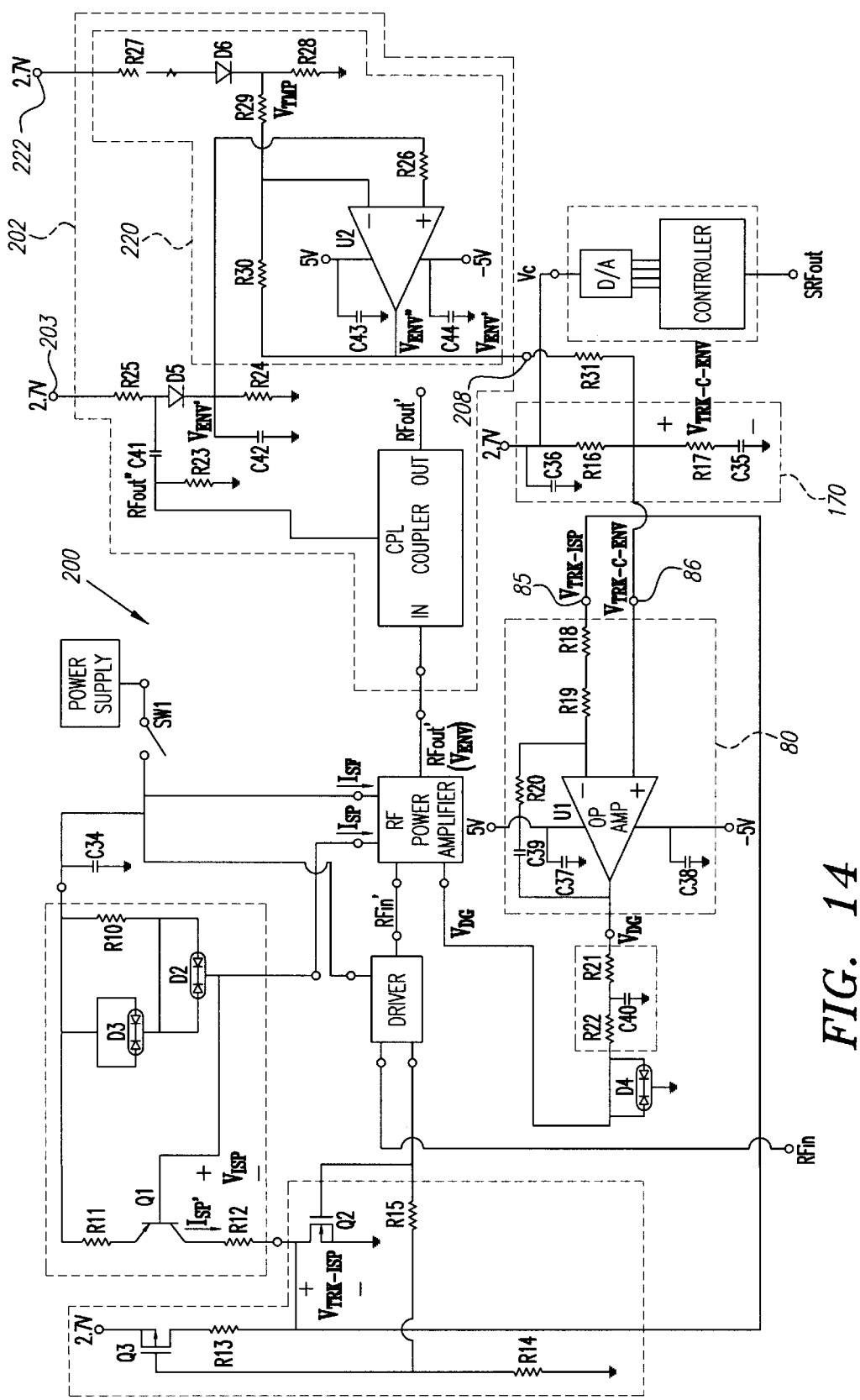
FIG. 14 is a circuit diagram of the preferred dynamically adaptable supply current circuit of FIG. 11.

As shown in FIG. 14, the envelope detector 202 can alternatively comprise a temperature compensation circuit 220. The temperature compensation circuit 220 includes a DC biased diode D6 that is connected on its anode to a power terminal 222 of the envelope detector 202 through a resistor R27. The power terminal 222 of the envelope detector 202 is connected to the 2.7 volt DC bias. The cathode of the diode D6 is connected to ground through a resistor R28, producing a temperature compensating voltage, $V_{TMP}$, across the resistor R28. Preferably, the resistance values R25 and R24 are respectively equal to the resistance values of R27 and R28 and the characteristics of the diodes D5 and D6 are similar, so that the temperature compensating voltage, $V_{TMP}$, and the sampled output envelope voltage, $V_{env}'$ vary the same over temperature.

The cathode of the diode D6 is connected to an inverting input terminal of a differential operational amplifier U2 through a resistor R29. The resistor R26 is connected to the noninverting input terminal of differential operational amplifier U2. The inverting input terminal of the differential operational amplifier U2 is connected to the output terminal of the differential operational amplifier U2 through an electrical path comprising a resistor R30.

The positive power terminal of the differential operational amplifier U2 is connected to the 5 volt DC bias. Alternatively, the positive power terminal can be connected to the 2.7 volt DC bias. The negative power terminal of the differential operational amplifier U2 is connected to the −5 volt DC bias. Decoupling capacitors C43 and C44 are respectively connected between the 5 volt DC bias and ground, and the −5 volt DC bias and ground.

A temperature compensated output envelope voltage, $V_{env}''$, proportional to the output envelope voltage, $V_{env}$, and stable over a range of temperatures, is produced on the output terminal of the differential operational amplifier U2. The resistance values of R26 and R29 are equal to provide accurate temperature compensation of the sampled output envelope voltage, $V_{env}'$. The output terminal of the differential operational amplifier U2 is connected to the coupling terminal 208 of the envelope detector 202. The coupling terminal 208 of the envelope detector 202 is grounded through a feed resistor R31, and the resistor R17 and capacitor C35 of the voltage buffer 170. The control and envelope tracking voltage, $V_{TRK-C-env}$, is produced across the resistor R17 and capacitor C35 of the voltage buffer 170, and thus the second input terminal 86 of the signal processor 80. This signal is the summation of $V_{env}''$ and $V_C$.

The signal processor 80 produces a dynamic gate biasing voltage, $V_{DG}$, on the output terminal 176 of the signal processor 80 equal to the scaled and integrated difference between the control and envelope tracking voltage, $V_{TRK-C-env}$, and the supply current tracking voltage, $V_{TRK-ISP}$.

The diode D6 in this particular embodiment is a model NA4E1245KA diode. The differential operational amplifier U2 in this particular embodiment is a model LM7121 operational amplifier. Typical resistance values that may be used for the respective resistors R27–31 are, e.g., 270 kΩ, 10 kΩ, 10 kΩ, 10 kΩ, and 3.9 kΩ. A typical capacitance value that may be used for the respective capacitors C43 and C44 is, e.g., 0.1 µF.

The following description of the operation of the dynamically adaptable supply current circuit 200 is provided. To the extent that the operative aspects of the dynamically adaptable supply current circuit 200 are similar to those of the adaptable supply current circuit 100 described above, they will not be repeated.

After the supply currents, $I_{SP}$ and $I_{SF}$, have reached their desired set levels, and the modulated output signal, $RF_{out}$, has reached the RF output terminal 122 of the RF amplifier 102, the envelope detector 202 samples the intermediate RF output signal, $RF_{out}'$, and produces the sampled output signal, $RF_{out}''$, across the resistor R23. The envelope detector 202 produces the RF output signal, $RF_{out}$, on the RF output terminal 122 of the envelope detector 202. The diode D5 and RC circuit detect the envelope voltage of the sampled output signal, $RF_{out}''$, and produce the sampled output envelope voltage, $V_{env}'$, across the resistor R24.

If the temperature compensating circuit 210 is employed, the differential amplifier U2 determines the difference between the temperature compensating voltage, $V_{TMP}$, and the sampled output envelope voltage, $V_{env}'$. The temperature compensating voltage, $V_{TMP}$, varies the same amount with temperature as does the sampled output envelope voltage, $V_{env}'$, and the temperature created variations in the sampled output envelope voltage, $V_{env}'$, are effectively removed by the differential amplifier U2 to produce the temperature compensated sampled output envelope voltage, $V_{env}''$.

Depending on whether the temperature compensating circuit 210 is employed, either the sampled output envelope voltage, $V_{env}'$, or the temperature compensated sampled output envelope voltage, $V_{env}''$, is applied to the voltage buffer 170, influencing the control and envelope tracking voltage, $V_{TRK-C-env}$, across the resistor R17 and capacitor C35. The control and envelope tracking voltage, $V_{TRK-C-env}$, varies with the output envelope voltage, $V_{env}$. That is, as the output envelope voltage, $V_{env}$, increases, the control and envelope tracking voltage, $V_{TRK-C-env}$, increases. Likewise, as the output envelope voltage, $V_{env}$, decreases, the control and envelope tracking voltage, $V_{TRK-C-env}$, decreases. The control and envelope tracking voltage, $V_{TRK-C-env}$, indicates the present level of the output envelope voltage, $V_{env}$, as well as the desired average level of the supply current, $I_{SF}$.

The supply current tracking voltage, $V_{TRK-ISP}$, is applied to the first input terminal 85 of the RF amplifier 102. The control and envelope tracking voltage, $V_{TRK-C-env}$, is applied to the second input terminal 86 of the signal processor 80. The signal processor 80 determines, scales, and integrates the difference between the control and envelope tracking voltage, $V_{TRK-C-env}$, and the supply current tracking voltage, $V_{TRK-ISP}$, to produce a dynamic gate biasing voltage, $V_{DG}$, on the output terminal 176 of the signal processor 80. The dynamic gate biasing voltage, $V_{DG}$, and thus the supply currents, $I_{SP}$ and $I_{SF}$, track the output envelope voltage, $V_{env}$. The efficiency of the RF amplifier 102 is improved because the supply current, $I_{SF}$, varies with the instantaneous power variations associated with the RF output signal, $RF_{out}$, maintaining minimum DC bias power for a specific RF output power.

Figure 15:
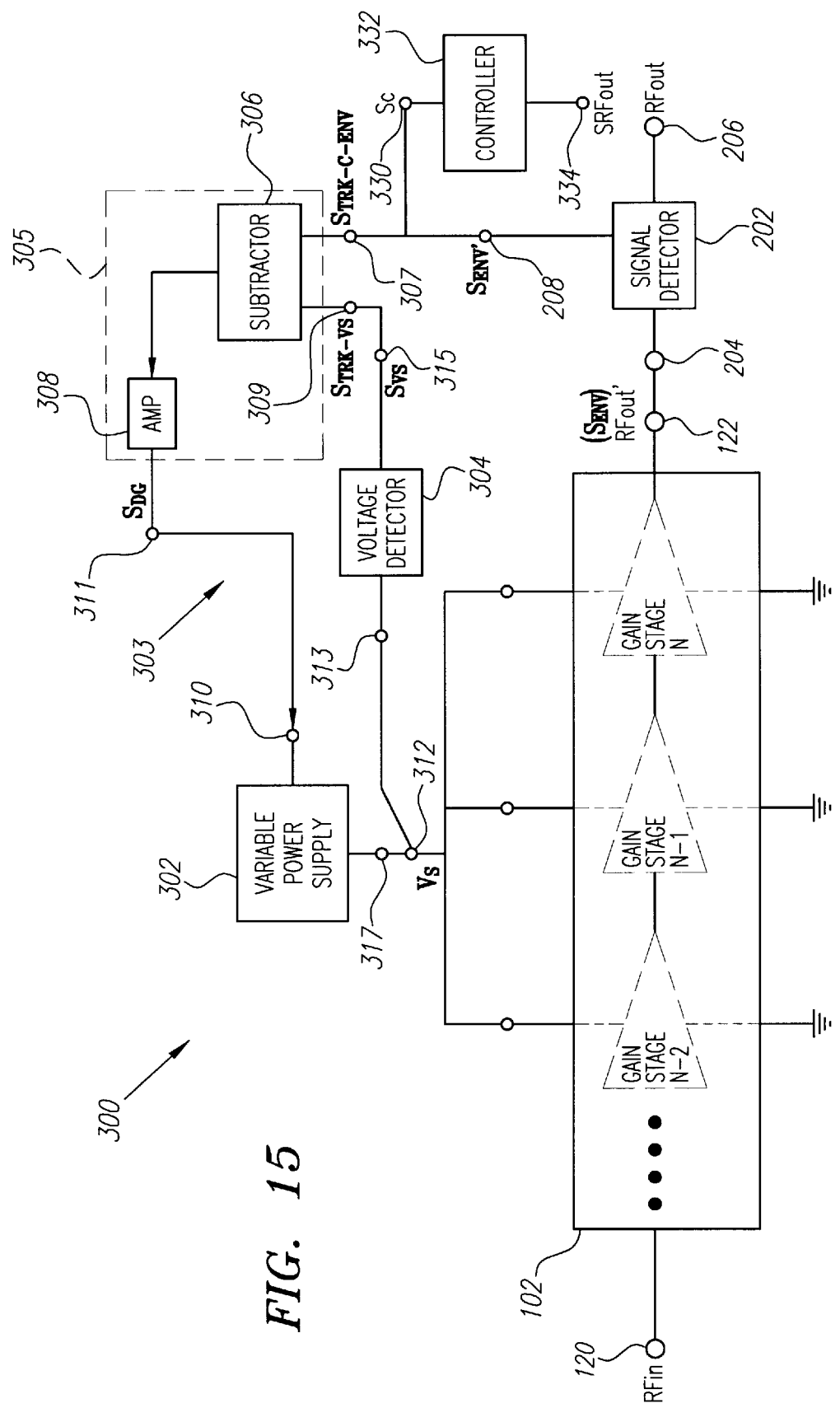
FIG. 15 is a block diagram of an adaptable supply voltage circuit.

Referring to FIG. 15, a dynamically adaptable supply voltage circuit 300 is employed to operate the RF amplifier 102 included in the dynamically adaptable supply voltage circuit 300 more efficiently and linearly by varying a supply voltage, $V_S$, applied to the RF amplifier 102.

The RF amplifier 102 as depicted in FIG. 15 has an N number of gain stages. A single stage RF amplifier, however, can be employed in this arrangement without straying from the principles taught by this invention.

The dynamically adaptable supply voltage circuit 300 includes a variable power supply 302. As with the dynamically adaptable supply current circuit 200, the RF input signal, $RF_{in}$, fed into the RF input terminal 120 of the RF amplifier 102 is amplified, and the intermediate RF output signal, $RF_{out}'$, on the RF output terminal 122 of the RF amplifier 102 is a modulated signal having the output envelope signal, $S_{env}$.

The variable power supply 302 includes an output terminal 317 connected to a power terminal 312 of the RF amplifier 102 to produce the supply voltage, $V_S$, on the power terminal 312 of the RF amplifier 102. The variable power supply 302 further includes a control terminal 310 that is employed to control a variable internal source voltage (not shown) in the variable power supply 302.

The supply voltage, $V_S$, is controlled through a feedback control loop 303 that includes a signal processor 305, a voltage detector 304, a controller 320, and a signal detector, such as the signal detector 202 employed by the dynamically adaptable supply current circuit 200.

The voltage detector 304 includes an input terminal 313 connected to the power terminal 312 of the RF amplifier 102, and an output terminal 315 connected to a second input terminal 309 of the signal processor 305. The voltage detector 304 samples the supply voltage, $V_S$, on the power terminal 312 of the RF amplifier 102 and producing a sampled supply voltage signal, $S_{VS}$, on the output terminal 315 of the voltage detector 304, influencing a supply voltage tracking signal, $S_{TRK-VS}$, on the second input terminal 309 of the signal processor 305. The supply voltage tracking signal, $S_{TRK-VS}$, indicates the present level of the supply voltage, $V_S$. An example of a device that can be used as the voltage detector 304 is a voltage divider.

Figure 16:
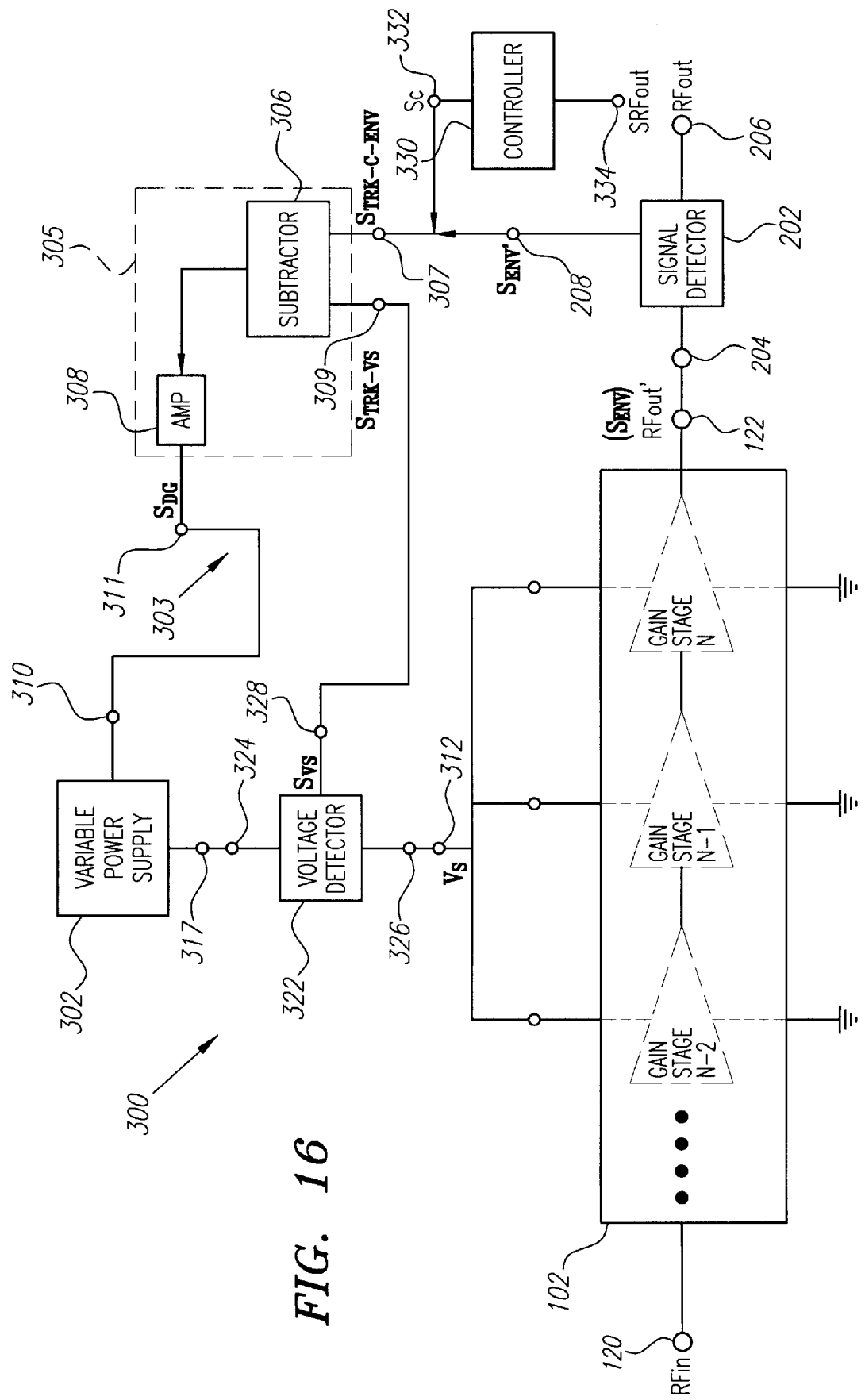
FIG. 16 is a block diagram of an alternative embodiment of an adaptable supply voltage circuit.

Alternatively, as shown in FIG. 16, the feedback control loop 303 includes a voltage detector 322 with an input terminal 324 connected to the output terminal 317 of the variable power supply 302, and an output terminal 326 connected to the power terminal 312 of the RF amplifier 102. The voltage detector 322 samples the voltage on the input terminal 324 of the voltage detector 322 and produces the supply voltage, $V_S$, on output terminal 326 of the voltage detector 322, and thus the power terminal 312 of the RF amplifier 102. The voltage detector further includes a coupling terminal 328 connected to the second input terminal 309 of the signal processor 305. The voltage detector 322 produces a sampled supply voltage signal, $SV_S'$, on the coupling terminal 328 of the voltage detector 322, influencing the supply voltage tracking signal, $S_{TRK-VS}$, on the second input terminal 309 of the signal processor 305. An example of a device that can be used as the voltage detector 322 is a resistor network.

The controller 330 includes an input terminal 334 into which an RF power designating signal, $S_{RFOUT}$, designating a desired average RF output signal power, $P_{out}$, and thus, the desired supply voltage, $V_S$, is input. The controller 330 further includes an output terminal 332 that is connected to a first input terminal 307 of the signal processor 305. The controller 330 produces a control signal, $S_C$, on the output terminal 332 of the controller 330 in accordance with the RF power designating signal, $S_{RFOUT}$, influencing a control and envelope tracking signal, $S_{TRK-C-env}$, on the first input terminal 307 of the signal processor 305. The control and envelope tracking signal, $S_{TRK-C-env}$, indicates the desired average voltage level of the supply voltage, $V_S$.

The input terminal 204 of the signal detector 202 is connected to the RF output terminal 122 of the RF amplifier 102. The signal detector 202 samples the output signal envelope, $S_{env}$, on the input terminal 204 of the signal detector 202, producing the RF output signal, $RF_{out}$, on the output terminal 206 of the signal detector 202. The coupling terminal 208 of the signal detector 202 is connected to the first input terminal 307 of the signal processor 305. The signal detector 202 produces the sampled output envelope signal, $S_{env}'$, on the coupling terminal 208 of the signal detector 202, influencing the control and envelope tracking signal, $S_{TRK-C-env}$, on the first input terminal 307 of the signal processor 305. The control and envelope tracking signal, $S_{TRK-C-env}$, the present level of the output envelope signal, $S_{env}$, as well as the desired level of the supply voltage, $V_S$. Alternatively, the feedback control loop 305 comprises the signal detector 210 depicted in FIG. 12 to sample the output envelope signal, $S_{env}$.

The signal processor 305 includes a subtractor 306 and an amplifier 308. The subtractor 306 determines the difference between the control and envelope tracking signal, $S_{TRK-C-env}$, and the supply voltage tracking signal, $S_{TRK-VS}$. In alternative embodiments, the signal processor 305 also includes an integrator. The amplifier 308 is preferably employed to scale the difference between the control and envelope tracking signal, $S_{TRK-C-env}$, and the supply voltage tracking signal, $S_{TRK-VS}$. The gain of the amplifier 308 can be greater or less than unity. The signal processor 305 produces a dynamic biasing signal, SDB, on an output terminal 311 of the signal processor 305. The output terminal 311 of the signal processor 305 is connected to the control terminal 310 of the variable power supply 302. The dynamic biasing signal, $S_{DB}$, is fed into the control terminal 310 of the variable power supply 302. The subtraction and scaling steps are not limited to the particular order described above, and can be performed in any order or simultaneously to obtain the dynamic biasing signal, $S_{DB}$. The output voltage of the variable power supply 302, and the supply voltage, $V_S$, will vary according to the value of the dynamic biasing signal, $S_{DB}$.

The control loop 303 allows the average supply voltage, $V_S$, to be set by the controller 330, while allowing the supply voltage, $V_S$, to also vary, either discretely or continuously, with the level of the output envelope signal, $S_{env}$.

In alternative embodiments, an adaptable supply voltage circuit is created by foregoing the employment of the signal detector 202. In this embodiment, the controller 330 is employed to produce a control tracking signal, $S_{TRK-C}$, which indicates the desired average level of the supply voltage, $V_S$, on the first input terminal 307 of the signal processor 305. A biasing signal, $S_B$, is produced on the output terminal 311 of the signal processor 305, and applied to the control terminal 310 of the variable power supply 302, allowing the average supply voltage, $V_S$, to be set by the controller 330.

In further alternative embodiments, a dynamically adaptable supply voltage circuit is created by foregoing the employment of the controller 330. In this embodiment, the signal detector 202 is employed to produce an envelope tracking signal, $S_{TRK-env}$, which indicates the present level of the output envelope signal, $S_{env}$, on the first input terminal 307 of the signal processor 305. A dynamic biasing signal, $S_{DB}$, is produced on the output terminal 311 of the signal processor 305, and applied to the control terminal 310 of the variable power supply 302, allowing the average supply voltage, $V_S$, to vary with the output envelope signal, $S_{env}$.

Figure 17:
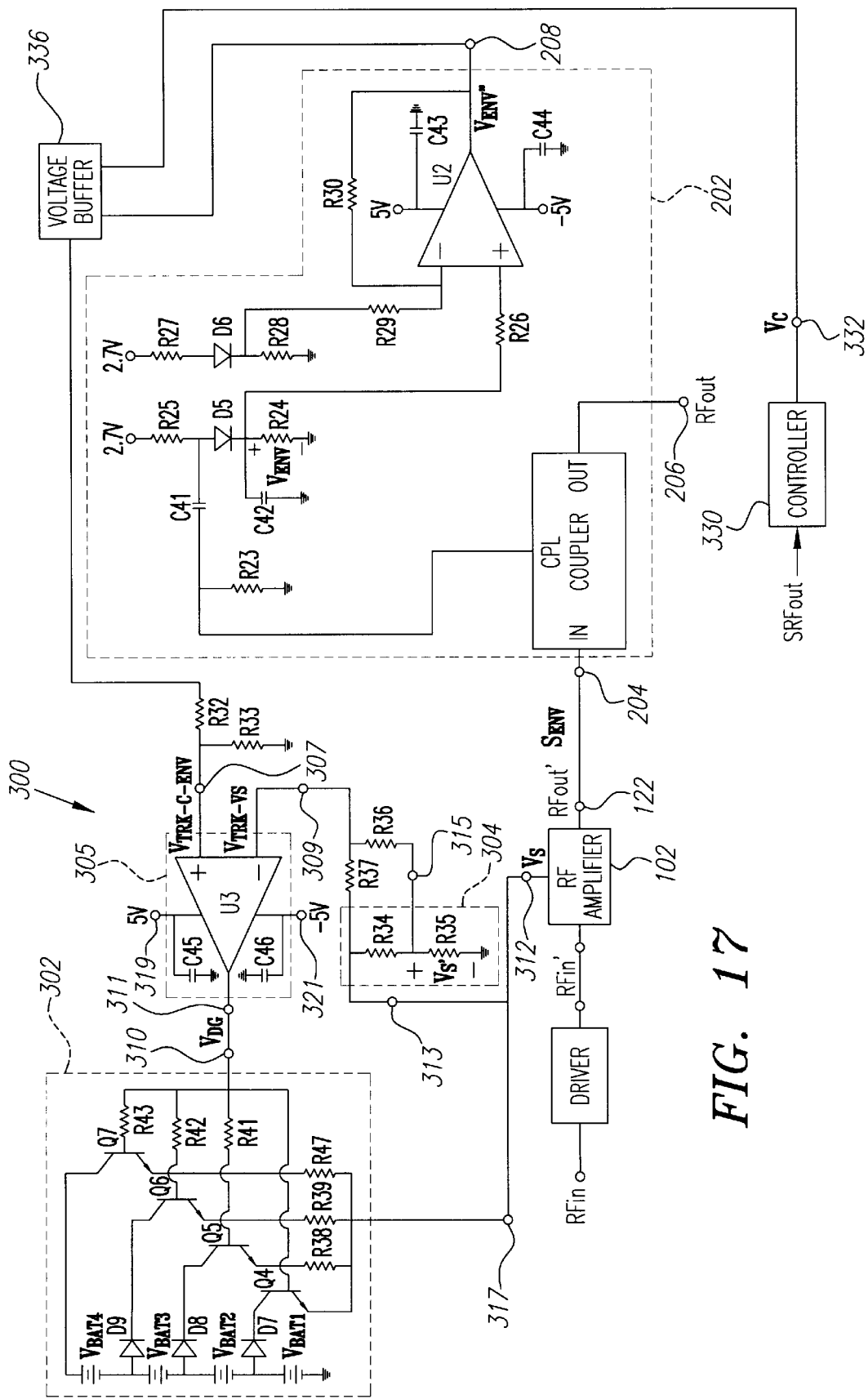
FIG. 17 is a circuit diagram of the adaptable supply voltage circuit of FIG. 15.

Particular aspects of the dynamically adaptable supply voltage circuit 300 will now be described with reference to FIG. 17. To the extent the particular aspects of the dynamically adaptable supply voltage circuit 300 are the same as those of the dynamically adaptable supply current circuit 200, the same reference numerals have been used.

The controller 330 is configured in much the same manner as the controller 60 described with respect to FIG. 7. As with the dynamically adaptable supply current circuit 200 depicted in FIG. 14, the dynamically adaptable supply voltage circuit 300 employs the envelope detector 202, which is connected to the RF output terminal 122 of the RF amplifier 102 to produce the temperature compensated sampled output envelope voltage, $V_{env}"$, on the coupling terminal 208 of the envelope detector 202. The particular aspects of the envelope detector 202 have been set forth above with respect to FIG. 14. The voltage detector 304 is a voltage divider comprising a pair of resistors R34 and R35 connected in series between the input terminal 313 of the voltage detector 304 and ground. The input terminal 313 of the voltage detector 304 is connected to ground through the resistors R34 and R35. The output terminal 315 of the voltage detector 304 is connected to ground through the resistor R35.

The signal processor 305 is a differential amplifier that embodies the subtractor 306 and the amplifier 308. The signal processor 305 includes as its platform a differential operational amplifier U3. The first input terminal 307 of the signal processor 305 is connected to the noninverting input terminal of the differential operational amplifier U1. The second input terminal 309 of the signal processor 308 is connected to the inverting input terminal of the differential operational amplifier U1. The output terminal of the operational amplifier U1 is connected to the output terminal 311 of the signal processor 305.

The signal processor 305 further includes positive and negative power terminals 319 and 321 that are respectively connected to the positive and negative power terminals of the differential operational amplifier U3. The positive power terminal 319 of the signal processor 319 is connected to the 5 volt DC bias. Alternatively, the positive power terminal 319 of the signal processor 305 can be connected to the 2.7 volt DC bias. The negative power terminal 321 of the signal processor 305 is connected to the −5 volt DC bias. The decoupling capacitors C45 and C46 are respectively connected between the 5 volt DC bias and ground, and the −5 volt DC bias and ground.

In alternative embodiments, the signal processor 305 is an integrating amplifier.

The coupling terminal 208 of the envelope detection 202 and the output terminal 332 of the controller 330 are electrically coupled to the signal processor 305 through a voltage buffer 336 and a resistor R32. The first input terminal 307 of the signal processor 305 is grounded through a resistor R33. The values of the resistors R32 and R33 are selected to scale the temperature compensated sampled output envelope voltage, $V_{env}"$. A control and envelope tracking voltage, $V_{TRK-C-env}$, is produced across the resistor R33, and thus the noninverting input terminal of the differential operational amplifier U3. This signal is a summation of $V_C$ and $V_{env}"$.

The output terminal 315 of the voltage detector 304 is connected through a resistor R36 to the second input terminal 309 of the signal processor 305. A supply voltage tracking voltage, $V_{TRK-VS}$, is produced on the second input terminal 309 of the signal processor 305. The input terminal 313 of the voltage detector 304 is connected to the second input terminal of the signal processor 305 through a resistor R37. The voltage gain of the differential operational amplifier U3 can be varied by selecting the values of the resistors R36 and R37.

The signal processor 305 produces a dynamic biasing voltage, $V_{DB}$, on the output terminal 311 of the signal processor 305 equal to the scaled difference between the control and envelope tracking voltage, $V_{TRK-C-env}$, and the supply voltage tracking voltage, $V_{TRK-VS}$. The output terminal 311 of the signal processor 305 is connected to the control terminal 310 of the variable power supply 302. The dynamic biasing voltage, $V_{DB}$, is outputted to the control terminal 310 of the variable power supply 302.

The variable power supply 302 comprises a bank of batteries $V_{BAT1}$, $V_{BAT2}$, $V_{BAT3}$, and $V_{BAT4}$ that represent an internal source voltage of the power supply. The batteries $V_{BAT1}$, $V_{BAT2}$, $V_{BAT3}$, and $V_{BAT4}$ are connected in series to ground. The positive terminals of each of the batteries $V_{BAT1}$, $V_{BAT2}$, $V_{BAT3}$, and $V_{BAT4}$ are respectively connected to the collectors of a bank of matched NPN bipolar transistors Q4, Q5, Q6, and Q7. Schottky power diodes D7, D8, and D9 are respectively connected between the power terminals of $V_{BAT1}$, $V_{BAT2}$, and $V_{BAT3}$ and the collectors of transistors Q4, Q5, and Q6 to prevent the batteries from forward biasing the transistor base-collector junction. The emitter of the transistor Q4 is connected to the power terminal of the RF amplifier 301. The emitters of transistors Q5, Q6, and Q7 are connected to the power terminal of the RF amplifier 301 through respective resistors R38, R39, and R40. The base of the transistor Q4 is connected to the output terminal of the differential operational amplifier U3. The bases of the transistors Q5, Q6, and Q7 are connected to the output terminal of the differential operational amplifier U3 through respective resistors R41, R42, and R43. By selecting the values of the respective resistors R41, R42, and R43, the current flowing into the bases of the transistors Q5, Q6, and Q7 can be adjusted to control the switching points of the transistors Q5, Q6, and Q7. Selection of the values of the resistors R34 and R35 in the voltage detector 304 will also affect the switching points of the transistors. The values of the resistors R38, R39, and R40 are selected, so that only the resistor connected to the transistor that is on will carry a significant amount of current.

Typical resistance values that may be used for the respective resistors R38–R43 are, e.g., 0.10Ω, 0.15Ω, 0.30Ω, 1.0Ω, 2.0Ω, and 9.7Ω. A typical voltage value for each of the batteries $V_{BAT1}$, $V_{BAT2}$, $V_{BAT3}$, and $V_{BAT4}$ is, e.g., 1.2V.

The following is a description of the operation of dynamically adaptable supply voltage circuit 300. To the extent that the operative aspects of the dynamically adaptable supply voltage circuit 300 similar to those of the amplifier 200 have been described above, they will not be repeated below.

The controller 330 receives the RF power designating signal, $S_{RFOUT}$, from the input terminal 334 of the controller 60, and accordingly produces the control voltage, $V_C$, on the output terminal 332 of the controller 330. The control voltage, $V_C$, is applied to the resistor R33 through the voltage buffer 336, influencing the control and envelope tracking voltage, $V_{TRK-C-env}$. The control and envelope tracking voltage, $V_{TRK-C-env}$, varies with the control voltage, $V_C$. That is, as the control voltage, $V_C$, increases, the control and envelope tracking voltage, $V_{TRK-C-env}$, increases. Likewise, as the control voltage, $V_C$, decreases, the control and envelope tracking voltage, $V_{TRK-C-env}$, decreases. The control and envelope tracking voltage, $V_{TRK-C-env}$, indicates the desired average level of the supply voltage, $V_S$.

The envelope detector 202 samples the output envelope voltage, $V_{env}$, on the RF output terminal 122 of the RF amplifier 102, and produces the temperature compensated sampled output envelope voltage, $V_{env}''$, on the coupling terminal 208 of the envelope detector 202. The temperature compensated sampled output envelope voltage, $V_{env}''$, is applied to the resistor R33 through the voltage buffer 336, influencing the control and envelope tracking voltage, $V_{TRK-C-env}$, across the resistor R33. The control and envelope tracking voltage, $V_{TRK-C-env}$, varies with the output envelope voltage, $V_{env}$. That is, as the output envelope voltage, $V_{env}$, increases, the control and envelope tracking voltage, $V_{TRK-C-env}$, increases. Likewise, as the output envelope voltage, $V_{env}$, decreases, the control and envelope tracking voltage, $V_{TRK-C-env}$, decreases. The control and envelope tracking voltage, $V_{TRK-C-env}$, indicates the present level of the output envelope voltage, $V_{env}$, as well as the desired level of the supply voltage, $V_S$.

The variable power supply 302 produces a supply voltage, $V_S$, on the power terminal 312 of the RF amplifier 102. The supply voltage, $V_S$, is applied to the voltage detector 304, producing the sampled supply voltage, $V_S'$, across the resistor R35 of the voltage detector 304. The supply voltage, $V_S$, influences the supply voltage tracking voltage, $V_{TRK-VS}$, across the resistors R35 and R36. The supply voltage tracking voltage, $V_{TRK-VS}$, varies with the supply voltage, $V_S$. That is, as the supply voltage, $V_S$, increases, the supply voltage tracking voltage, $V_{TRK-VS}$, increases. Likewise, as the supply voltage, $V_{TRK-VS}$, decreases, the supply voltage tracking voltage, $V_{TRK-VS}$, decreases. The supply voltage tracking voltage, $V_{TRK-VS}$, indicates the present level of the supply voltage, $V_S$.

The control and envelope tracking voltage, $V_{TRK-C-env}$, is applied to the first input terminal 307 of the signal processor 305. The supply voltage tracking voltage, $V_{TRK-VS}$, is applied to the second input terminal 309 of the signal processor 305. The signal processor 305 takes the difference between the control and envelope tracking voltage, $V_{TRK-C-env}$, and the supply voltage tracking voltage, $V_{TRK-VS}$, and is scaled to produce the dynamic biasing voltage, $V_{DB}$, on the output terminal 311 of the signal processor 305. The dynamic biasing voltage, $V_{DB}$, is then fed into the control terminal 310 of the variable power supply 302, biasing the bases of the respective transistors Q4, Q5, Q6, and Q7. The resistors R41, R42, and R43 create an increasing amount of resistance between the respective bases of the transistors Q5, Q6, and Q7 and the control terminal 310 of the variable power supply 302. A decreasing amount of bias voltage is applied to the respective bases of the transistors Q4, Q5, Q6, and Q7.

As the level of the output envelope voltage, $V_{env}$, and thus the level of the dynamic biasing voltage, $V_{DB}$, increases from a relatively low level to a relatively high level, the transistors Q4, Q5, Q6, and Q7 will sequentially turn on, thus sequentially turning on the batteries $V_{BAT1}$, $V_{BAT2}$, $V_{BAT3}$, and $V_{BAT4}$. Likewise, as the level of the output envelope voltage, $V_{env}$, and thus the level of the dynamic biasing voltage, $V_{DB}$, decreases from a relatively high level to a relatively low level, the transistors Q7, Q6, Q5, and Q4 will sequentially turn off, sequentially turning off the batteries $V_{BAT4}$, $V_{BAT3}$, $V_{BAT2}$, and $V_{BAT1}$. Depending on the level of the dynamic biasing voltage, $V_{DB}$, applied to the control terminal 310 of the variable power supply 302, and based on an individual battery voltage of 1.2V, the internal source voltage produced by the bank of batteries $V_{BAT1}$, $V_{BAT2}$, $V_{BAT3}$, and $V_{BAT4}$, could be 1.2V, 2.4V, 3.6V, or 4.8V. The total voltage of the batteries vary discretely. In alternative embodiments, the total voltage of the batteries varies continuously.

The supply voltage, $V_S$, that is applied to the power terminal 312 of the RF amplifier 102 is proportional to the dynamic biasing voltage, $V_{DB}$, and thus the output envelope voltage, $V_{env}$. The supply voltage, $V_S$, will vary with the output envelope voltage, $V_{env}$. When the power level of the RF output signal, $RF_{out}$, is high, the level of the supply voltage, $V_S$, will be correspondingly high. Likewise, when the power level of the RF output signal, $RF_{out}$, is low, the level of the supply voltage, $V_S$, will be correspondingly low. In this manner, efficient linear operation of the RF amplifier 102 is ensured.

Only the minimum number of batteries $V_{BAT1}$, $V_{BAT2}$, $V_{BAT3}$, and $V_{BAT4}$ are employed to ensure that the supply voltage, $V_S$, tracks the output envelope voltage, $V_{env}$, and the dynamically adaptable supply voltage circuit 300 is more power efficient. It should be noted that the corresponding number of batteries and transistors can vary depending on the amount of efficiency required of the dynamically adaptable supply voltage circuit 300. In general, the smaller the battery voltage step, the more power efficient the dynamically adaptable supply voltage circuit 300 becomes. The bandwidth of the feedback control loop 303 is preferably greater than the maximum frequency of the RF signal envelope to allow the switching capability of the variable power supply 302 to properly track the output envelope voltage, $V_{env}$.

Co-pending application Ser. No. 09/080,773, which is directed to a dynamically adaptable supply voltage circuit, is filed concurrently herewith and fully incorporated herein by reference.

Figure 18:
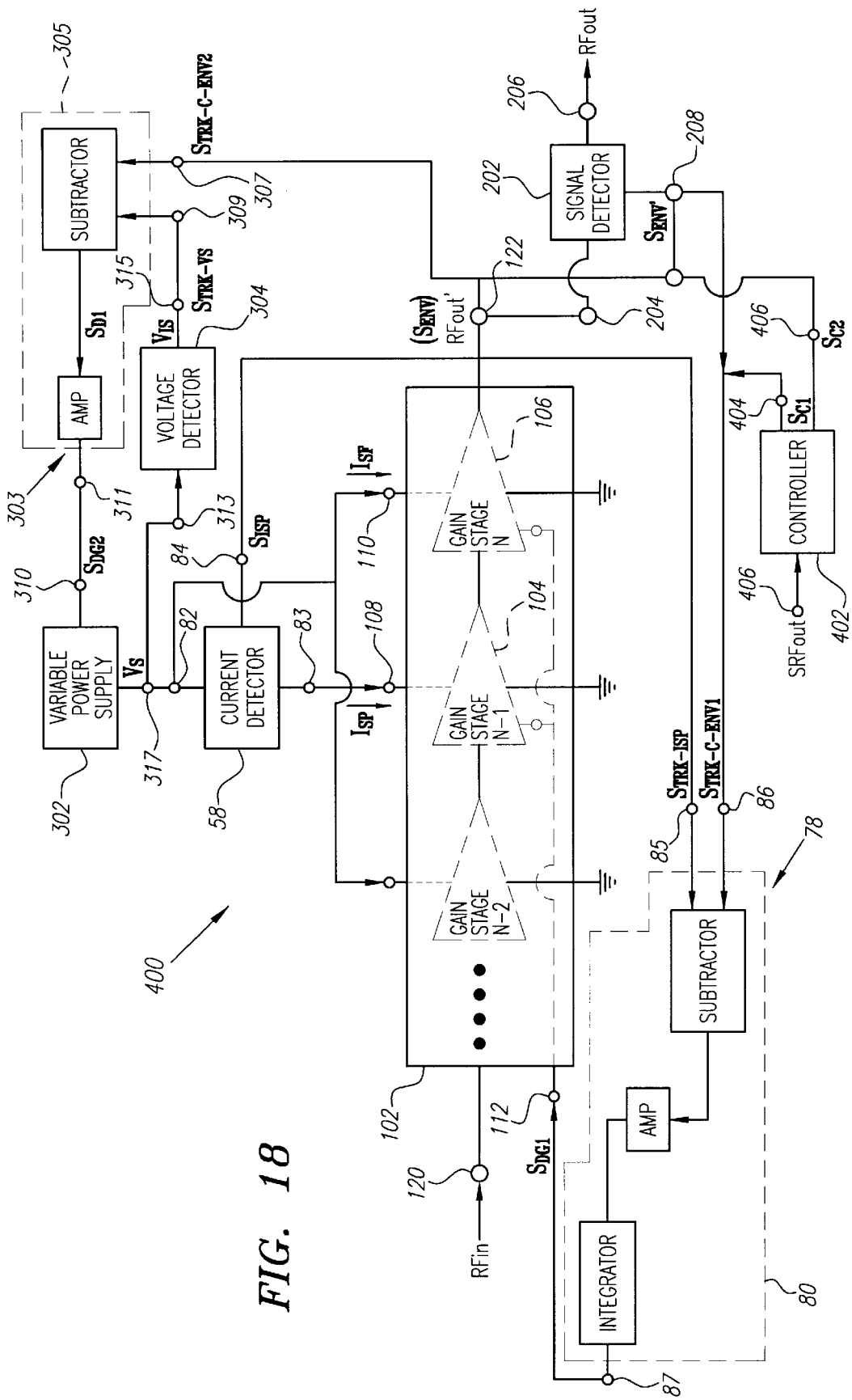
FIG. 18 is a block diagram of a dynamically adaptable supply current and voltage circuit.

The supply voltage, $V_S$, varying capability of the dynamically adaptable supply voltage circuit 300 can be combined with the supply current, $I_S$, varying capability of the dynamically adaptable supply current circuit 200 to form a dynamically adaptable supply current and voltage circuit 400 as generally depicted in FIG. 18. To the extent the components of the dynamically adaptable supply current and voltage circuit 400 are the same as those of the dynamically adaptable supply current circuit 200 and dynamically adaptable supply voltage circuit 300 respectively depicted in FIGS. 11 and 15, the same reference numerals have been used.

The dynamically adaptable supply current and voltage circuit 400 employs the feedback control loop 78 of the dynamically adaptable supply current circuit 200 to vary the supply current, $I_{SP}$ and $I_{SF}$, in the respective preceding gain stage 104 and final gain stage 106 of the RF amplifier 102.

The output terminal 317 of the variable power supply 302 is connected to the power terminal 110 of the final gain stage 106 of the RF amplifier 102 producing the supply current, $I_{SF}$, in the final gain stage 106, and the supply voltage, $V_S$, on the power terminal 110 of the final gain stage 106. The input terminal 82 of the current detector 58 is connected to the output terminal 317 of the variable power supply 302, and the output terminal 83 of the current detector 58 is connected to the power terminal 108 of the preceding gain stage 104, producing the supply current, $I_{SP}$, in the preceding gain stage 104 of the RF amplifier 102. The coupling terminal 84 of the current detector 58 is connected to the first input terminal 85 of the signal processor 80. The current detector 58 produces the sampled supply current signal, $S_{ISP}$, on the coupling terminal 84 of the current detector 58, influencing the supply current tracking signal, $S_{TRK-ISP}$, on the first input terminal 85 of the signal processor 80.

A controller 402 similar to the controllers 60 and 330 described above, produces a control signal, $S_{C1}$, on an output terminal 404 of the controller 400 in accordance with an RF power indicating signal, $SR_{OUT}$, applied on an input terminal 408 of the controller 402, influencing a control and envelope tracking signal, $S_{TRK-C-env1}$, on the second input terminal 86 of the signal processor 80.

The input terminal 204 of the signal detector 202 is connected to the RF output terminal 122 of the RF amplifier 102 producing the RF output signal, $RF_{out}$, on the output terminal 206 of the signal detector 202. The coupling terminal 208 of the signal detector 202 is connected to the second input terminal 86 of the signal processor 80. The signal detector 202 produces the sampled output envelope signal, $S_{env}'$, on the coupling terminal 208 of the signal detector 202, influencing the control and envelope tracking signal, $S_{TRK-C-env}$, on the second input terminal 86 of the signal processor 80. The output terminal 61 of the controller 60 is connected to the second input terminal 86 of the signal processor 80.

The signal processor 80 determines, scales, and integrates the difference between the control and envelope tracking signal, $S_{TRK-C-env1}$, and the supply current tracking signal, $S_{TRK-ISP}$, to produce a dynamic gate biasing signal, $S_{DG1}$, on the output terminal 87 of the signal processor 80. The output terminal 87 of the signal processor 80 is connected to the control terminal 112 of the RF amplifier 102, producing the dynamic gate biasing signal, $S_{DG1}$, on the control terminal 112 of the RF amplifier 102. The supply currents, $I_{SP}$ and $I_{SF}$, are set to a desired level by the controller 402 and vary from that level with the output envelope signal, $S_{env}$.

The dynamically adaptable supply current and voltage circuit 400 also employs the variable power supply 302 and feedback control loop 303 of the dynamically adaptable supply voltage circuit 300 to vary the supply voltage, $V_S$.

The input terminal 313 of the voltage detector 304 is connected to the output terminal 317 of the variable power supply 302 and the output terminal 315 of the voltage detector 304 is connected to the second input terminal 309 of the signal processor 305. The voltage detector 304 produces the sampled supply voltage signal, $S_{VS}$, on the output terminal 315 of the voltage detector 304, influencing the supply voltage tracking signal, $S_{TRK-VS}$, on the second input terminal 309 of the signal processor 305.

The controller 402 produces a control signal, $S_{C2}$, on an output terminal 406 of the controller 400 in accordance with the RF power indicating signal, $S_{RFOUT}$, applied on the input terminal 408 of the controller 402, influencing a control and envelope tracking signal, $S_{TRK-C-env2}$, on the first input terminal 307 of the signal processor 305.

The coupling terminal 208 of the signal detector 202 is also connected to the first input terminal 307 of the signal processor 305, influencing the control and envelope tracking signal, $S_{TRK-C-env2}$, on the first input terminal 307 of the signal processor 305.

The signal processor 305 determines and scales the difference between the control and envelope tracking signal, $S_{TRK-C-env2}$, and the supply voltage tracking signal, $S_{TRK-VS}$, to produce a dynamic gate biasing signal, $S_{DG2}$, on the output terminal 311 of the signal processor 305. The output terminal 311 of the signal processor 305 is connected to the control terminal 310 of the variable power supply 302. The dynamic gate biasing signal, $S_{DG2}$, is produced on the control terminal 310 of the variable power supply 302. The supply voltage, $V_S$, is set to a desired level by the controller 402 and varies from that level with the output envelope signal, $S_{env}$.

Operation of the dynamically adaptable supply current and voltage circuit 400 is similar to that of the dynamically adaptable supply current circuit 200 and dynamically adaptable supply voltage circuit 300. The supply currents, $I_{SP}$ and $I_{SF}$, and the supply voltage, $V_S$, can be independently controlled by the respective control loops 78 and 303.

With respect to the adaptable supply current circuit 100, dynamically adaptable supply current circuit 200, dynamically adaptable supply voltage circuit 300, and the dynamically adaptable supply current and voltage circuit 400, variation of the RF amplifier supply current and/or the supply voltage creates a phase shift in the RF output signal, $RF_{out}$, at the output of the RF amplifier, which manifests itself as phase distortion in phase modulated signals. To compensate for this phase distortion, the phase distortion of the RF output signal, $RF_{out}$, can be determined and compensated for by altering (i.e., predistorting) the RF signal prior to its arrival at the RF amplifier.

Figure 19:
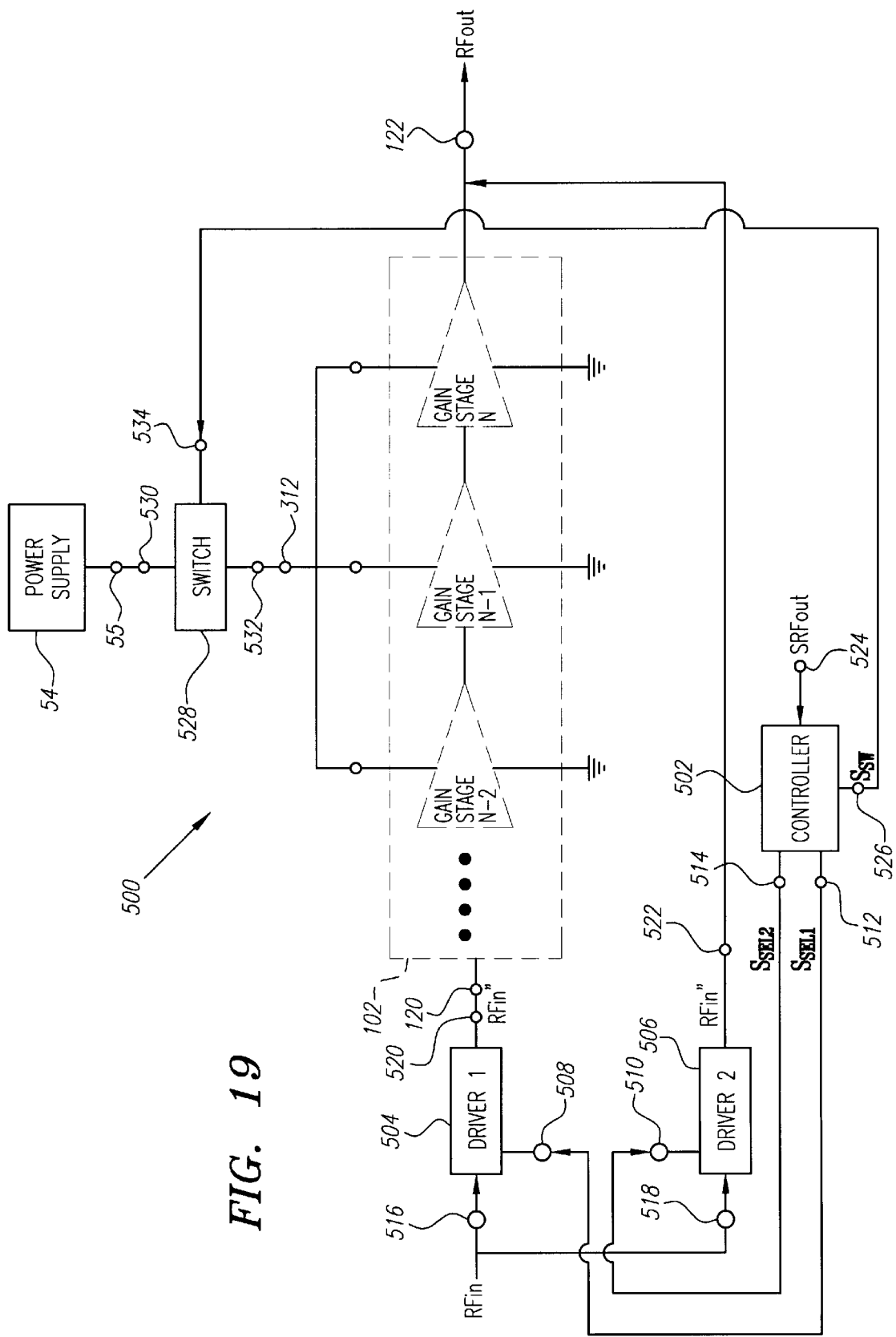
FIG. 19 is a block diagram of a bypassable circuit.

As shown in FIG. 19, a bypassable circuit 500 is employed to operate an RF amplifier more efficiently and linearly by operating the RF amplifier only during a high RF output power condition, i.e., a condition wherein the RF amplifier is employed to produce a relatively high RF output signal power, $P_{out}$, and bypassing the RF amplifier during a low RF output power condition, i.e., a condition wherein the RF amplifier is bypassed to produce a relatively low RF output signal power, $P_{out}$. To the extent that the bypassable circuit 500 employs components that are similar to those of previous embodiments, the same reference numerals have been used.

The bypassable circuit 500 includes a first driver 504 and a second driver 506, which act as pre-amplification means.

An RF input signal, $RF_{in}$, is fed into an RF input terminal 516 of the first driver 504 and an RF input terminal 518 of the second driver 506. The first driver 504 includes an output terminal 520 connected to the RF input terminal 120 of the RF amplifier 102. The second driver 506 includes an output terminal 522 connected to the RF output terminal 122 of the RF amplifier 102. The particular aspects of the drivers 504 and 506 are in accordance with typical known drivers.

The bypassable circuit 500 further includes a controller 502. The controller 502 includes an input terminal 524 into which a RF power designating signal, $S_{RFOUT}$, indicating the existence of a high RF output power condition or a low RF output power condition, is input. The controller 502 includes a first output terminal 512 and a second output terminal 514. The first output terminal 512 of the controller 502 is connected to a control terminal 508 of the first driver 504, and the second output terminal 514 of the controller 502 is connected to a control terminal 510 of the second driver 506.

A switch 528 is connected between the power supply 54 and the RF amplifier 102. The switch 528 includes an input terminal 530 connected to the output terminal 55 of the power supply 54, and an output terminal 532 connected to the power terminal 312 of the RF amplifier 102. The switch 528 includes a control terminal 534 that allows the switch 528 to alternately open and close. The control terminal 534 of the switch 528 is connected to a third output terminal 526 of the controller 502.

The following is a description of the operation of the bypassable circuit 500. The handset or WLL terminal receives the RF power designating signal, $S_{RFOUT}$, through the input terminal 524 of the controller 502. During a high RF output power condition designated by the RF power designating signal, $S_{RFOUT}$, the controller 502 produces a high select signal, $S_{SEL1}$, on the first output terminal 512 of the controller 502, and a low select signal, $S_{SEL2}$, on the second output terminal 514 of the controller 502. The high select signal, $S_{SEL1}$, is applied to the control terminal 508 of the first driver 504 to activate the first driver 504. The low select signal, $S_{SEL2}$, is applied to the control terminal 510 of the second driver 506 to inactivate the second driver 506. The controller 502 also produces a high switch signal, $S_{SW}$, on the third output terminal 526 of the controller 502. The high switch signal, $S_{SW}$, is applied to the control terminal 534 of the switch 528, closing the switch 528 and providing the flow of power from the power supply 54 to the RF amplifier 102.

The first driver 504 amplifies the RF input signal, $RF_{in}$, and produces an RF signal, $RF_{in}"$, on the RF output terminal 520 of the first driver 504. The RF signal, $RF_{in}"$, is applied to the RF input terminal 120 of the RF amplifier 102. The RF amplifier 102 amplifies the RF signal, $RF_{in}"$, and produces an RF output signal, $RF_{out}$, on the RF output terminal 122 of the RF amplifier 102 that is effectively amplified by the first driver 504 and the RF amplifier 102.

During a low RF output power condition designated by the RF power designating signal, $S_{RFOUT}$, the controller 502 produces a high select signal, $S_{SEL2}$, on the second output terminal 514 of the controller 502, and a low select signal, $S_{SEL1}$, on the first output terminal 512 of the controller 502. The high select signal, $S_{SEL2}$, is applied to the control terminal 510 of the second driver 506 to activate the second driver 506. The low select signal, $S_{SEL1}$, is applied to the control terminal 508 of the first driver 504 to inactivate the first driver 504. The controller 502 also produces a low switch signal, $S_{SW}$, on the third output terminal 526 of the controller 502. The low switch signal, $S_{SW}$, is applied to the control terminal 534 of the switch 528, opening the switch 528 and impeding the flow of power from the power supply 54 to the RF amplifier 102.

The second driver 506 amplifies the RF input signal, $RF_{in}$, and produces the RF signal, $RF_{in}"$, on the RF output terminal 520 of the first driver 504. The RF signal, $RF_{in}"$, is applied to the RF output terminal 122 of the RF amplifier 102, producing an RF output signal, $RF_{out}$, that is amplified solely by the second driver 506.

Alternatively, the controller 502, the respective drivers 504 and 506, and the switch 528 can be configured so that the respective drivers 504 and 506 are activated by low select signals, $S_{SEL1}$ and $S_{SEL2}$, rather than high select signals, $S_{SEL1}$ and $S_{SEL2}$, and the switch 528 is closed by a low switch signal, $S_{SW}$, rather than a high switch signal, $S_{SW}$.

More alternatively, the controller 502 and the respective drivers 504 and 506 can be configured so that the respective drivers 504 and 506 are activated or inactivated by a single select signal, $S_{SEL}$, produced on a single control terminal of the controller 502. In this case, a component such as an inverter can be placed between the single control terminal of the controller 502 and one of the respective control terminals of the drivers 504 and 506. If the inverter is placed between the signal control terminal of the controller 502 and the control terminal 510 of the second driver 506, a high select signal, $S_{SEL}$, produced on the single control terminal of the controller 502 produces a high select signal, $S_{SEL}$, on the control terminal 508 of the first driver 504, activating the first driver 504, and produces a low select signal, $S_{SEL}$, on the control terminal 510 of the second driver 506, inactivating the second driver 506. Contrariwise, a low select signal, $S_{SEL}$, produced on the single control terminal of the controller 502 produces a high select signal, $S_{SEL}$, on the control terminal 510 of the second driver 506, activating the second driver 506, and produces a low select signal, $S_{SEL}$, on the control terminal 508 of the first driver 504, inactivating the first driver 504.

The RF amplifier 102 is only operated when a high power RF output signal, $RF_{out}$, is required, conserving energy expended by the bypassable circuit 500 when a low power RF output signal, $RF_{in}$, is required.

Figure 20:
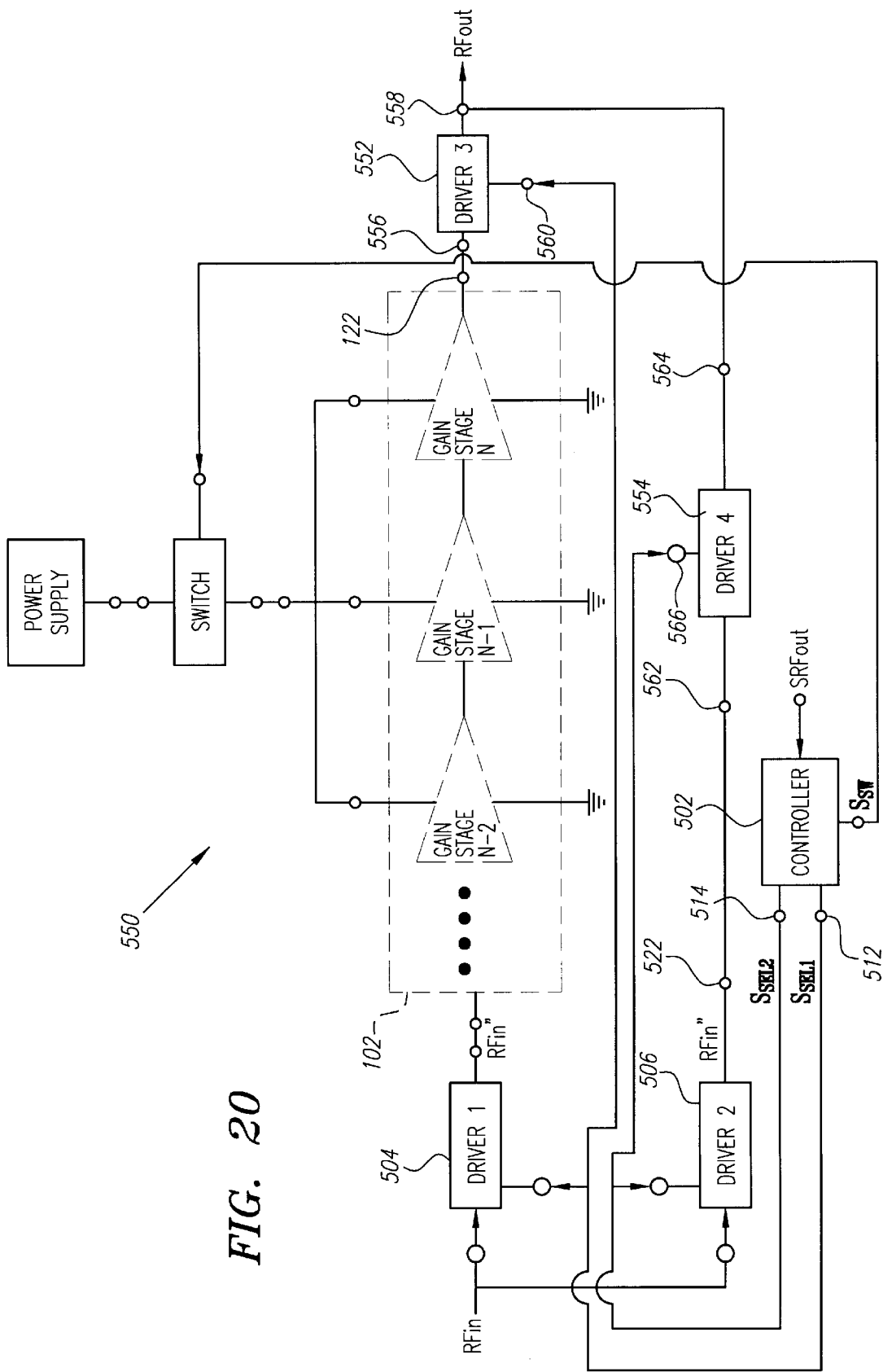
FIG. 20 is a block diagram of an alternative embodiment of a bypassable circuit.

FIG. 20 shows a bypassable circuit 550. The bypassable circuit 550 is similar to the bypassable circuit 500 shown in FIG. 19, and to the extent the components of each are the same, the same reference numerals have been used. The bypassable circuit 550 differs from the bypassable circuit 500 in that a third driver 552 and a fourth driver 554 are employed to provide an RF output signal, $RF_{out}$, with a higher power level than that of the RF output signal, $RF_{out}$, produced by the bypassable circuit 500.

The third driver 552 includes an input terminal 556 connected to the output terminal 122 of the RF amplifier. The third driver 552 further includes a control terminal 560 connected to the first output terminal 512 of the controller 502. The fourth driver 554 includes an input terminal 562 connected to the output terminal 522 of the second driver 506 and an output terminal 564 connected to an output terminal 558 of the third driver 552. The fourth driver 554 further includes a control terminal 566 connected to the second output terminal 514 of the controller 502.

The operation of the bypassable circuit 550 is similar to that of the bypassable circuit 500 with the exception that during a high RF output power condition, a high select signal, $S_{SEL1}$, is produced on the first output terminal 512 of the controller 502 activating the third driver 552 as well as the first driver 504, and a low select signal, $S_{SEL2}$, is produced on the second output terminal 514 of the controller 502 inactivating the fourth driver 554 as well as the second driver 506. An RF output signal, $RF_{out}$, is produced on the output terminal 558 of the third driver 552 that has been amplified by the first driver 504, the RF amplifier 102, and the third driver 552. Contrariwise, during a low RF output power condition, a high select signal, $S_{SEL2}$, is produced on the second output terminal 514 of the controller 502 activating the fourth driver 554 as well as the second driver 506, and a low select signal, $S_{SEL1}$, is produced on the first output terminal 512 of the controller 502 inactivating the third driver 552 as well as the first driver 504. An RF output signal, $RF_{out}$, is produced on the output terminal 558 of the third driver 552 that has been amplified solely by the second driver 506 and the fourth driver 556.

Co-pending application Ser. No. 09/080,812, which is directed to a bypassable circuit, is filed concurrently herewith and fully incorporated herein by reference.

The bypassable circuit 500 or bypassable circuit 550 can be employed to make the amplifier circuits 100, 200, 300, or 400 respectively depicted in FIGS. 6, 11, 15, and 18 more power efficient.

Figure 21:
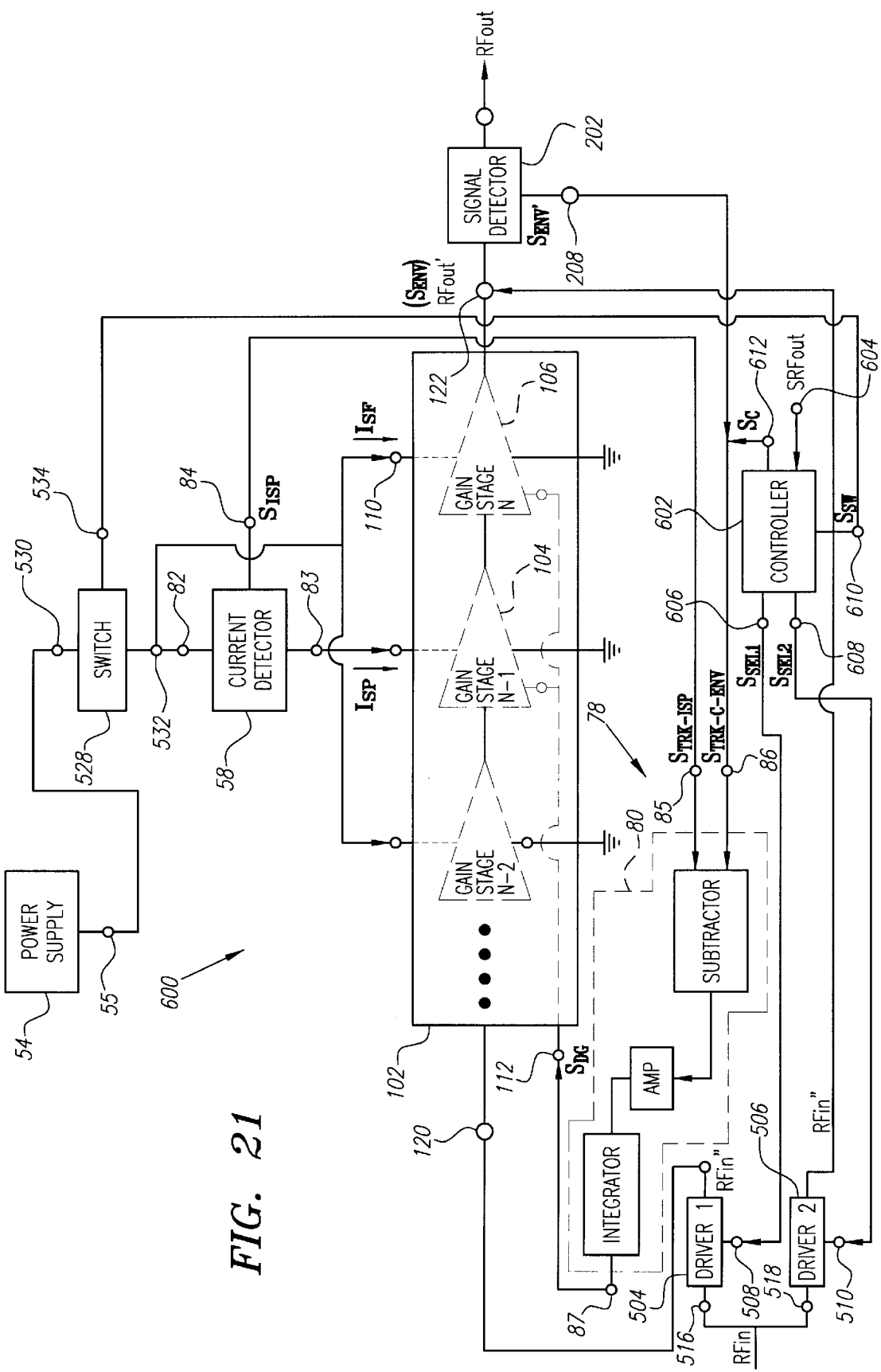
FIG. 21 is a block diagram of a bypassable dynamically adaptable supply current circuit.

For instance, as depicted in FIG. 21, a switchable and dynamically adaptable supply current circuit 600 employs the bypassable circuit 500 as configured in FIG. 19, and the feedback control loop 78 as configured in FIG. 6 to operate the RF amplifier 102 during a high RF output power condition more efficiently and linearly by controlling the supply currents, $I_{SP}$ and $I_{SF}$, within the respective preceding stage 104 and final stage 106 of the RF amplifier 102, while bypassing the RF amplifier 102 during a low RF output power condition.

The switchable and dynamically adaptable supply current circuit 600 includes a controller 602. The controller 602 includes an input terminal 604 into which an RF power designating signal, $S_{RFOUT}$, in input. The RF power designating signal, $S_{RFOUT}$, indicates the existence of a high RF output power condition or a low RF output power condition, as well as the desired average RF output signal power, $P_{out}$, and thus, the desired supply current, $I_S$. The controller 602 includes a first output terminal 606 and a second output terminal 608. The first output terminal 606 of the controller 602 is connected to the control terminal 508 of the first driver 504, and the second output terminal 608 of the controller 602 is connected to the control terminal 510 of the second driver 506.

The switch 528 is connected between the power supply 54 and the current detector 58 of the control feedback loop 78. The input terminal 530 of the switch 54 is connected to the output terminal 55 of the power supply 54, and the output terminal 532 of the switch 528 is connected to the input terminal 82 of the current detector 58. The output terminal 532 of the switch 528 is also connected to the power terminal 110 of the final gain stage 106 of the RF amplifier 102. The control terminal 534 of the switch 528 is connected to a third output terminal 610 of the controller 602.

During a high RF output power condition, the controller 602 produces a high select signal, $S_{SEL1}$, on the first output terminal 606 of the controller 602, and a low select signal, $S_{SEL2}$, on the second output terminal 608 of the controller 602 to activate the first driver 504 and inactivate the second driver 506. The controller 602 also produces a high switch signal, $S_{SW}$, on the third output terminal 610. The high switch signal, $S_{SW}$, is applied to the control terminal 534 of the switch 528, closing the switch 528 and providing the supply current, $I_{SP}$, in the preceding gain stage 104 of the RF amplifier 102, and the supply current, $I_{SF}$, in the final gain stage 106 of the RF amplifier 102. The RF input signal, $RF_{in}$, on the input terminal 516 of the first driver 504 is amplified through the first driver 504 and the RF amplifier 102 to produce the RF output signal, $RF_{out}$, on the output terminal 122 of the RF amplifier 102.

During a low RF output power condition, the controller 602 produces a high select signal, $S_{SEL2}$, on the second output terminal 608 of the controller 602, and a low select signal, $S_{SEL1}$, on the first output terminal 606 of the controller 602 to activate the second driver 506 and inactivate the first driver 504. The controller 602 also produces a low switch signal, $S_{SW}$, on the third output terminal 610. The low switch signal, $S_{SW}$, is applied to the control terminal 534 of the switch 528, opening the switch 528 and impeding the flow of power from the power supply 54 to the RF amplifier 102. The RF input signal, $RF_{in}$, on the input terminal 518 of the second driver 506 is amplified solely through the second driver 504 to produce the RF output signal, $RF_{out}$, on the output terminal 122 of the RF amplifier 102, effectively bypassing the RF amplifier 102.

During a high RF output power condition, the switchable and dynamically adaptable supply current circuit 600 employs the current detector 58, signal detector 202, and the signal processor 80 of the feedback control loop 78, along with the controller 602, to control the supply currents, $I_{SP}$ and $I_{SF}$, in the preceding gain stage 104 and final gain stage 106 of the RF amplifier 102. The controller 602 includes a fourth output terminal 612 connected to the second input terminal 86 of the signal processor 80. The controller 602 produces the control signal, $S_C$, on the fourth output terminal 612 of the controller 602, influencing the control and envelope tracking signal, $S_{TRK-C-env}$, on the second input terminal 86 of the signal processor 80. The control and envelope tracking signal, $S_{TRK-C-env}$, is also influenced by the sampled envelope output signal, $S_{env}'$, produced on the coupling terminal 208 of the signal detector 202. The supply current tracking signal, $S_{TRK-ISP}$, on the first input terminal 85 of the signal processor 80 is influenced by the sampled supply current signal, $S_{ISP}$, produced on the coupling terminal 84 of the current detector 58. The signal processor 80 determines, scales, and integrates the difference between the supply current tracking signal, $S_{TRK-ISP}$, and the control and envelope tracking signal, $S_{TRK-C-env}$, to obtain the dynamic biasing gate signal, $S_{DG}$, at the output terminal 112 of the signal processor 80. The dynamic biasing gate signal, $S_{DG}$, is applied to the control terminal 112 of the RF amplifier 102, controlling the supply current, $I_{SF}$, in the final gain stage 106 of the RF amplifier 102.

Figure 22:
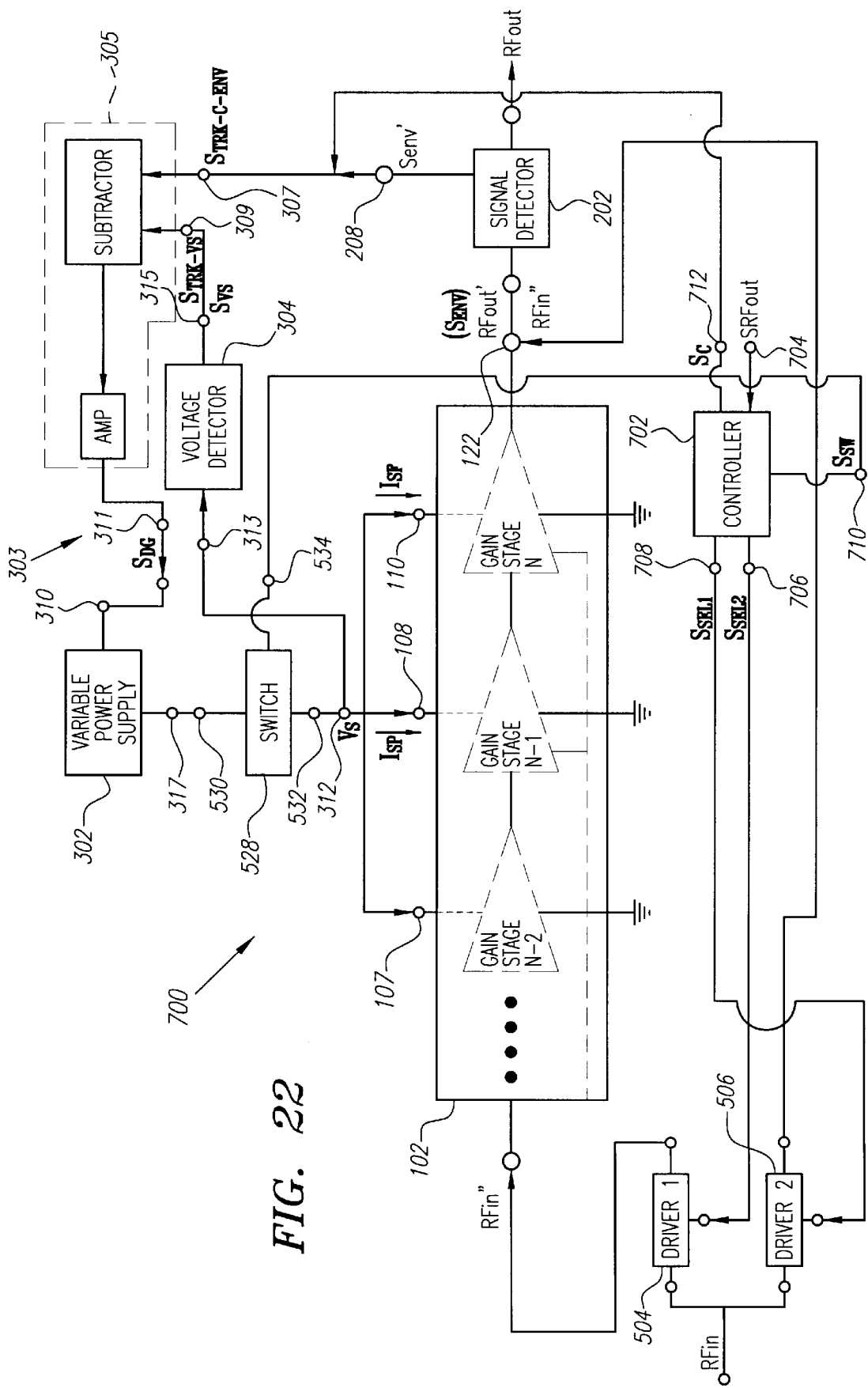
FIG. 22 is a block diagram of a bypassable dynamically adaptable supply voltage circuit.

As depicted in FIG. 22, a switchable and dynamically adaptable supply voltage circuit 700 employs the bypassable circuit 500 as configured in FIG. 19, and the feedback control loop 303 as configured in FIG. 15 to operate the RF amplifier 102 during a high RF output power condition more efficiently and linearly by controlling the supply voltage, $V_S$, across the RF amplifier 120, while allowing the RF amplifier 102 to be bypassed during a low RF output power condition.

The switchable and dynamically adaptable supply voltage circuit 700 includes a controller 702. The controller 702 includes an input terminal 704 into which an RF power designating signal, $S_{RFOUT}$, in input. The RF power designating signal, $S_{RFOUT}$, indicates the existence of a high RF output power condition or a low RF output power condition, as well as the desired average RF output signal power, $P_{out}$, and thus, the desired supply voltage, $V_S$. The controller 702 includes a first output terminal 706 and a second output terminal 708. The first output terminal 706 of the controller 702 is connected to the control terminal 508 of the first driver 504, and the second output terminal 708 of the controller 702 is connected to the control terminal 510 of the second driver 506.

The switch 528 is connected between the variable power supply 302 and the RF amplifier 102. The input terminal 530 of the switch 528 is connected to the output terminal 317 of the variable power supply 302, and the output terminal 532 of the switch 528 is connected to the power terminal 312 of the RF amplifier 102. The control terminal 534 of the switch 528 is connected to a third output terminal 710 of the controller 702.

During a high RF output power condition, the controller 702 produces a high select signal, $S_{SEL1}$, on the first output terminal 706 of the controller 702, and a low select signal, $S_{SEL2}$, on the second output terminal 708 of the controller 702 to activate the first driver 504 and inactivate the second driver 506. The controller 702 also produces a high switch signal, $S_{SW}$, on the third output terminal 710. The high switch signal, $S_{SW}$, is applied to the control terminal 534 of the switch 528, closing the switch 528 and providing the supply voltage, $V_S$, on the power terminal 312 of the RF amplifier 102. The RF input signal, $RF_{in}$, on the input terminal 516 of the first driver 504 is amplified through the first driver 504 and the RF amplifier 102 to produce the RF output signal, $RF_{out}$, on the output terminal 122 of the RF amplifier 102.

During a low RF output power condition, the controller 702 produces a high select signal, $S_{SEL2}$, on the second output terminal 708 of the controller 702, and a low select signal, $S_{SEL1}$, on the first output terminal 706 of the controller 702 to activate the second driver 506 and inactivate the first driver 504. The controller 702 also produces a low switch signal, $S_{SW}$, on the third output terminal 710. The low switch signal, $S_{SW}$, is applied to the control terminal 534 of the switch 528, opening the switch 528 and impeding the flow of power from the power supply 54 to the RF amplifier 102. The RF input signal, $RF_{in}$, on the input terminal 518 of the second driver 506 is amplified solely through the second driver 504 to produce the RF output signal, $RF_{out}$, on the output terminal 122 of the RF amplifier 102, effectively bypassing the RF amplifier 102.

During a high RF output power condition, the switchable and dynamically adaptable supply current circuit 700 employs the signal detector 202, voltage detector 304, and signal processor 305 of the feedback control loop 303, along with the controller 702, to control the supply voltage, $V_S$, on the power terminal 312 of the RF amplifier 102. The controller 702 includes a fourth output terminal 712 connected to the first input terminal 307 of the signal processor 305. The controller 702 produces the control signal, $S_C$, on the fourth output terminal 712 of the controller 602, influencing the control and envelope tracking signal, $S_{TRK-C-env}$, on the first input terminal 307 of the signal processor 80. The control and envelope tracking signal, $S_{TRK-C-env}$, is also influenced by the sampled envelope output signal, $S_{env}'$, produced on the coupling terminal 208 of the signal detector 202. The supply voltage tracking signal, $S_{TRK-VS}$, on the second input terminal 309 of the signal processor 305 is influenced by the sampled supply voltage signal, $S_{VS}$, produced on the output terminal 315 of the voltage detector 304. The signal processor 305 determines and scales, and alternatively integrates, the difference between the control and envelope tracking signal, $S_{TRK-C-env}$, and the supply voltage tracking signal, $S_{TRK-VS}$, to obtain the dynamic gate biasing signal, $S_{DG}$, at the output terminal 311 of the signal processor 305. The dynamic gate biasing signal, $S_{DG}$, is applied to the control terminal 310 of the variable power supply 302, controlling the supply voltage, $V_S$, on the power terminal 312 of the RF amplifier 102.

Figure 23:
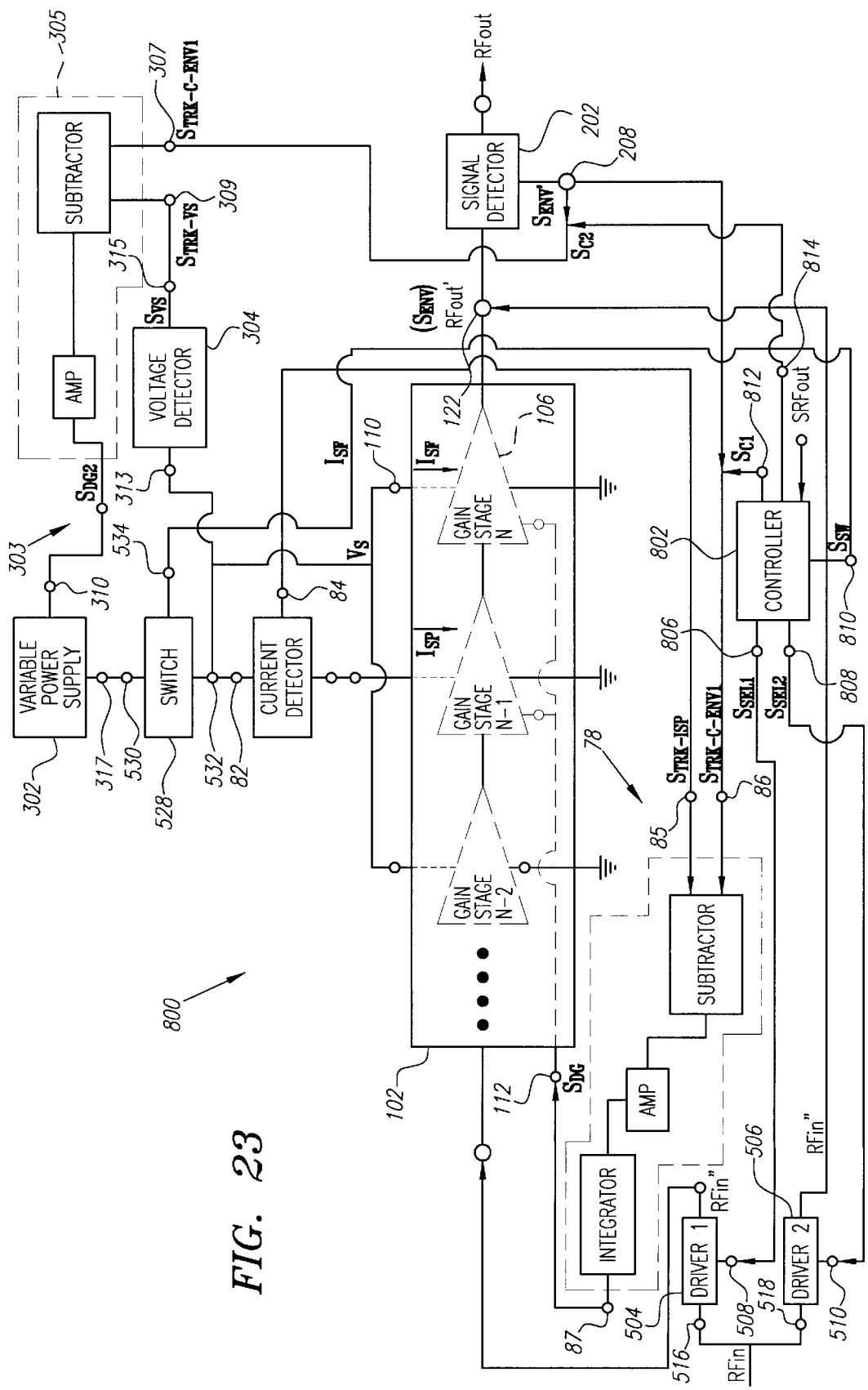
FIG. 23 is a block diagram of a bypassable dynamically adaptable supply current and voltage circuit.

As depicted in FIG. 23, a switchable and dynamically adaptable supply current and voltage circuit 800 employs the bypassable circuit 500 as configured in FIG. 19, the feedback control loop 78 as depicted in FIG. 6, and the feedback control loop 303 as configured in FIG. 15 to operate the RF amplifier 102 during a high RF output power condition more efficiently and linearly by controlling the supply currents, $I_{SP}$ and $I_{SF}$, within the preceding gain stage 104 and final gain stage 106 of the RF amplifier 102 and the supply voltage, $V_S$, across the RF amplifier 102, while allowing the RF amplifier 102 to be bypassed during a low RF output power condition.

The switchable and dynamically adaptable supply current and voltage circuit 800 includes a controller 802. The controller 802 includes an input terminal 804 into which an RF power designating signal, $S_{RFOUT}$, in input. The RF power designating signal, $S_{RFOUT}$, indicates the existence of a high RF output power condition or a low RF output power condition, as well as the desired average RF output signal power, $P_{out}$, and thus, the desired supply current, $I_S$, and supply voltage, $V_S$. The controller 802 includes a first output terminal 806 and a second output terminal 808. The first output terminal 806 of the controller 802 is connected to the control terminal 508 of the first driver 504, and the second output terminal 708 of the controller 702 is connected to the control terminal 510 of the second driver 506.

The switch 528 is connected between the variable power supply 54 and the current detector 58 of the control feedback loop 78. The input terminal 530 of the switch 54 is connected to the output terminal 317 of the variable power supply 302, and the output terminal 532 of the switch 528 is connected to the input terminal 82 of the current detector 58. The output terminal 532 of the switch 528 is also connected to the power terminal 110 of the final gain stage 106 of the RF amplifier 102. The control terminal 534 of the switch 528 is connected to a third output terminal 810 of the controller 802.

During a high RF output power condition, the controller 802 produces a high select signal, $S_{SEL1}$, on the first output terminal 806 of the controller 802, and a low select signal, $S_{SEL2}$, on the second output terminal 808 of the controller 802 to activate the first driver 504 and inactivate the second driver 506. The controller 802 also produces a high switch signal, $S_{SW}$, on the third output terminal 810. The high switch signal, $S_{SW}$, is applied to the control terminal 534 of the switch 528, closing the switch 528 and providing the supply current, $I_{SP}$, in the preceding gain stage 104 of the RF amplifier 102, the supply current, $I_{SF}$, in the final gain stage 106 of the RF amplifier 102, and the supply voltage, $V_S$, on the power terminal 110 of the final gain stage 106 of the RF amplifier 102. The RF input signal, $RF_{in}$, on the input terminal 516 of the first driver 504 is amplified through the first driver 504 and the RF amplifier 102 to produce the RF output signal, $RF_{out}$, on the output terminal 122 of the RF amplifier 102.

During a low RF output power condition, the controller 802 produces a high select signal, $S_{SEL2}$, on the second output terminal 808 of the controller 802, and a low select signal, $S_{SEL1}$, on the first output terminal 806 of the controller 802 to activate the second driver 506 and inactivate the first driver 504. The controller 802 also produces a low switch signal, $S_{SW}$, on the third output terminal 810. The low switch signal, $S_{SW}$, is applied to the control terminal 534 of the switch 528, opening the switch 528 and impeding the flow of power from the power supply 54 to the RF amplifier 102. The RF input signal, $RF_{in}$, on the input terminal 518 of the second driver 506 is amplified solely through the second driver 504 to produce the RF output signal, $RF_{out}$, on the output terminal 122 of the RF amplifier 102, effectively bypassing the RF amplifier 102.

During a high RF output power condition, the switchable and dynamically adaptable supply current and voltage circuit 800 employs the current detector 58, the signal detector 202, and the signal processor 80 of the feedback control loop 78, along with the controller 802 to control the supply current, $I_{SF}$, in the final gain stage 106 of the RF amplifier 102. The controller 602 includes a fourth output terminal 812 connected to the second input terminal 86 of the signal processor 80. The controller 602 produces a control signal, $S_{C1}$, on the fourth output terminal 612 of the controller 602, influencing the control and envelope tracking signal, $S_{TRK-C-env}$, on the second input terminal 86 of the signal processor 80. The control and envelope tracking signal, $S_{TRK-C-env}$, is also influenced by the sampled envelope output signal, $S_{env}'$, produced on the coupling terminal 208 of the signal detector 202. The supply current tracking signal, $S_{TRK-ISP}$, on the first input terminal 85 of the signal processor 80 is influenced by the sampled supply current signal, $S_{ISP}$, produced on the coupling terminal 84 of the current detector 58. The signal processor 80 determines, scales, and integrates the difference between the supply current tracking signal, $S_{TRK-ISP}$, and the control and envelope tracking signal, $S_{TRK-C-env1}$, to obtain the dynamic biasing gate signal, $S_{DG1}$, at the output terminal 112 of the signal processor 80. The dynamic biasing gate signal, $S_{DG1}$, is applied to the control terminal 112 of the RF amplifier 102, controlling the supply currents, $I_{SP}$ and $I_{SF}$, in the preceding gain stage 104 and final gain stage 106 of the RF amplifier 102.

During a high RF output power condition, the switchable and dynamically adaptable supply current and voltage circuit 800 also employs the signal detector 202, voltage detector 304, and signal processor 305 of the feedback control loop 303, along with the controller 802, to control the supply voltage, $V_S$, on the power terminal of the RF amplifier 102. The controller 802 includes a fifth output terminal 814 connected to the first input terminal 307 of the signal processor 305. The controller 802 produces the control signal, $S_{C2}$, on the fifth output terminal 814 of the controller 802, influencing the control and envelope tracking signal, $S_{TRK-C-env2}$, on the first input terminal 307 of the signal processor 80. The control and envelope tracking signal, $S_{TRK-C-env2}$, is also influenced by the sampled envelope output signal, $S_{env}'$, produced on the coupling terminal 208 of the signal detector 202. The signal processor 305 determines, scales, and in alternative embodiments integrates, the difference between the control and envelope tracking signal, $S_{TRK-C-env2}$, and the supply voltage tracking signal, $S_{TRK-VS}$, to obtain the dynamic gate biasing signal, $S_{DG2}$, at the output terminal 311 of the signal processor 305. The dynamic gate biasing signal, $S_{DG2}$, is applied to the control terminal 310 of the variable power supply 302, controlling the supply voltage, $V_S$, on the power terminal 110 of the final gain stage 106 of the RF amplifier 102.

Figure 24:
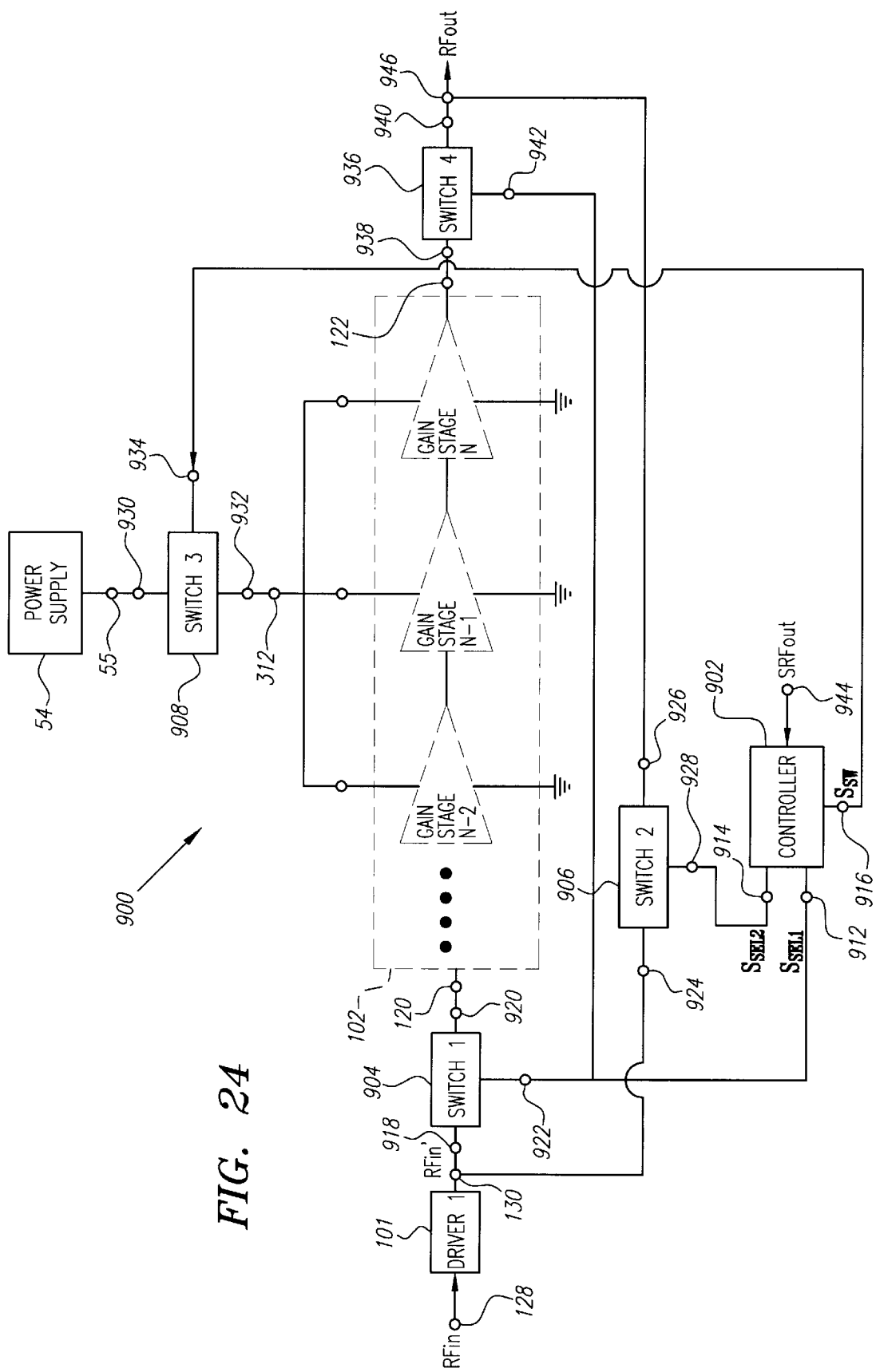
FIG. 24 is a block diagram of an alternative embodiment of a bypassable circuit.

As shown in FIG. 24, a bypassable circuit 900 is employed to operate an RF amplifier more efficiently and linearly by operating the RF amplifier only during a high RF output power condition, and bypassing the RF amplifier during a low RF output power condition. To the extent that the bypassable circuit 900 employs components that are similar to those of previous embodiments, the same reference numerals have been used.

The bypassable circuit 900 includes a first switch 904 having an input terminal 918 and an output terminal 920, and a second switch 906 having an input terminal 924 and an output terminal 926. The input terminal 918 and output terminal 920 of the first switch 904 are respectively connected to the RF output terminal 130 of the driver 101, which acts as a pre-amplification means, and the RF input terminal 120 of the RF amplifier 102. The input terminal 924 and output terminal 926 of the second switch 906 are respectively connected to the output terminal 130 of the driver 101 and an RF output terminal 946 of the amplifier circuit 900. The first switch 904 and the second switch 906 respectively include control terminals 922 and 928 to allow the first switch 906 and the second switch 908 to alternately open and close.

A third switch 908 is connected between the power supply 54 and the RF amplifier 102. The third switch 908 includes an input terminal 930 connected to the output terminal 55 of the power supply 54, and an output terminal 932 connected to the power terminal 312 of the RF amplifier 102. The third switch 936 includes a control terminal 942 that allows the third switch 936 to alternately open and close.

A fourth switch 936 is connected between the RF amplifier 102 and the external circuitry. The fourth switch 936 includes an input terminal 938 and an output terminal 940 that are respectively connected to the RF output terminal 122 of the RF amplifier 102 and the RF output terminal 946 of the amplifier circuit 900. The fourth switch 936 includes a control terminal 942 to allow the fourth switch 936 to alternately open and close.

The bypassable circuit 900 further includes a controller 902. The controller 902 includes an input terminal 924 into which a RF power designating signal, $S_{RFOUT}$, indicating the existence of a high RF output power condition or a low RF output power condition, is input. The controller 902 includes a first output terminal 912 and a second output terminal 914. The first output terminal 912 of the controller 902 is connected to the control terminal 922 of the first switch 904 and the control terminal 942 of the fourth switch 936, and the second output terminal 914 of the controller 902 is connected to the control terminal 928 of the second switch 906. The controller 902 further includes a third output terminal 916 connected to the control terminal 934 of the third switch 908.

The following is a description of the operation of the bypassable circuit 900. The handset or WLL terminal receives the RF power designating signal, $S_{RFOUT}$, through an input terminal 944 of the controller 902. During a high RF output power condition designated by the RF power designating signal, $S_{RFOUT}$, the controller 902 produces a high select signal, $S_{SEL1}$, on the first output terminal 912 of the controller 902, and a low select signal, $S_{SEL2}$, on the second output terminal 914 of the controller 502. The high select signal, $S_{SEL1}$, is applied to the control terminal 922 of the first switch 904 and the control terminal 942 of the fourth switch 936, thereby closing the first switch 904 and the fourth switch 936. The low select signal, $S_{SEL2}$, is applied to the control terminal 928 of the second switch 906, thereby opening the second switch 906. The controller 902 also produces a high switch signal, $S_{SW}$, on the third output terminal 916 of the controller 902. The high switch signal, $S_{SW}$, is applied to the control terminal 934 of the third switch 908, thereby closing the third switch 908 and providing the flow of power from the power supply 54 to the RF amplifier 102.

The driver 101 amplifies the RF input signal, $RF_{in}$, and produces an RF signal, $RF_{in}'$, on the RF output terminal 130 of the driver 101. The RF signal, $RF_{in}'$, passes through the closed first switch 904 and applied to the RF input terminal 120 of the RF amplifier 102. The RF signal, $RF_{in}'$, however, does not pass through the open second switch 906. The RF amplifier 102 amplifies the RF signal, $RF_{in}'$, and produces an RF output signal, $RF_{out}$, on the RF output terminal 122 of the RF amplifier 102 that has been effectively amplified by the driver 101 and the RF amplifier 102. The RF output signal, $RF_{out}$, passes through the closed fourth switch 936 to the RF output terminal 946 of the amplifier circuit 900.

During a low RF output power condition designated by the RF power designating signal, $S_{RFOUT}$, the controller 902 produces a high select signal, $S_{SEL2}$, on the second output terminal 914 of the controller 902, and a low select signal, $S_{SEL1}$, on the first output terminal 912 of the controller 902. The high select signal, $S_{SEL2}$, is applied to the control terminal 928 of the second switch 906, thereby closing the second switch 906. The low select signal, $S_{SEL1}$, is applied to the control terminal 922 of the first switch 904 and the control terminal 942 of the fourth switch 936, thereby opening the first switch 904 and the fourth switch 936. The controller 902 also produces a low switch signal, $S_{SW}$, on the third output terminal 916 of the controller 902. The low switch signal, $S_{SW}$, is applied to the control terminal 934 of the fourth switch 908, opening the fourth switch 908 and impeding the flow of power from the power supply 54 to the RF amplifier 102.

The driver 101 amplifies the RF input signal, $RF_{in}$, and produces an RF signal, $RF_{in}'$, on the RF output terminal 130 of the driver 101. The RF signal, $RF_{in}'$, does not pass through the open first switch 904 to the RF amplifier 102, but rather passes through closed second switch 906. The RF signal, $RF_{in}'$, is applied to the RF output terminal 946 of the amplifier circuit 900 as the RF output signal, $RF_{out}$, which has effectively been solely amplified by the driver 101. The open fourth switch 936 prevents the RF signal, $RF_{out}$, from entering the RF amplifier 102 through the RF output terminal 122 of the RF amplifier 102.

Alternatively, the controller 902 and the respective switches 904, 906, 908, and 936 can be configured so that the respective switches 904, 906, and 908 are closed by low select signals, $S_{SEL1}$ and $S_{SEL2}$, rather than high select signals, $S_{SEL1}$ and $S_{SEL2}$, and the switch 936 is closed by a low switch signal, $S_{SW}$, rather than a high switch signal, $S_{SW}$.

More alternatively, the controller 902 and the respective switches 904, 906, 908 are closed or opened by a single select signal, $S_{SEL}$, produced on a single control terminal of the controller 902. In this case, a component such as an inverter can be placed between the single control terminal of the controller 902 and the control terminals of the first switch 904 and second switch 906 or the control terminal of the third switch 908.

The RF amplifier 102 is only operated when a high power RF output signal, $RF_{out}$, is required, conserving energy expended by the bypassable circuit 900 when a low power RF output signal, $RF_{in}$, is required.

Like the bypassable circuits 500 and 550, the bypassable circuit 900 can be employed to make the amplifier circuits 100, 200, 300, or 400 respectively depicted in FIGS. 6, 11, 15, and 18 more power efficient.

Thus, an improved apparatus and method for improving the power efficiency and linearity of an RF amplifier is disclosed. The various components of the embodiments have been described as being connected to each other. Intermediate components, however, can be placed between those components described as being connected to each other to format the signal between the respective components without straying from the principles taught by this invention. While embodiments and applications of this invention have been shown and described, it would be apparent to those skilled in the art that many more modifications are possible without departing from the inventive concepts herein.

The invention, therefore is not to be restricted except in the spirit of the appended claims.

What is claimed:

1. A method of controlling an RF amplifier, comprising:
   providing power to said RF amplifier to produce a supply voltage across said RF amplifier;
   producing a control tracking signal indicating the desired level of said supply voltage;
   producing a supply voltage tracking signal indicating the present level of said supply voltage;
   determining the difference between at least said control tracking signal and at least said supply voltage tracking signal to obtain a biasing signal; and
   varying said supply voltage in proportion to said biasing signal.

2. The method of claim 1, further comprising scaling said difference between at least said control tracking signal and at least said supply voltage tracking signal to obtain said biasing signal.

3. A method of controlling an RF amplifier, comprising:
   providing power to said RF amplifier to produce a supply voltage across said RF amplifier;
   producing a signal;
   producing a supply voltage tracking signal indicating the present level of said supply voltage;
   integrating a difference between said at least said signal and said at least said supply voltage tracking signal to obtain a biasing signal, and
   varying said supply voltage in proportion to said biasing signal.

4. The method of claim 1, further comprising applying a modulated RF signal on an input terminal of said RF amplifier, said modulated RF signal having a modulated RF envelope; and
   wherein said control tracking signal is a control and envelope tracking signal that both indicates the desired level of said supply voltage and the present level of said modulated RF envelope, and said biasing signal is a dynamic biasing signal.

5. A method of controlling an RF amplifier, comprising:
   providing power to said RF amplifier to produce a supply voltage across said RF amplifier;
   applying a phase-modulated RF signal on an input terminal of said RF amplifier;
   predistorting the phase of said phase-modulated RF signal;
   producing a signal;
   producing a supply voltage tracking signal indicating the present level of said supply voltage;
   determining the difference between at least said signal and at least said supply voltage tracking signal to obtain a biasing signal; and
   varying said supply voltage in proportion to said biasing signal.

6. A method of controlling an RF amplifier, comprising:
   providing power to said RF amplifier to produce a supply voltage across said RF amplifier and a supply current in said RF amplifier;

producing a signal;

producing a supply voltage tracking signal indicating the present level of said supply voltage;

determining the difference between at least said signal and at least said supply voltage tracking signal to obtain a biasing signal;

varying said supply voltage in proportion to said biasing signal;

producing another signal;

producing a supply current tracking signal indicating the present level of said supply current;

determining the difference between at least said another signal and at least said supply current tracking signal to obtain agate biasing signal; and varying said supply current in proportion to said gate biasing signal.

7. The method of claim 6, wherein said signal is a control tracking signal indicating the desired level of said supply voltage, and wherein said another signal is a control tracking signal indicating the desired level of said supply current.

8. The method of claim 7, further comprising:

applying a modulated RF signal on an input terminal of said RF amplifier, said modulated RF signal having a modulated RF envelope;

wherein said signal is a control and envelope tracking signal that both indicates the desired level of said supply voltage and the present level of said modulated RF envelope, and said biasing signal is a dynamic biasing signal; and wherein said another signal is another control and envelope tracking signal that both indicates the desired level of said supply current and the present level of said modulated RF envelope, and said gate biasing signal is a dynamic gate biasing signal.

9. An adaptable DC power consumption amplifier circuit, comprising:

an RF amplifier;

means for producing a supply voltage across said RF amplifier, said supply voltage means having an internal source voltage;

means for producing a control tracking voltage indicating the desired level of said supply voltage;

means for producing a supply voltage tracking voltage;

means for determining the difference between said control tracking voltage and said supply voltage tracking voltage to obtain a biasing voltage; and means for varying said internal source voltage with said biasing voltage.

10. The adaptable DC power consumption amplifier circuit of claim 9, wherein said control tracking voltage is a control and envelope tracking voltage and said biasing voltage is a dynamic biasing voltage.

11. An adaptable DC power consumption amplifier circuit, comprising:

an RF amplifier;

means for producing a supply voltage across said RF amplifier, said supply voltage means having an internal source voltage;

means for producing a voltage;

means for producing a supply voltage tracking voltage;

means for determining the difference between said control tracking voltage and said supply voltage tracking voltage to obtain a biasing voltage; and means for varying said internal source voltage with said biasing voltage, means for producing a supply current in said RF amplifier;

means for producing another voltage;

means for producing a supply current tracking voltage;

means for determining the difference between said another voltage and said supply current tracking voltage to obtain a gate biasing voltage; and means for varying said supply current in proportion to said gate biasing voltage.

12. The adaptable DC power consumption amplifier circuit of claim 11, wherein said voltage is a control tracking voltage and said another voltage is another control tracking voltage.

13. The adaptable DC power consumption amplifier circuit of claim 11, wherein said voltage is a dynamic control tracking voltage, said another voltage is another dynamic control tracking voltage, said biasing voltage is a dynamic biasing voltage, and said gate biasing voltage is a dynamic gate biasing voltage.

14. An adaptable DC power consumption amplifier circuit, comprising:

an RF amplifier having an RF amplifier power terminal, an RF amplifier output terminal, and an RF amplifier control terminal;

a variable power supply having a variable power supply control terminal, a variable power supply output terminal, and an internal source voltage, said variable power supply output terminal electrically coupled to said RF amplifier power terminal;

a voltage detector having a voltage detector input terminal and a voltage detector output terminal, said voltage detector input terminal electrically coupled to said RF amplifier power terminal;

a controller having a controller output terminal; and a signal processor having a signal processor first input terminal, a signal processor second input terminal, and a signal processor output terminal, said controller output terminal electrically coupled to said signal processor first input terminal, said voltage detector output terminal electrically coupled to said signal processor second input terminal, and said signal processor output terminal electrically coupled to said variable power supply control terminal.

15. An adaptable DC power consumption amplifier circuit, comprising:

an RF amplifier having an RF amplifier power terminal, an RF amplifier output terminal, and an RF amplifier control terminal;

a variable power supply having a variable power supply control terminal, a variable power supply output terminal, and an internal source voltage, said variable power supply output terminal electrically coupled to said RF amplifier power terminal;

a voltage detector having a voltage detector input terminal, a voltage detector output terminal, and a voltage detector coupling terminal, said voltage detector input terminal electrically coupled to said variable power supply output terminal, said voltage detector output terminal electrically coupled to said RF amplifier power terminal;

a controller having a controller output terminal; and a signal processor having a signal processor first input terminal, a signal processor second input terminal, and a signal processor output terminal, said controller output terminal electrically coupled to said signal processor first input terminal, said voltage detector coupling terminal electrically coupled to said signal processor second input terminal, and said signal processor output terminal electrically coupled to said variable power supply control terminal.

16. An adaptable DC power consumption amplifier circuit, comprising:

an RF amplifier having an RF amplifier power terminal, an RF amplifier output terminal, and an RF amplifier control terminal;

a variable power supply having a variable power supply control terminal, a variable power supply output terminal, and an internal source voltage, said variable power supply output terminal electrically coupled to said RF amplifier power terminal;

a voltage detector having a voltage detector input terminal and a voltage detector output terminal, said voltage detector input terminal electrically coupled to said RF amplifier power terminal;

an envelope detector having an envelope detector input terminal, an envelope detector output terminal, and an envelope detector coupling terminal, said envelope detector input terminal electrically coupled to said RF amplifier output terminal; and a signal processor having a signal processor first input terminal, a signal processor second input terminal, and a signal processor output terminal, said envelope detector coupling terminal electrically coupled to said signal processor first input terminal, said voltage detector output terminal electrically coupled to said signal processor second input terminal, and said signal processor output terminal electrically coupled to said variable power supply control terminal.

17. The adaptable DC power consumption amplifier circuit of claim 14, further comprising an envelope detector having an envelope detector input terminal, an envelope detector output terminal, and an envelope detector coupling terminal, said envelope detector input terminal electrically coupled to said RF amplifier output terminal, said envelope detector coupling terminal electrically coupled to said signal processor first input terminal.

18. The adaptable DC power consumption amplifier circuit of claim 17, wherein said signal processor comprises a subtractor and an amplifier.

19. The adaptable DC power consumption amplifier circuit of claim 18, wherein said signal processor comprises an integrator.

20. The adaptable DC power consumption amplifier circuit of claim 18, wherein said voltage detector comprises a voltage divider, said envelope detector comprises a directional coupler, and said signal processor comprises a differential operational amplifier, said signal processor first input terminal electrically coupled to the noninverting input terminal of said differential operational amplifier, said signal processor second input terminal electrically coupled to the inverting input terminal of said differential operational amplifier, and said signal processor output terminal electrically coupled to the output terminal of said differential operational amplifier.

21. The adaptable DC power consumption amplifier circuit of claim 17, wherein said variable power supply comprises:

an N number of batteries that produce said internal source voltage; and an N number of transistors, said N number of batteries respectively electrically coupled to said N number of transistors; the bases of said N number of transistors electrically coupled to said variable power supply control terminal.

22. An adaptable DC power consumption amplifier circuit, comprising:

an RF amplifier having an RF amplifier power terminal, an RF amplifier output terminal, and an RF amplifier control terminal;

a variable power supply having a variable power supply control terminal, a variable power supply output terminal, and an internal source voltage, said variable power supply output terminal electrically coupled to said RF amplifier power terminal; and a first feedback control loop, said RF amplifier power terminal electrically coupled to said variable power supply control terminal through said first feedback control loop; and a second feedback control loop electrically coupling said RF amplifier power terminal to said RF amplifier control terminal.

23. The adaptable DC power consumption amplifier circuit of claim 22, wherein:

said first feedback control loop comprises:

a voltage detector having a voltage detector input terminal and a voltage detector output terminal, said voltage detector input terminal electrically coupled to said RF amplifier power terminal;

a controller having a controller output terminal; and a first signal processor having a first signal processor first input terminal, a first signal processor second input terminal, and a first signal processor output terminal, said controller output terminal electrically coupled to said first signal processor first input terminal, said voltage detector output terminal electrically coupled to said first signal processor second input terminal, said first signal processor output terminal electrically coupled to said variable power supply control terminal; and said second feedback control loop comprises:

a current detector having a current detector input terminal, a current detector output terminal, and a current detector coupling terminal, said variable power supply output terminal electrically coupled to said RF amplifier power terminal through said current detector, said current detector input terminal electrically coupled to said variable power supply output terminal, said current detector output terminal electrically coupled to said RF amplifier power terminal;

said controller; and a second signal processor having a second signal processor first input terminal, a second signal processor second input terminal, and a second signal processor output terminal, said current detector coupling terminal electrically coupled to said second signal processor first input terminal, said controller output terminal electrically coupled to said second signal processor second input terminal, said second signal processor output terminal electrically coupled to said RF amplifier control terminal.

24. The adaptable DC power consumption amplifier circuit of claim 23, wherein said first feedback control loop further comprises an envelope detector having an envelope detector input terminal, an envelope detector output terminal, and an envelope detector coupling terminal, said envelope detector input terminal electrically coupled to said RF amplifier output terminal, said envelope detector coupling terminal electrically coupled to said first signal processor first input terminal; and wherein said second feedback control loop further comprises said envelope detector, said envelope detector coupling terminal electrically coupled to said second signal processor second input terminal.

25. The adaptable DC power consumption amplifier circuit of claim 24, wherein said RF amplifier comprises:

a preceding gain stage having a preceding gain stage power terminal, said preceding gain stage power terminal electrically coupled to said current detector output terminal, said RF amplifier control terminal electrically coupled to the gate of said preceding gain stage; and a final gain stage having a final gain stage power terminal, said variable power supply output terminal electrically coupled to said final gain stage power terminal.

26. The adaptable DC power consumption circuit of claim 25 wherein, said first signal processor comprises a subtractor and an amplifier, said second signal processor comprises a subtractor, amplifier, and integrator, and said current detector comprises a current mirror.

27. The adaptable DC power consumption amplifier circuit of claim 26, wherein said first signal processor comprises a first differential operational amplifier, said first signal processor first input terminal electrically coupled to the non-inverting input terminal of said first differential operational amplifier, said first signal processor second input terminal electrically coupled to the inverting input terminal of said first differential operational amplifier, said first signal processor output terminal electrically coupled to the output terminal of said first differential operational amplifier; and wherein said second signal processor comprises a second differential operational amplifier, said second signal processor first input terminal electrically coupled to the inverting input terminal of said second differential operational amplifier, said second signal processor second input terminal electrically coupled to the noninverting input terminal of said first differential operational amplifier, said second signal processor output terminal electrically coupled to the output terminal of said second differential operational amplifier.

28. The adaptable DC power consumption amplifier circuit of claim 27, wherein said controller comprises:

a control processing unit; and a digital-to-analog converter, said control processing unit electrically coupled to said digital-to-analog converter through at least one digital control line.

29. The adaptable DC power consumption amplifier circuit of claim 22, wherein said first feedback control loop comprises:

a voltage detector;

a controller; and a first signal processor having a first signal processor first input terminal, a first signal processor second input terminal, and a first signal processor output terminal, said voltage detector electrically coupled between said first signal processor second input terminal and said RF amplifier power terminal, said controller electrically coupled to said first signal processor first input terminal, said first signal processor output terminal electrically coupled to said variable power supply control terminal; and wherein said second feedback control loop comprises:

a current detector;

said controller; and a second signal processor having a second signal processor first input terminal, a second signal processor second input terminal, and a second signal processor output terminal, said current detector coupled between said variable power supply output terminal and said second signal processor first input terminal, said controller electrically coupled to said second signal processor second input terminal, said second signal processor output terminal electrically coupled to said RF amplifier control terminal.

30. The adaptable DC power consumption amplifier circuit of claim 22, wherein said first feedback control loop comprises:

a voltage detector;

an envelope detector; and a first signal processor having a first signal processor first input terminal, a first signal processor second input terminal, and a first signal processor output terminal, said voltage detector coupled between said first signal processor second input terminal and said RF amplifier power terminal, said envelope detector electrically coupled between said RF amplifier output terminal and said first signal processor first input terminal, said first signal processor output terminal electrically coupled to said variable power supply control terminal; and wherein said second feedback control loop comprises:

a current detector;

said envelope detector; and a second signal processor having a second signal processor first input terminal, a second signal processor second input terminal, and a second signal processor output terminal, said current detector coupled between said variable power supply output terminal and said second signal processor first input terminal, said envelope detector electrically coupled between said RF amplifier output terminal and said second signal processor second input terminal, said second signal processor output terminal electrically coupled to said RF amplifier control terminal.

31. The adaptable DC power consumption amplifier circuit of claim 22, wherein said first feedback control loop comprises:

a voltage detector;

a controller;

an envelope detector; and a first signal processor having a first signal processor first input terminal, a first signal processor second input terminal, and a first signal processor output terminal, said voltage detector electrically coupled between said first signal processor second input terminal and said RF amplifier power terminal, said controller electrically coupled to said first signal processor first input terminal, said envelope detector electrically coupled between said RF amplifier output terminal and said first signal processor first input terminal, said first signal processor output terminal electrically coupled to said variable power supply control terminal; and wherein said second feedback control loop comprises:

a current detector;
said controller;
said envelope detector; and
a second signal processor having a second signal processor first input terminal, a second signal processor second input terminal, and a second signal processor output terminal, said current detector coupled between said variable power supply output terminal and said second signal processor first input terminal, said controller electrically coupled to said second signal processor second input terminal, said envelope detector electrically coupled between said RF amplifier output terminal and said second signal processor second input terminal, said second signal processor output terminal electrically coupled to said RF amplifier control terminal.

32. An adaptable DC power consumption amplifier circuit, comprising:

an RF amplifier having an RF amplifier power terminal, an RF amplifier output terminal, and an RF amplifier control terminal;

a variable power supply having a variable power supply control terminal, a variable power supply output terminal, and an internal source voltage, said variable power supply output terminal electrically coupled to said RF amplifier power terminal;

a voltage detector;

a controller;

an envelope detector; and a signal processor having a signal processor first input terminal, a signal processor second input terminal, and a signal processor output terminal, said voltage detector electrically coupled between said signal processor second input terminal and said RF amplifier power terminal, said controller electrically coupled to said signal processor first input terminal, said envelope detector electrically coupled between said RF amplifier output terminal and said signal processor first input terminal, said signal processor output terminal electrically coupled to said variable power supply control terminal.

* * * * *

UNITED STATES PATENT AND TRADEMARK OFFICE
CERTIFICATE OF CORRECTION

PATENT NO : 6,081,161
DATED : October 3, 2000
INVENTOR(S) : Farron L. Dacus and Russell A. Morris It is certified that error appears in the above-identified patent and that said Letters Patent are hereby corrected as shown below:

IN THE TITLE, Sheet 1, Please delete "DYNAMATICALLY" and insert --DYNAMICALLY--.

Signed and Sealed this

Seventeenth Day of April, 2001

Attest:

NICHOLAS P. GODICI

Attesting Officer        Acting Director of the United States Patent and Trademark Office